(12) United States Patent
Lahav et al.

(10) Patent No.: US 8,762,313 B2
(45) Date of Patent: Jun. 24, 2014

(54) METHOD AND SYSTEM FOR CREATING A PREDICTIVE MODEL FOR TARGETING WEB-PAGE TO A SURFER

(75) Inventors: Shlomo Lahav, Ramat-Gan (IL); Ofer Ron, Giv'atayim (IL)

(73) Assignee: LivePerson, Inc., New York, NY (US)

( * ) Notice: Subject to any disclaimer, the term of this patent is extended or adjusted under 35 U.S.C. 154(b) by 170 days.

(21) Appl. No.: 13/157,936

(22) Filed: Jun. 10, 2011

(65) Prior Publication Data

US 2011/0246406 A1 Oct. 6, 2011

Related U.S. Application Data

(63) Continuation-in-part of application No. 12/504,265, filed on Jul. 16, 2009.

(60) Provisional application No. 61/083,551, filed on Jul. 25, 2008, provisional application No. 61/083,558, filed on Jul. 25, 2008.

(51) Int. Cl.
*G06F 17/00* (2006.01)

(52) U.S. Cl.
USPC .............................. 706/46; 706/21; 707/767

(58) Field of Classification Search
None
See application file for complete search history.

(56) References Cited

U.S. PATENT DOCUMENTS

| | | | |
|---|---|---|---|
| 4,881,261 A | 11/1989 | Oliphant et al. | |
| 5,187,735 A | 2/1993 | Herrero Garcia et al. | |
| 5,206,903 A | 4/1993 | Kohler et al. | |
| 5,208,748 A | 5/1993 | Flores et al. | |
| 5,235,519 A | 8/1993 | Miura | |
| 5,239,462 A | 8/1993 | Jones et al. | |
| 5,262,941 A | 11/1993 | Saladin et al. | |

(Continued)

FOREIGN PATENT DOCUMENTS

| | | |
|---|---|---|
| EP | 840244 A1 | 5/1998 |
| EP | 1233361 A1 | 8/2002 |

(Continued)

OTHER PUBLICATIONS

Chartrand Sabra, "A new system seeks to ease the bottleneck in the customer-service information highway," The New York Times (Apr. 30, 2001), 2 pages.

(Continued)

*Primary Examiner* — Jeffrey A Gaffin
*Assistant Examiner* — David H Kim
(74) *Attorney, Agent, or Firm* — Kilpatrick Townsend and Stockton LLP

(57) ABSTRACT

A system and a method for creating a predictive model to select an object from a group of objects that can be associated with a requested web-page, wherein a configuration of the requested web-page defines a subgroup of one or more selected objects from the group of objects. Each web-page can include one or more links to be associated with content objects from the group. For each content object presented over a requested web-page, one or more predictive model with relevant predictive factors is processed such that the predicted objective, the probability of success for example, is calculated. A success is defined as a surfer responding to the presented content according to the preferences of the site owner. Each predicted model can be associated with a key-performance indicator (KPI). Further, a predictive model can reflect the number of times the surfer requested the web page during the surfer's visit.

30 Claims, 12 Drawing Sheets

(56) References Cited

U.S. PATENT DOCUMENTS

| | | | |
|---|---|---|---|
| 5,289,371 | A | 2/1994 | Abel et al. |
| 5,319,542 | A | 6/1994 | King et al. |
| 5,351,186 | A | 9/1994 | Bullock et al. |
| 5,372,507 | A | 12/1994 | Goleh |
| 5,375,055 | A | 12/1994 | Togher et al. |
| 5,387,783 | A | 2/1995 | Mihm et al. |
| 5,450,537 | A | 9/1995 | Hirai et al. |
| 5,517,405 | A | 5/1996 | McAndrew et al. |
| 5,563,805 | A | 10/1996 | Arbuckle et al. |
| 5,572,643 | A | 11/1996 | Judson |
| 5,581,702 | A | 12/1996 | McArdle et al. |
| 5,583,763 | A | 12/1996 | Atcheson et al. |
| 5,590,038 | A | 12/1996 | Pitroda |
| 5,592,378 | A | 1/1997 | Cameron et al. |
| 5,611,052 | A | 3/1997 | Dykstra et al. |
| 5,636,346 | A | 6/1997 | Saxe |
| 5,664,115 | A | 9/1997 | Fraser |
| 5,668,953 | A | 9/1997 | Sloo |
| 5,678,002 | A | 10/1997 | Fawcett et al. |
| 5,694,163 | A | 12/1997 | Harrison |
| 5,696,907 | A | 12/1997 | Tom |
| 5,699,526 | A | 12/1997 | Siefert |
| 5,704,029 | A | 12/1997 | Wright |
| 5,710,887 | A | 1/1998 | Chelliah et al. |
| 5,715,402 | A | 2/1998 | Popolo |
| 5,724,155 | A | 3/1998 | Saito |
| 5,724,522 | A | 3/1998 | Kagami et al. |
| 5,727,048 | A | 3/1998 | Hiroshima et al. |
| 5,727,163 | A | 3/1998 | Bezos |
| 5,732,400 | A | 3/1998 | Mandler et al. |
| 5,745,654 | A | 4/1998 | Titan |
| 5,748,755 | A | 5/1998 | Johnson et al. |
| 5,758,328 | A | 5/1998 | Giovannoli |
| 5,760,771 | A | 6/1998 | Blonder et al. |
| 5,761,640 | A | 6/1998 | Kalyanswamy et al. |
| 5,761,649 | A | 6/1998 | Hill |
| 5,764,916 | A | 6/1998 | Busey et al. |
| 5,765,142 | A | 6/1998 | Allred et al. |
| 5,774,869 | A | 6/1998 | Toader |
| 5,774,870 | A | 6/1998 | Storey |
| 5,774,882 | A | 6/1998 | Keen et al. |
| 5,774,883 | A | 6/1998 | Andersen et al. |
| 5,778,164 | A | 7/1998 | Watkins et al. |
| 5,784,568 | A | 7/1998 | Needham |
| 5,793,365 | A | 8/1998 | Tang et al. |
| 5,794,207 | A | 8/1998 | Walker et al. |
| 5,796,393 | A | 8/1998 | MacNaughton et al. |
| 5,797,133 | A | 8/1998 | Jones et al. |
| 5,799,151 | A | 8/1998 | Hoffer |
| 5,805,159 | A | 9/1998 | Bertram et al. |
| 5,806,043 | A | 9/1998 | Toader |
| 5,812,769 | A | 9/1998 | Graber et al. |
| 5,815,663 | A | 9/1998 | Uomini |
| 5,818,907 | A | 10/1998 | Mahoney et al. |
| 5,819,029 | A | 10/1998 | Edwards et al. |
| 5,819,235 | A | 10/1998 | Tamai et al. |
| 5,819,236 | A | 10/1998 | Josephson |
| 5,819,291 | A | 10/1998 | Haimowitz et al. |
| 5,825,869 | A | 10/1998 | Brooks et al. |
| 5,826,241 | A | 10/1998 | Stein et al. |
| 5,826,244 | A | 10/1998 | Huberman |
| 5,828,839 | A | 10/1998 | Moncreiff |
| 5,832,465 | A | 11/1998 | Tom |
| 5,835,087 | A | 11/1998 | Herz et al. |
| 5,838,682 | A | 11/1998 | Dekelbaum et al. |
| 5,838,910 | A | 11/1998 | Domenikos et al. |
| 5,839,117 | A | 11/1998 | Cameron et al. |
| 5,850,517 | A | 12/1998 | Verkler et al. |
| 5,852,809 | A | 12/1998 | Abel et al. |
| 5,857,079 | A | 1/1999 | Claus et al. |
| 5,859,974 | A | 1/1999 | McArdle et al. |
| 5,862,330 | A | 1/1999 | Anupam et al. |
| 5,866,889 | A | 2/1999 | Weiss et al. |
| 5,870,721 | A | 2/1999 | Norris |
| 5,878,403 | A | 3/1999 | DeFrancesco et al. |
| 5,895,454 | A | 4/1999 | Harrington |
| 5,903,641 | A | 5/1999 | Tonisson |
| 5,907,677 | A | 5/1999 | Glenn et al. |
| 5,911,135 | A | 6/1999 | Atkins |
| 5,916,302 | A | 6/1999 | Dunn et al. |
| 5,918,014 | A | 6/1999 | Robinson |
| 5,924,082 | A | 7/1999 | Silverman et al. |
| 5,930,776 | A | 7/1999 | Dykstra et al. |
| 5,940,811 | A | 8/1999 | Norris |
| 5,940,812 | A | 8/1999 | Tengel et al. |
| 5,943,416 | A | 8/1999 | Gisby et al. |
| 5,943,478 | A | 8/1999 | Aggarwal et al. |
| 5,945,989 | A | 8/1999 | Freishtat et al. |
| 5,948,061 | A | 9/1999 | Merriman et al. |
| 5,950,179 | A | 9/1999 | Buchanan et al. |
| 5,956,693 | A | 9/1999 | Geerlings |
| 5,958,014 | A | 9/1999 | Cave |
| 5,960,411 | A | 9/1999 | Hartman et al. |
| 5,963,625 | A | 10/1999 | Kawecki et al. |
| 5,963,635 | A | 10/1999 | Szlam |
| 5,966,699 | A | 10/1999 | Zandi |
| 5,970,475 | A | 10/1999 | Barnes et al. |
| 5,970,478 | A | 10/1999 | Walker et al. |
| 5,974,396 | A | 10/1999 | Anderson |
| 5,974,446 | A | 10/1999 | Sonnenrich et al. |
| 5,987,434 | A | 11/1999 | Libman |
| 5,991,740 | A | 11/1999 | Messer |
| 5,995,947 | A | 11/1999 | Fraser et al. |
| 6,000,832 | A | 12/1999 | Franklin et al. |
| 6,003,013 | A | 12/1999 | Boushy |
| 6,009,410 | A | 12/1999 | LeMole et al. |
| 6,014,644 | A | 1/2000 | Erickson |
| 6,014,645 | A | 1/2000 | Cunningham |
| 6,014,647 | A | 1/2000 | Nizzari |
| 6,016,504 | A | 1/2000 | Arnold et al. |
| 6,026,370 | A | 2/2000 | Jermyn |
| 6,028,601 | A | 2/2000 | Machiraju et al. |
| 6,029,141 | A | 2/2000 | Bezos et al. |
| 6,029,149 | A | 2/2000 | Dykstra et al. |
| 6,029,890 | A | 2/2000 | Austin et al. |
| 6,044,146 | A | 3/2000 | Gisby et al. |
| 6,044,360 | A | 3/2000 | Picciallo |
| 6,049,784 | A | 4/2000 | Weatherly et al. |
| 6,052,447 | A | 4/2000 | Golden |
| 6,052,730 | A | 4/2000 | Felciano |
| 6,055,573 | A | 4/2000 | Gardenswartz et al. |
| 6,058,428 | A | 5/2000 | Wang et al. |
| 6,061,658 | A | 5/2000 | Chou et al. |
| 6,064,987 | A | 5/2000 | Walker et al. |
| 6,070,149 | A | 5/2000 | Tavor et al. |
| 6,073,112 | A | 6/2000 | Geerlings |
| 6,076,100 | A | 6/2000 | Cottrille et al. |
| 6,078,892 | A | 6/2000 | Anderson et al. |
| 6,084,585 | A | 7/2000 | Kraft et al. |
| 6,085,126 | A | 7/2000 | Mellgren, III et al. |
| 6,085,195 | A | 7/2000 | Hoyt et al. |
| 6,088,686 | A | 7/2000 | Walker et al. |
| 6,105,007 | A | 8/2000 | Norris |
| 6,112,190 | A | 8/2000 | Fletcher et al. |
| 6,119,101 | A | 9/2000 | Peckover |
| 6,119,103 | A | 9/2000 | Basch et al. |
| 6,131,087 | A | 10/2000 | Luke et al. |
| 6,131,095 | A | 10/2000 | Low et al. |
| 6,134,318 | A | 10/2000 | O'Neil |
| 6,134,530 | A | 10/2000 | Bunting et al. |
| 6,134,532 | A | 10/2000 | Lazarus et al. |
| 6,134,533 | A | 10/2000 | Shell |
| 6,138,139 | A | 10/2000 | Beck et al. |
| 6,141,653 | A | 10/2000 | Conklin et al. |
| 6,144,991 | A | 11/2000 | England |
| 6,163,607 | A | 12/2000 | Bogart et al. |
| 6,167,395 | A | 12/2000 | Beck et al. |
| 6,170,011 | B1 | 1/2001 | Macleod Beck et al. |
| 6,173,053 | B1 | 1/2001 | Bogart et al. |
| 6,182,050 | B1 | 1/2001 | Ballard |
| 6,182,124 | B1 | 1/2001 | Lau et al. |
| 6,185,543 | B1 | 2/2001 | Galperin et al. |
| 6,189,003 | B1 | 2/2001 | Leal |
| 6,192,319 | B1 | 2/2001 | Simonson |

(56) References Cited

U.S. PATENT DOCUMENTS

| | | |
|---|---|---|
| 6,192,380 B1 | 2/2001 | Light et al. |
| 6,199,079 B1 | 3/2001 | Gupta et al. |
| 6,202,053 B1 | 3/2001 | Christiansen et al. |
| 6,202,155 B1 | 3/2001 | Tushie et al. |
| 6,208,979 B1 | 3/2001 | Sinclair |
| 6,222,919 B1 | 4/2001 | Hollatz et al. |
| 6,236,975 B1 | 5/2001 | Boe et al. |
| 6,240,396 B1 | 5/2001 | Walker et al. |
| 6,249,795 B1 | 6/2001 | Douglis |
| 6,262,730 B1 | 7/2001 | Horvitz |
| 6,267,292 B1 | 7/2001 | Walker et al. |
| 6,272,506 B1 | 8/2001 | Bell |
| 6,282,284 B1 | 8/2001 | Dezonno et al. |
| 6,285,983 B1 | 9/2001 | Jenkins |
| 6,289,319 B1 | 9/2001 | Lockwood |
| 6,292,786 B1 | 9/2001 | Deaton |
| 6,295,061 B1 | 9/2001 | Park et al. |
| 6,311,169 B2 | 10/2001 | Duhon |
| 6,311,178 B1 | 10/2001 | Bi et al. |
| 6,324,524 B1 | 11/2001 | Lent et al. |
| 6,327,574 B1 | 12/2001 | Kramer et al. |
| 6,330,546 B1 | 12/2001 | Gopinathan et al. |
| 6,334,110 B1 | 12/2001 | Walter |
| 6,338,066 B1 | 1/2002 | Martin |
| 6,349,290 B1 | 2/2002 | Horowitz et al. |
| 6,356,909 B1 | 3/2002 | Spencer |
| 6,374,230 B1 | 4/2002 | Walker et al. |
| 6,377,936 B1 | 4/2002 | Henrick et al. |
| 6,381,640 B1 | 4/2002 | Beck |
| 6,385,594 B1 | 5/2002 | Lebda et al. |
| 6,393,479 B1 | 5/2002 | Glommen et al. |
| 6,405,181 B2 | 6/2002 | Lent et al. |
| 6,438,526 B1 | 8/2002 | Dykes et al. |
| 6,449,358 B1 | 9/2002 | Anisimov |
| 6,449,646 B1 | 9/2002 | Sikora et al. |
| 6,463,149 B1 | 10/2002 | Jolissaint et al. |
| 6,477,533 B2 | 11/2002 | Schiff et al. |
| 6,507,851 B1 | 1/2003 | Fujiwara et al. |
| 6,510,418 B1 | 1/2003 | Case et al. |
| 6,510,427 B1 | 1/2003 | Bossemeyer, Jr. et al. |
| 6,516,421 B1 | 2/2003 | Peters |
| 6,519,628 B1 | 2/2003 | Locascio |
| 6,535,492 B2 | 3/2003 | Shtivelman |
| 6,542,936 B1 | 4/2003 | Mayle et al. |
| 6,546,372 B2 | 4/2003 | Lauffer |
| 6,549,919 B2 | 4/2003 | Lambert et al. |
| 6,567,791 B2 | 5/2003 | Lent et al. |
| 6,571,236 B1 | 5/2003 | Ruppelt |
| 6,597,377 B1 | 7/2003 | MacPhai |
| 6,606,744 B1 | 8/2003 | Mikurak |
| 6,618,746 B2 | 9/2003 | Desai et al. |
| 6,622,131 B1 | 9/2003 | Brown et al. |
| 6,622,138 B1 | 9/2003 | Bellamkonda |
| 6,662,215 B1 | 12/2003 | Moskowitz et al. |
| 6,665,395 B1 | 12/2003 | Busey et al. |
| 6,671,818 B1 | 12/2003 | Mikurak |
| 6,691,159 B1 | 2/2004 | Grewal et al. |
| 6,701,441 B1 | 3/2004 | Balasubramaniam et al. |
| 6,718,313 B1 | 4/2004 | Lent et al. |
| 6,725,210 B1 | 4/2004 | Key |
| 6,741,995 B1 | 5/2004 | Chen |
| 6,760,429 B1 | 7/2004 | Hung et al. |
| 6,766,302 B2 | 7/2004 | Bach |
| 6,795,812 B1 | 9/2004 | Lent et al. |
| 6,804,659 B1 | 10/2004 | Graham et al. |
| 6,826,594 B1 | 11/2004 | Pettersen |
| 6,829,585 B1 | 12/2004 | Grewal et al. |
| 6,836,768 B1 | 12/2004 | Hirsch |
| 6,839,680 B1 | 1/2005 | Liu |
| 6,850,896 B1 | 2/2005 | Kelman et al. |
| 6,865,267 B2 | 3/2005 | Dezonno |
| 6,892,347 B1 | 5/2005 | Williams |
| 6,904,408 B1 | 6/2005 | McCarthy et al. |
| 6,920,434 B1 | 7/2005 | Cossette |
| 6,922,705 B1 | 7/2005 | Northrup |
| 6,925,441 B1 | 8/2005 | Jones |
| 6,925,442 B1 | 8/2005 | Shapira et al. |
| 6,950,983 B1 | 9/2005 | Snavely |
| 6,965,868 B1 | 11/2005 | Bednarek |
| 6,981,028 B1 | 12/2005 | Rawat et al. |
| 6,993,557 B1 | 1/2006 | Yen |
| 7,003,476 B1 | 2/2006 | Samra et al. |
| 7,039,599 B2 | 5/2006 | Merriman et al. |
| 7,051,273 B1 | 5/2006 | Holt et al. |
| 7,076,443 B1 | 7/2006 | Emens et al. |
| 7,085,682 B1 | 8/2006 | Heller et al. |
| 7,092,959 B2 | 8/2006 | Chen |
| 7,106,850 B2 | 9/2006 | Campbell et al. |
| 7,143,063 B2 | 11/2006 | Lent et al. |
| 7,181,492 B2 | 2/2007 | Wen et al. |
| 7,200,614 B2 | 4/2007 | Reid et al. |
| 7,242,760 B2 | 7/2007 | Shires |
| 7,243,109 B2 | 7/2007 | Omega et al. |
| 7,251,648 B2 | 7/2007 | Chaudhuri et al. |
| 7,287,000 B2 | 10/2007 | Boyd et al. |
| 7,313,575 B2 | 12/2007 | Carr et al. |
| 7,337,127 B1 | 2/2008 | Smith et al. |
| 7,346,576 B2 | 3/2008 | Lent et al. |
| 7,346,604 B1 | 3/2008 | Bharat et al. |
| 7,346,606 B2 | 3/2008 | Bharat |
| 7,370,002 B2 | 5/2008 | Heckerman et al. |
| 7,376,603 B1 | 5/2008 | Mayr et al. |
| 7,403,973 B2 | 7/2008 | Wilsher et al. |
| 7,424,363 B2 | 9/2008 | Cheng |
| 7,523,191 B1 | 4/2009 | Thomas et al. |
| 7,526,439 B2 | 4/2009 | Freishtat et al. |
| 7,536,320 B2 | 5/2009 | McQueen et al. |
| 7,552,080 B1 | 6/2009 | Willard et al. |
| 7,590,550 B2 | 9/2009 | Schoenberg |
| 7,630,986 B1 | 12/2009 | Herz et al. |
| 7,657,465 B2 | 2/2010 | Freishtat et al. |
| 7,689,924 B1 | 3/2010 | Schneider et al. |
| 7,702,635 B2 | 4/2010 | Horvitz et al. |
| 7,716,322 B2 | 5/2010 | Benedikt et al. |
| 7,734,503 B2 | 6/2010 | Agarwal et al. |
| 7,734,632 B2 | 6/2010 | Wang |
| 7,739,149 B2 | 6/2010 | Freishtat et al. |
| 7,818,340 B1 | 10/2010 | Warren |
| 7,827,128 B1 | 11/2010 | Karlsson et al. |
| 7,865,457 B2 | 1/2011 | Ravin et al. |
| 7,877,679 B2 | 1/2011 | Ozana |
| 7,958,066 B2 | 6/2011 | Pinckney et al. |
| 7,966,564 B2 | 6/2011 | Catlin et al. |
| 7,975,020 B1 | 7/2011 | Green et al. |
| 8,010,422 B1 | 8/2011 | Lascelles et al. |
| 8,185,544 B2 | 5/2012 | Oztekin et al. |
| 8,260,846 B2 | 9/2012 | Lahav |
| 8,266,127 B2 | 9/2012 | Mattox et al. |
| 8,392,580 B2 | 3/2013 | Allen et al. |
| 2001/0011245 A1 | 8/2001 | Duhon |
| 2001/0011246 A1 | 8/2001 | Tammaro |
| 2001/0011262 A1 | 8/2001 | Hoyt et al. |
| 2001/0011282 A1 | 8/2001 | Katsumata et al. |
| 2001/0013009 A1 | 8/2001 | Greening |
| 2001/0014877 A1 | 8/2001 | Defrancesco et al. |
| 2001/0025249 A1 | 9/2001 | Tokunaga |
| 2001/0027436 A1 | 10/2001 | Tenembaum |
| 2001/0032140 A1 | 10/2001 | Hoffman |
| 2001/0032244 A1 | 10/2001 | Neustel |
| 2001/0034689 A1 | 10/2001 | Heilman |
| 2001/0054041 A1 | 12/2001 | Chang |
| 2001/0054064 A1 | 12/2001 | Kannan |
| 2001/0056405 A1 | 12/2001 | Muyres |
| 2002/0002491 A1 | 1/2002 | Whitfield |
| 2002/0004735 A1 | 1/2002 | Gross |
| 2002/0010625 A1 | 1/2002 | Smith et al. |
| 2002/0016731 A1 | 2/2002 | Kupersmit |
| 2002/0023051 A1 | 2/2002 | Kunzle et al. |
| 2002/0026351 A1 | 2/2002 | Coleman |
| 2002/0029188 A1 | 3/2002 | Schmid |
| 2002/0029267 A1 | 3/2002 | Sankuratripati et al. |
| 2002/0035486 A1 | 3/2002 | Huyn et al. |
| 2002/0038230 A1 | 3/2002 | Chen |
| 2002/0045154 A1 | 4/2002 | Wood |

(56) References Cited

U.S. PATENT DOCUMENTS

| | | |
|---|---|---|
| 2002/0046086 A1 | 4/2002 | Pletz |
| 2002/0046096 A1 | 4/2002 | Srinivasan |
| 2002/0047859 A1 | 4/2002 | Szlam et al. |
| 2002/0055878 A1 | 5/2002 | Burton et al. |
| 2002/0059095 A1 | 5/2002 | Cook |
| 2002/0067500 A1 | 6/2002 | Yokomizo et al. |
| 2002/0073162 A1 | 6/2002 | McErlean |
| 2002/0082923 A1 | 6/2002 | Merriman et al. |
| 2002/0083095 A1 | 6/2002 | Wu et al. |
| 2002/0083167 A1 | 6/2002 | Costigan et al. |
| 2002/0091832 A1 | 7/2002 | Low et al. |
| 2002/0107728 A1 | 8/2002 | Bailey et al. |
| 2002/0111850 A1 | 8/2002 | Smrcka et al. |
| 2002/0123926 A1 | 9/2002 | Bushold |
| 2002/0161620 A1 | 10/2002 | Hatanaka |
| 2002/0161664 A1 | 10/2002 | Shaya et al. |
| 2002/0167539 A1 | 11/2002 | Brown et al. |
| 2003/0014304 A1 | 1/2003 | Calvert et al. |
| 2003/0023754 A1 | 1/2003 | Eichstadt et al. |
| 2003/0028415 A1 | 2/2003 | Herschap et al. |
| 2003/0036949 A1 | 2/2003 | Kaddeche et al. |
| 2003/0041056 A1 | 2/2003 | Bossemeyer et al. |
| 2003/0055778 A1 | 3/2003 | Erlanger |
| 2003/0110130 A1 | 6/2003 | Pelletier |
| 2003/0140037 A1 | 7/2003 | Deh-Lee |
| 2003/0149937 A1* | 8/2003 | McElfresh et al. ........... 715/517 |
| 2003/0154196 A1 | 8/2003 | Goodwin et al. |
| 2003/0167195 A1 | 9/2003 | Fernandes et al. |
| 2003/0195848 A1 | 10/2003 | Felger |
| 2003/0217332 A1 | 11/2003 | Smith et al. |
| 2003/0221163 A1* | 11/2003 | Glover et al. ............. 715/501.1 |
| 2004/0034567 A1 | 2/2004 | Gravett |
| 2004/0064412 A1 | 4/2004 | Phillips et al. |
| 2004/0088323 A1 | 5/2004 | Elder et al. |
| 2004/0128390 A1 | 7/2004 | Blakley et al. |
| 2004/0153368 A1 | 8/2004 | Freishtat et al. |
| 2004/0163101 A1 | 8/2004 | Swix et al. |
| 2004/0167928 A1 | 8/2004 | Anderson et al. |
| 2004/0193377 A1 | 9/2004 | Brown |
| 2004/0210820 A1 | 10/2004 | Tarr et al. |
| 2004/0243539 A1 | 12/2004 | Skurtovich et al. |
| 2004/0260574 A1 | 12/2004 | Gross |
| 2005/0004864 A1 | 1/2005 | Lent et al. |
| 2005/0014117 A1 | 1/2005 | Stillman |
| 2005/0033728 A1 | 2/2005 | James |
| 2005/0114195 A1 | 5/2005 | Bernasconi |
| 2005/0132205 A1 | 6/2005 | Palliyil et al. |
| 2005/0138115 A1 | 6/2005 | Llamas et al. |
| 2005/0171861 A1 | 8/2005 | Bezos et al. |
| 2005/0183003 A1 | 8/2005 | Peri |
| 2005/0198120 A1 | 9/2005 | Reshef et al. |
| 2005/0198212 A1 | 9/2005 | Zilberfayn et al. |
| 2005/0216342 A1 | 9/2005 | Ashbaugh |
| 2005/0256955 A1 | 11/2005 | Bodwell et al. |
| 2005/0262065 A1 | 11/2005 | Barth et al. |
| 2005/0288943 A1 | 12/2005 | Wei et al. |
| 2006/0015390 A1 | 1/2006 | Rijisinghani et al. |
| 2006/0021009 A1 | 1/2006 | Lunt |
| 2006/0026237 A1 | 2/2006 | Wang et al. |
| 2006/0041476 A1 | 2/2006 | Zheng |
| 2006/0047615 A1 | 3/2006 | Ravin et al. |
| 2006/0059124 A1 | 3/2006 | Krishna |
| 2006/0106788 A1 | 5/2006 | Forrest |
| 2006/0122850 A1 | 6/2006 | Ward et al. |
| 2006/0168509 A1 | 7/2006 | Boss et al. |
| 2006/0253319 A1 | 11/2006 | Chayes et al. |
| 2006/0271545 A1 | 11/2006 | Youn et al. |
| 2006/0282327 A1 | 12/2006 | Neal et al. |
| 2006/0282328 A1 | 12/2006 | Gerace et al. |
| 2006/0284378 A1 | 12/2006 | Snow et al. |
| 2006/0288087 A1 | 12/2006 | Sun |
| 2006/0293950 A1* | 12/2006 | Meek et al. ............. 705/14 |
| 2007/0027771 A1 | 2/2007 | Collins et al. |
| 2007/0027785 A1 | 2/2007 | Lent et al. |
| 2007/0053513 A1 | 3/2007 | Hoffberg |
| 2007/0061412 A1 | 3/2007 | Karidi et al. |
| 2007/0061421 A1 | 3/2007 | Karidi |
| 2007/0073585 A1 | 3/2007 | Apple et al. |
| 2007/0094228 A1 | 4/2007 | Nevin et al. |
| 2007/0100653 A1 | 5/2007 | Ramer et al. |
| 2007/0100688 A1 | 5/2007 | Book |
| 2007/0116238 A1 | 5/2007 | Jacobi |
| 2007/0116239 A1 | 5/2007 | Jacobi |
| 2007/0162501 A1 | 7/2007 | Agassi et al. |
| 2007/0239527 A1 | 10/2007 | Nazer et al. |
| 2007/0250585 A1 | 10/2007 | Ly et al. |
| 2007/0260596 A1 | 11/2007 | Koran et al. |
| 2007/0265873 A1 | 11/2007 | Sheth et al. |
| 2008/0021816 A1 | 1/2008 | Lent et al. |
| 2008/0033941 A1 | 2/2008 | Parrish |
| 2008/0040225 A1 | 2/2008 | Roker |
| 2008/0072170 A1 | 3/2008 | Simons |
| 2008/0147480 A1 | 6/2008 | Sarma et al. |
| 2008/0147741 A1 | 6/2008 | Gonen et al. |
| 2008/0201436 A1 | 8/2008 | Gartner |
| 2008/0215541 A1 | 9/2008 | Li et al. |
| 2008/0222656 A1 | 9/2008 | Lyman |
| 2008/0244024 A1 | 10/2008 | Aaltonen et al. |
| 2008/0262897 A1 | 10/2008 | Howarter et al. |
| 2008/0270294 A1 | 10/2008 | Lent et al. |
| 2008/0270295 A1 | 10/2008 | Lent et al. |
| 2008/0319778 A1 | 12/2008 | Abhyanker |
| 2009/0006174 A1 | 1/2009 | Lauffer |
| 2009/0006179 A1* | 1/2009 | Billingsley et al. ............. 705/10 |
| 2009/0006622 A1 | 1/2009 | Doerr |
| 2009/0030859 A1 | 1/2009 | Buchs et al. |
| 2009/0055267 A1 | 2/2009 | Roker |
| 2009/0076887 A1 | 3/2009 | Spivack et al. |
| 2009/0099904 A1* | 4/2009 | Affeld et al. ................... 705/10 |
| 2009/0119173 A1* | 5/2009 | Parsons et al. ................... 705/14 |
| 2009/0138606 A1 | 5/2009 | Moran et al. |
| 2009/0164171 A1 | 6/2009 | Wold et al. |
| 2009/0177771 A1 | 7/2009 | Britton et al. |
| 2009/0210405 A1 | 8/2009 | Ortega et al. |
| 2009/0222572 A1 | 9/2009 | Fujihara |
| 2009/0287534 A1 | 11/2009 | Guo et al. |
| 2009/0287633 A1 | 11/2009 | Nevin et al. |
| 2009/0307003 A1 | 12/2009 | Benyamin et al. |
| 2009/0319296 A1 | 12/2009 | Schoenberg |
| 2010/0023475 A1 | 1/2010 | Lahav |
| 2010/0023581 A1 | 1/2010 | Lahav |
| 2010/0049602 A1 | 2/2010 | Softky |
| 2010/0106552 A1 | 4/2010 | Barillaud |
| 2010/0205024 A1 | 8/2010 | Shachar et al. |
| 2010/0119379 A1 | 10/2010 | Willcock |
| 2010/0281008 A1 | 11/2010 | Braunwarth |
| 2011/0041168 A1 | 2/2011 | Murray et al. |
| 2011/0055207 A1 | 3/2011 | Schorzman et al. |
| 2011/0055331 A1 | 3/2011 | Adelman et al. |
| 2011/0055338 A1 | 3/2011 | Loeb et al. |
| 2011/0112893 A1 | 5/2011 | Karlsson et al. |
| 2011/0113101 A1 | 5/2011 | Ye et al. |
| 2011/0119264 A1 | 5/2011 | Hu et al. |
| 2011/0138298 A1 | 6/2011 | Alfred et al. |
| 2011/0161792 A1 | 6/2011 | Florence et al. |
| 2011/0270926 A1 | 11/2011 | Boyd |
| 2011/0271175 A1 | 11/2011 | Lavi et al. |
| 2011/0307331 A1 | 12/2011 | Richard et al. |
| 2011/0320715 A1* | 12/2011 | Ickman et al. ................. 711/118 |
| 2012/0042389 A1 | 2/2012 | Bradley et al. |
| 2012/0059722 A1 | 3/2012 | Rao |
| 2012/0136939 A1 | 5/2012 | Stern et al. |
| 2012/0150973 A1 | 6/2012 | Barak |
| 2012/0323346 A1 | 12/2012 | Ashby et al. |
| 2013/0013362 A1 | 1/2013 | Walker et al. |
| 2013/0036202 A1 | 2/2013 | Lahav |
| 2013/0132194 A1 | 5/2013 | Rajaram |
| 2013/0182834 A1 | 7/2013 | Lauffer |
| 2013/0268468 A1 | 10/2013 | Vijayaraghavan et al. |
| 2013/0275862 A1 | 10/2013 | Adra |
| 2013/0336471 A1 | 12/2013 | Agarwal et al. |

(56) References Cited

U.S. PATENT DOCUMENTS

FOREIGN PATENT DOCUMENTS

| | | |
|---|---|---|
| EP | 1276 064 A2 | 1/2003 |
| EP | 1549025 A1 | 6/2005 |
| EP | 1 840 803 A1 | 10/2007 |
| EP | 1845436 A2 | 10/2007 |
| EP | 1850284 A1 | 10/2007 |
| FR | 2 950 214 A1 | 3/2011 |
| JP | 9288453 A2 | 11/1997 |
| JP | 2004-054533 | 2/2004 |
| KR | 20040110399 A | 12/2004 |
| KR | 20050010487 A | 1/2005 |
| KR | 20080046310 A | 5/2008 |
| KR | 20080097751 A | 11/2008 |
| WO | 9722073 A1 | 6/1997 |
| WO | 9845797 A2 | 10/1998 |
| WO | 9909470 A1 | 2/1999 |
| WO | 9922328 A1 | 5/1999 |
| WO | 9944152 A1 | 9/1999 |
| WO | 00/57294 A1 | 9/2000 |
| WO | 0127825 A1 | 4/2001 |
| WO | 01/35272 A2 | 5/2001 |
| WO | 02/065367 A2 | 8/2002 |
| WO | 03/032146 A1 | 4/2003 |
| WO | 2004/057473 A1 | 7/2004 |
| WO | 2005/059777 A1 | 6/2005 |
| WO | 2007/044757 A1 | 4/2007 |
| WO | 2007/129625 A1 | 11/2007 |
| WO | 2008/057181 A2 | 5/2008 |
| WO | 2008/143382 A1 | 11/2008 |
| WO | 2009/029940 A1 | 3/2009 |
| WO | 2010/099632 A1 | 9/2010 |
| WO | 2010/119379 A1 | 10/2010 |
| WO | 2010/144207 A2 | 12/2010 |
| WO | 2011/127049 A1 | 10/2011 |

OTHER PUBLICATIONS

Just Answer (2004 Faq) Archive.org cache of www.justanswer.com circa (Dec. 2004), 8 pages.
Pack Thomas, "Human Search Engines the next Killer app," (Dec. 1, 2000) Econtent DBS vol. 23; Issue 6, 7 pages.
match.com "Match.com Launches Match.com Advisors," PR Newswire (Oct. 14, 2003), 2 pages.
SITEL, "SITEL to Provide Live Agent Support Online for Expertcity. com," PR Newswire (Feb. 28, 2000), 2 pages.
Webmaster World, "Link to my website is in a frame with banner ad at the top," www.webmasterworld.com (Nov. 11, 2003), 2 pages.
Bry et al., "Realilzing Business Processes with ECA Rules: Benefits, Challenges, Limits," Principles and Practice of Sematic Web Reasoning Lecture Notes in Computer Science, pp. 48-62, LNCS, Springer, Berlin, DE (Jan. 2006).
Fairisaac, "How SmartForms for Blaze Advisor Works," www.fairisaac.com 12 pages (Jan. 2005).
Mesbah A et al., "A Component-and Push-Based Architectural Style for Ajax Applications," The Journal of Systems & Software, 81 (12): pp. 2194-2209, Elsevier North Holland, New York, NY US (Dec. 2008).
Oracle Fusion Middleware Administrators Guide for Oracle SOA (Oracle Guide) Suite 11g Release 1 (11.1.1) Part No. E10226-02 www.docs.oracle.com (Oct. 2009), 548 pages.
"OAuth core 1.0 Revision A [XP002570263]," OAuth Core Workgroups, pp. 1-27 www.ouath.net/core/1.0a/ (retrieved Jan. 31, 2013), 24 pages.
Anon., "AnswerSoft Announces Concerto; First to Combine Call Center Automation with Power of Web," Business Wire, (Feb. 3, 1997) 3 pages.
Emigh, J., "AnswerSoft Unveils Concerto for Web-Based Call Centers Feb. 5, 1996," Newsbytes, (Feb. 5, 1997) 2 pages.
Grigonis, R., "Webphony—It's not Just Callback Buttons Anymore," Computer Telephony, (Dec. 1997) 4 pages.
Wagner, M., "Caring for Customers," Internet World, (Sep. 1, 1999) 3 pages.
Sweat, J., "Human Touch—A New Wave of E-Service Offerings Blends the Web, E-Mail, and Voice Bringing People back into the Picture," Information week, (Oct. 4, 1999) 2 pages.
Kirkpatrick, K., "Electronic Exchange 2000, The," Computer Shopper, (Nov. 1999) 5 pages.
Anon., "InstantService.com Teams with Island Data to provide Integrated Solution for Online Customer Response," Business Wire, (May 22, 2000) 3 pages.
Kersnar, S., "Countrywide Offers Proprietary Technology for Online Wholesale Lending," National Mortgage News, vol. 24, No. 38, (Jun. 5, 2000) 2 pages.
Douglas Armstrong, Firstar Web site helps add up future, Milwaukee Journal Sentinel, (Mar. 28, 1996) 3 pages.
redhat.com downloaded on Jul. 23, 2006.
apache.org downloaded on Jul. 23, 2006.
mysql.com downloaded on Jul. 23, 2006.
developer.com downloaded on Jul. 23, 2006.
Canter, Ronald S., "Lender Beware—Federal Regulation of Consumer Credit", Credit World, vol. 81, No. 5, pp. 16-20, (May 1993).
Staff, "On-Line System Approves Loans While Customer Waits," Communication News, vol. 31, Issue 9, (Sep. 1994) 3 pages.
"Low-Rent Loan Officer in a Kiosk", Bank Technology News vol. 8 No. 2, p (Feb. 1995) 2 pages.
Duclaux, Denise, "A Check for $5,000 in Ten Minutes", ABA Banking Journal, vol. 87, No. 8, p. 45, AUQ. (1995) 2 pages.
"World Wide Web Enhances Customer's Choice", Cards International, No. 143, p. 9, (Nov. 1995) 2 pages.
Wells Fargo Launches First Real-Time, Online Home Equity Credit Decision-Making Service, Business Wire, (Jun. 3, 1998), Dialog__ File 621: New Product Announcement, 3 pages.
Handley, John, "Credit Review Lets the Numbers Do the Talking in Home Mortgage Game", Chicago Tribune (Jul. 1998) 3 pages.
Sherman, Lee, "Wells Fargo Writes a New Online Script", Interactive Week, vol. 5, No. 31, p. 29, (Aug. 1998) 2 pages.
Calvey, Mark, "Internet Gives Bankers a Snappy Comeback", San Francisco Business Times, vol. 13, No. 5, p. 3 (Sep. 1998) 2 pages.
McCormick, Linda, "Users of Credit Scoring Face Tough Rules on Notification", American Banker, Dialog File 625: American Banker Publications, (Mar. 21, 1982) 2 pages.
What the Credit Bureau is Saying About You: If a Mistake Sneaks Into Your Record, You May Not Know About it Until You Get Turned Down for Credit, Changing Times, vol. 37, p. 56, (Jul. 1983) 2 pages.
McShane. Peter K., "Got Financing?", Business Journal Serving Southern Tier, CNY, Mohawk Valley, Finger Lakes. North, vol. 11, Issue 19, p. 9, (Sep. 15, 1997) 3 pages.
Borowsky, Mark, "The Neural Net: Predictor of Fraud or Victim of Hype?", Bank Technology News DialoQ File 16:PROMT, p. 7 (Sep. 1993) 2 pages.
FICO http://houseloans.idis.com/fico (2009) 1 page.
Altavista: search, FICO http://www.altavista.com (2001) 3 pages.
What Do FICO Scores Mean to Me?, http://www.sancap.com. (1999) 3 pages.
What is a FICO Score?, http://www.aspeenloan.com (2009) 1 page.
"Credit", The New Encyclopedia Britannica vol. 3 p. 722. (1994) 3 pages.
"Creditnet.com—An Online Guide to Credit Cards", http://www.creditnet/com. (1999) 1 page.
"Phillips 66 Introduces Mastercard with Rebate Feature", PR Newswire, p914NY067, (Sep. 14, 1995) 1 page.
Anon, "VAR Agreement Expands Credit Bureau Access.", (CCS America, Magnum Communications Ltd expand CardPac access, Computers in Banking, v6, n10, (1) (Oct. 1989) 2 pages.
Wortmann, Harry S., "Reengineering Update—Outsourcing: An Option Full of Benefits and Responsibilities", American Banker, (Oct. 24, 1994), p. 7A vol. 159, No. 205 3 pages.
Anon. "To Boost Balances, AT&T Renews No-Fee Universal Credit Card Offer", Gale Group Newsletter, V 10, N. 13, (Mar. 30, 1992) 2 pages.
Anon. "Citgo Puts a New Spin on the Cobranded Oil Card", Credit Card News, p. 4, (Nov. 1, 1995) 2 pages.

(56) References Cited

OTHER PUBLICATIONS

Anon. "Microsoft Targets More than PIM Market with Outlook 2000," Computer Reseller News, N. 805 pp. 99, (Aug. 31, 1998) 2 pages.
Chesanow, Neil, "Pick the Right Credit Cards—and use them wisely", Medical Economics, v. 75, n. 16, p. 94, (Aug. 24, 1998) 4 pages.
Friedland, Marc, "Credit Scoring Digs Deeper into Data", Credit World, v. 84, n. 5 p. 19-23, (May 1996) 5 pages.
Hollander, Geoffrey, "Sibling Tool Personator 3 untangles File Formats", InfoWorld, v20, n5, pp. 102 (Feb. 2, 1998) 2 pages.
Kantrow, Yvette D., "Banks Press Cardholders to Take Cash Advances", American Banker, v. 157, n. 18 pp. 1-2. (Jan. 28, 1992) 2 pages.
Lotus News Release: "Lotus Delivers Pre-Release of Lotus Notes 4.6 Client Provides Compelling New Integration with Internet Explorer", (May 20, 1997) 2 pages.
Stetenfeld, Beth, "Credit Scoring: Finding the Right Recipe", Credit Union Management, v. 17, n. 11, pp. 24-26 (Nov. 1994).
Block, Valerie, "Network Assembles Card Issuers at an Internet Site", Am. Banker, V160, (1998) 1 page.
CreditNet Financial Network http://consumers.creditnet.com (1999) 1 page.
Anon., "Lending Tree: Lending Tree Provides Borrowers Fast and Easy Online Access to Multiple Loan Offers," Business Wire, Jun. 23, 1998, 2 pages.
Anon, Regulation Z Commentary Amendments, Retail Banking Digest, vol. 15, No. 2, p. 17-18, (Mar.-Apr. 1995).
Anon, San Diego Savings Association Offers Customers No-Fee Visa Product, Card News, (Feb. 29, 1988) 1 page.
Bloom, J.K., "For This New Visa, Only Web Surfers Need Apply," American Banker, vol. 1163, No. 34 12 (Feb. 20 1998) 2 pages.
Harney, K.R., "Realty Brokers, Lenders Face Restrictions," Arizona Republic, Final Chaser edition, Sun Living section, (Feb. 10, 1991) 2 pages.
Higgins, K.T., "Mr. Plastic Joins the Marketing Team," Credit Card Management, vol. 6, No. 3, pp. 26-30, Jun. 1993.
Microsoft Press Computer Dictionary, Third Edition, Microsoft Press, Redmond, 1997, 4 pages.
Whiteside, D.E., "One Million and Counting," Collections and Credit Risk, vol. 1, No. 11 (Nov. 1996) 5 pages.
Fickenscher, L., "Providian Undercuts rivals with 7.9% Rate Offer," American banker, vol. 163, Oct. 8, 1998, 2 pages.
Fargo, J., "The Internet Specialists," Credit Card Management, vol. 11, No. 10, pp. 38-45, Jan. 1999.
Lemay, T., "Browsing for a Mortgage a Click away," Financial Post, (Jan. 15, 2000) 1 page.
Wijnen, R., "Banks Fortify Online Services," Bank Technology News, vol. 13, No. 3, Mar. 2000, 3 pages.
Anon. "IAFC Launches NextCard, The First True Internet VISA," Business Wire, New York: (Feb. 6 1998), 3 pages.
Lazarony, Lucy, "Only Online Applicants Need Apply," Bank Advertising News, North Palm Beach, Mar. 23 1998, vol. 21, Issue 15, 3 pages.
FIData, Inc., News & Press Releases, "Instant Credit Union Loans via the Internet," http://web.archive.org/web/19990221115203/www.fidata-inc.com/news-pr01.htm (1999) 2 pages.
FIData, Inc., Press Releases, "Instant Loan Approvals via the Internet," http://www.fidata-_inc.com/news/pr_040198.htm, (Apr. 1, 1998) 2 pages.
Staff, "On-Line System Approves Loans While Customer Waits"—Abstract, Communication News, vol. 31, Issue 9, (Sep. 1994) 3 pages.
Anon. "Affordable Lending Systems Now Available for Smaller Financial Institutions," Business Wire, (May 18, 1998), 2 pages.
Nexis—All News Sources—Examiner's NPL Search Results in U.S. Appl. No. 11/932,498, included with Office Action issued Oct. 8, 2008, 14 pages.
"Sample Experian Credit Report" by Consumer Information consumerinfo.com (Jul. 9, 1998) 4 pages.

Plaintiffs Original Complaint, *Nextcard, LLC* v. *Liveperson, Inc.*; Civil Action No. 2:08-cv-00184-TJW, In the U.S. District Court for the Eastern District of Texas, Marshall Division, filed Apr. 30 2008 (7 pages).
Amended Complaint and Jury Demand; *Liveperson, Inc.* v. *Nextcard, LLC, et al.*; Civil Action No. 08-062 (GMS), In the U.S. District Court for the District of Delaware, filed Mar. 18, 2008 (5 pages).
Plaintiffs Second Amended Complaint; *Nextcard, LLC* v. *American Express Company, et al*; Civil Action No. 2:07-cv-354 (TJW); In the U.S. District Court for the Eastern District of Texas, Marshall Division, filed Apr. 9, 2008 (12 pages).
Defendants HSBC North America Holdings Inc.'s and HSBC USA Inc's Answer, Affirmative Defenses and Counterclaims to Plaintiffs Second Amended Complaint; *Nextcard, LLC* v. *American Express Company, et al*; Civil Action No. 2:07-cv-354 (TJW); In the U.S. District Court for the Eastern District of Texas, Marshall Division filed (Apr. 28, 2008), 13 pages.
Answer and Counterclaims of Defendant DFS Services LLC; *Nextcard, LLC* v. *American Express Company, et al*; Civil Action No. 2:07-cv-354 (TJW); In the U.S. District Court for the Eastern District of Texas, Marshall Division, filed Apr. 28, 2008 (13 pages).
Defendant The PNC Financial Services Group, Inc.'s Answer and Affirmative Defenses to Second Amended Complaint; *Nextcard, LLC* v. *American Express Company, et al*; Civil Action No. 2:07-cv-354 (TJW); In the U.S. District Court for the Eastern District of Texas, Marshall Division, filed Apr. 28 2008, 10 pages.
Plaintiffs Second Amended Reply to Counterclaims of Defendants HSBC North America Holdings Inc. and HSBC USA Inc.; *Nextcard, LLC* v. *American Express Company, et al*; Civil Action No. 2:07-cv-354 (TJW); In the U.S. District Court for the Eastern District of Texas, Marshall Division, filed May 14, 2008, 5 pages.
Plaintiffs Second Amended Reply to Counterclaims of Defendant DFS Services LLC; *Nextcard, LLC* v. *American Express Company, et al*; Civil Action No. 2:07-cv-354 (TJW); In the U.S. District Court for the Eastern District of Texas, Marshall Division, filed May 14, 2008 (71 pages).
Plaintiffs Second Amended Reply to Counterclaims of Defendant American Express Company; *Nextcard, LLC* v. *American Express Company, et al*; Civil Action No. 2:07-cv-354 (TJW); In the U.S. District Court for the Eastern District of Texas, Marshall Division, filed (May 8, 2008), 8 pages.
Justin Hibbard, Gregory Dalton, Mary E Thyfault. (Jun. 1998). "Web-based customer care." Information Week, (684) 18-20, 3 pages.
Kim S. Nash "Call all Customers." Computerworld, 32 (1), Dec. 25-28, 1997, 2 pages.
PRN: "First American Financial Acquires Tele-Track Inc.,"PR Newswire, (May 11, 1999), Proquest #41275773, 2 pages.
Young, Deborah, "The Information Store," (Sep. 15, 2000), Wireless Review, pp. 42, 44, 46, 48, 50.
Whiting et al., "Profitable Customers," (Mar. 29, 1999), Information Week, Issue 727, pp. 44, 45, 48, 52, 56.
Bayer, Judy, "A Framework for Developing and Using Retail Promotion Response Models," Cares Integrated Solutions, retrieved from www.ceresion.com (2007) 5 pages.
Bayer, Judy, "Automated Response Modeling System for Targeted Marketing," (Mar. 1998), Ceres Integrated Solutions, 5 pages.
Sweet et al., "Instant Marketing," (Aug. 12, 1999), Information Week, pp. 18-20.
SmartKids.com "Chooses Quadstone—The Smartest Customer Data Mining Solution," (Jul. 31, 2000), Business Wire, 2 pages.
"NCR's Next Generation Software Makes True Customer Relationship Management a Reality," (Jul. 26, 1999) PR Newswire, 3 pages.
"Quadstone System 3.0 Meets New Market Demand for Fast, Easy-to-Use Predictive Analysis for CRM," (May 22, 2000) Business Wire, 3 pages.
"Net Perceptions Alters Dynamics of Marketing Industry with Introduction of Net Perceptions for Call Centers," (Oct. 12, 1998) PR Newswire, 3 pages.
"Ceres Targeted Marketing Application," Ceres Integrated Solutions: retrieved from www.ceresios.com/Product/index.htm (2007) 3 pages.

(56) References Cited

OTHER PUBLICATIONS

Prince, C. J., E:business: A Look at the Future, Chief Executive, vol. 154, (Apr. 2000), pp. 10-11.
Oikarinen et al. "Internet Relay Chat Protocol" RFC-1459, pp. 1-65, (May 1993).
eDiet.com: Personalized Diets, Fitness, and Counseling, (May 3, 1998), pp. 1-15.
Fiszer, Max; "Customizing an inbound call-center with skills-based routing," Telemarketing & Call Center Solutions, (Jan. 1997), v15i7 p. 24; Proquest #11267840, 5 pages.
"ESL Federal Credit Union Inaugurates Internet Target Marketing." PR Newswire p. 4210 (Oct. 6, 1998), 3 pages.
"Welcome to eStara—The Industry Leader in Click to Call and Call Tracking Solutions," e-Stara, Inc., retrieved from www.estara.com on Mar. 21, 2013, 1 page.
"Push to Talk Live Now! From your website" iTalkSystem, Inc., retrieved from www.italksystems.com on Mar. 21, 2013, 1 page.
Richardson et al., "Predicting Clicks: Estimating the Click-Through Rate for New Ads," (May 2007) 9 pages.
"Welcome to Keen" retrieved from www.archive.org/web/20010302014355/http://www.keen.com/ on Jan. 25, 2013, 1 page.
Christophe Destruel, Herve Luga, Yves Duthen, Rene Caubet. "Classifiers based system for interface evolution." Expersys Conference, 265-270 (1997), 6 pages.
Ulla de Stricker, Annie Joan Olesen. "Is Management Consulting for You?" Searcher, 48-53 (Mar. 2005), 6 pages.
Humberto T. Marques Neto, Leonardo C.D. Rocha, Pedro H.C. Guerra, Jussara M. Almeida, Wagner Meira Jr., Virgilio A. F. Almeida. "A Characterization of Broadband User Behavior and Their E-Business Activities." ACM SIGMETRICS Performance Evaluation Review, 3-13 (2004), 11 pages.
Greg Bowman, Michael M. Danchak, Mary LaCombe, Don Porter. "Implementing the Rensselaer 80/20 Model in Professional Education." 30th ASEE/IEEE Frontiers in Education Conference, Session T3G (Oct. 18-21, 2000), 1 page.
Elizabeth Sklar Rozier, Richard Alterman. "Participatory Adaptation." CHI, 97, 261-262 (Mar. 22-27,1997), 2 pages.
Frank White. "The User Interface of Expert Systems: What Recent Research Tells Us." Library Software Review, vol. 13, No. 2, p. 91-98 (Summer 1994) 8 pages.
Frederick W. Rook, Michael L. Donnell. "Human Cognition and the Expert System Interface: Mental Models and Inference Explanations." IEEE Transactions on Systems, Man, and Cybernetics, vol. 23, No. 6, p. 1649-1661 (Nov./Dec. 1993), 13 pages.
International Search Report and Written Opinion for PCT Application No. PCT/US2013/041147, mailed Jul. 30, 2013, 9 pages.
International Search Report and Written Opinion for PCT Application No. PCT/US2013/037086, mailed Jul. 12, 2013, 9 pages.
International Search Report and Written Opinion for PCT Application No. PCT/US2013/29389, mailed Jul. 24, 2013, 8 pages.
International Search Report and Written Opinion for PCT Application No. PCT/US2013/038212, mailed Jul. 17, 2013, 11 pages.
International Search Report for PCT Application No. PCT/US03/41090, mailed on Sep. 1, 2004, 3 pages.
International Search Report for PCT Application No. PCT/US05/40012, mailed on Oct. 5, 2007, 2 pages.
International Preliminary Report on Patentability for PCT Application No. PCT/US2006/039630, dated Apr. 16, 2008, 4 pages.
International Search Report for PCT Application No. PCT/US2011/031239, mailed on Jul. 7, 2011, 3 pages.
International Search Report for PCT Application No. PCT/US2011/064946, mailed on Jun. 22, 2012, 3 pages.
International Preliminary Report on Patentability for PCT Application No. PCT/US2011/031239, dated Oct. 9, 2012, 8 pages.
Non-Final Office Action of Dec. 11, 2008 for U.S. Appl. No. 11/394,078, 15 pages.
Final Office Action of Jul. 9, 2009 for U.S. Appl. No. 11/394,078, 15 pages.
Non-Final Office Action of Jan. 28, 2010 for U.S. Appl. No. 11/394,078, 14 pages.
Final Office Action of Jul. 9, 2010 for U.S. Appl. No. 11/394,078, 16 pages.
Non-Final Office Action of Feb. 1, 2011 for U.S. Appl. No. 11/394,078, 20 pages.
Final Office Action of Aug. 2, 2011 for U.S. Appl. No. 11/394,078, 23 pages.
Non-Final Office Action of May 16, 2012 for U.S. Appl. No. 11/394,078, 23 pages.
Final Office Action of Jan. 25, 2013 for U.S. Appl. No. 11/394,078, 22 pages.
Non-Final Office Action of Jun. 22, 2012 for U.S. Appl. No. 13/080,324, 9 pages.
Non-Final Office Action of Aug. 15, 2012 for U.S. Appl. No. 12/967,782, 31 pages.
Non-Final Office Action of Jul. 29, 2011 for U.S. Appl. No. 12/608,117, 20 pages.
Final Office Action of Apr. 4, 2012 for U.S. Appl. No. 12/608,117, 25 pages.
Non-Final Office Action of Apr. 24, 2004 for U.S. Appl. No. 09/922,753, 16 pages.
Final Office Action of Oct. 14, 2004 for U.S. Appl. No. 09/922,753, 13 pages.
Non-Final Office Action of May 17, 2005 for U.S. Appl. No. 09/922,753, 13 pages.
Non-Final Office Action of Mar. 14, 2006 for U.S. Appl. No. 09/922,753, 13 pages.
Final Office Action of Jul. 26, 2006 for U.S. Appl. No. 09/922,753, 13 pages.
Non-Final Office Action of Aug. 13, 2008 for U.S. Appl. No. 09/922,753, 10 pages.
Final Office Action of Apr. 23, 2009 for U.S. Appl. No. 09/922,753, 11 pages.
Non-Final Office Action of Jul. 21, 2009 for U.S. Appl. No. 09/922,753, 10 pages.
Final Office Action of Feb. 18, 2010 for U.S. Appl. No. 09/922,753, 9 pages.
Non-Final Office Action of Apr. 25, 2011 for U.S. Appl. No. 09/922,753, 9 pages.
Final Office Action of Nov. 25, 2011 for U.S. Appl. No. 09/922,753, 10 pages.
Non-Final Office Action of Aug. 7, 2007 for U.S. Appl. No. 10/980,613, 16 pages.
Non-Final Office Action of May 15, 2008 for U.S. Appl. No. 10/980,613, 23 pages.
Non-Final Office Action of Apr. 30, 2012 for U.S. Appl. No. 12/504,265, 16 pages.
Final Office Action of Aug. 28, 2012 for U.S. Appl. No. 12/504,265, 28 pages.
Final Office Action of Feb. 14, 2013 for U.S. Appl. No. 13/080,324, 11 pages.
Final Office Action of Apr. 11, 2013 for U.S. Appl. No. 12/967,782, 18 pages.
Non-Final Office Action of Jun. 12, 2013 for U.S. Appl. No. 12/608,117, 56 pages.
Non-Final Office Action of Jul. 8, 2013 for U.S. Appl. No. 13/413,197, 10 pages.
Non-Final Office Action of Jun. 27, 2013 for U.S. Appl. No. 12/504,265 , 11 pages.
Non-Final Office Action of May 10, 2013 for U.S. Appl. No. 13/563,708, 20 pages.
Non-Final Office Action of Mar. 30, 2013 for U.S. Appl. No. 11/360,530, 23 pages.
Final Office Action of Oct. 21, 2013 for U.S. Appl. No. 12/504,265 14 pages.
Non-Final Office Action of Oct. 30, 2013 for U.S. Appl. No. 13/961,072, 10 pages.
Non-Final Office Action of Dec. 5, 2013 for U.S. Appl. No. 12/967,782, 14 pages.
Notice of Allowance of Jan. 3, 2014 for U.S. Appl. No. 11/360,530, 29 pages.
Final Office Action of Jan. 22, 2014 for U.S. Appl. No. 12/608,117, 45 pages.

(56) References Cited

OTHER PUBLICATIONS

Final Office Action of Jan. 27, 2014 for U.S. Appl No. 13/563,708, 35 pages.
Non-Final Office Action of Jan. 30, 2014 for U.S. Appl. No. 13/413,158, 19 pages.
Final Office Action of Feb. 19, 2014 for U.S. Appl. No. 13/961,072, 35 pages.
Non-Final Office Action of Feb. 20, 2014 for U.S. Appl. No. 10/980,613, 43 pages.
Notice of Allowance of Feb. 28, 2014 for U.S. Appl. No. 09/922,753, 13 pages.
Notice of Allowance of Mar. 25, 2014 for U.S. Appl. No. 12/504,265, 31 pages.
Notice of Allowance of Mar. 31, 2014 for U.S. Appl. No. 12/725,999, 41 pages.
Notice of Allowance of Apr. 1, 2014 for U.S. Appl. No. 13/413,197, 32 pages.

\* cited by examiner

METHOD AND SYSTEM FOR CREATING A PREDICTIVE MODEL FOR TARGETING WEB-PAGE TO A SURFER

CROSS-REFERENCE TO RELATED APPLICATIONS

This application is being filed under 35 USC 111 and 37 CFR 1.53(b) as a continuation-in-part application of the patent application filed in the United States under the title of METHOD AND SYSTEM FOR CREATING A PREDICTIVE MODEL FOR TARGETING CONTENT TO A SURFER on Jul. 16, 2009 and assigned Ser. No. 12/504,265, which application claims the benefit of the filing date of the provisional application for patent filed in the United States under the title of METHOD AND SYSTEM FOR PROVIDING TARGETED CONTENT TO A SURFER on Jul. 25, 2008 and assigned Ser. No. 61/083,551 and the provisional application for patent filed in the United States under the title of METHOD AND SYSTEM FOR CREATING A PREDICTIVE MODEL FOR TARGETING CONTENT TO A SURFER on Jul. 25, 2008 and assigned Ser. No. 61/083,558. The present application is related to the patent application that was filed in the United States under the title of METHOD AND SYSTEM FOR PROVIDING TARGETED CONTENT TO A SURFER on Jul. 16, 2009 and assigned Ser. No. 12/503,925. Each of these patent applications and provisional applications for patent are herein incorporated by reference in their entirety.

BACKGROUND

More and more people are communicating via the Internet and other networks. The Internet, in particular, is a hierarchy of many smaller computer networks, all of which are interconnected by various types of server computers. Some of the servers interconnected through the Internet provide database housing as well as storage of a plurality of web-pages, generally referred to as the World Wide Web (WWW). By virtue of being accessible through the WWW, these web-pages may be retrieved by random Internet users, i.e. surfers, operating computers with a browser. Exemplary computers can be a personal computer (PC), a laptop, a notebook computer, a cellular telephone, a handheld computer, a personal data assistant (PDA), or any other computing device with wired or wireless communication capabilities communicable over an IP network.

Some common examples of browser applications used by Internet surfers are Openwave Systems Inc. or Opera Mobile Browser (a trademark of Opera Software ASA), Microsoft Internet Explorer (a trademark of Microsoft), and Firefox Web Browser. Using a web browser application on a computer that is connected to the Internet, surfers may retrieve web-pages that include information such as news, professional information, advertisements, e-commerce links, content downloads, etc. A common browser application may use Hyper Text Transport Protocol (HTTP) in order to request a web-page from a website. Upon receipt of a web-page request by a browser, the website responds by transmitting a markup language file, such as Hypertext Markup Language (HTML), that is representative of the requested page or pages. Notably, HTTP requests and HTML responses are well known in the art and are used as representative terms for the respective markup language files throughout this disclosure.

A common web-page may include numerous buttons, or links, operable to redirect a surfer to other locations within the website or on the Internet. These links offer a surfer a path to a next event which may be the presentation of another web-page, embedded content within the present web-page (e.g. an image, an advertisement, a banner, etc.), a playable media file, a number for forwarding a short message service (SMS) with a password, an application form, a registration form, etc.

A common link design may display a name of a category of information, such as news, sport, or economics. Other link designs may comprise a banner or an image intended to attract the attention of a surfer to an advertisement, an image, a text message that prompts the surfer to dial a number and use a password, etc. If a surfer is enticed to explore the offer shown on the link design, the surfer will use a pointing device such as a mouse, and place the pointer over the selected button, which may be comprised of a banner for example, and issue a command by "clicking" the mouse to "click through" on that button. In such a scenario, the surfer's browser may return information from a website associated with the particular banner that comprised the link.

In the present description, the terms "selecting button," "selection button," "redirecting button," "slot", "link," "Hyper Link" and "banner" are used interchangeably. The terms "banner" and "slot" can be used as a representative term for the above group. An "advertisement" (AD) or "object" may be used as representative terms for content. Exemplary types of content can be the text of an AD as well as an AD's font, color, design of the object, an image, the design of the page in which the object is presented, etc.

The benefit from presenting a web-page, as well as improving a surfer's experience when surfing the web-page, can be increased if the selection buttons within the web-page are targeted toward the immediate observer. There are numerous existing methods and systems for offering targeted content in a web based environment. Some of the methods employ questionnaires containing categorized questions on user preferences. Such methods require the management of huge databases containing information on a large number of users. Besides the cumbersome management of all the information acquired from questionnaires, another negative is that many users prefer not to reply to a personalize questionnaire.

Other methods for identifying and offering targeted content in a web environment make use of client applications installed on a user's computer. The client applications are operable to track a user's activity on the web and subsequently report a compilation of the tracked activity to an associated web server or content server. Such methods are not popular with many users concerned with privacy. Further, such methods may require the often costly and awkward installation of a client application on a user's computer.

Some methodologies for delivery of targeted content may comprise a learning period and an ongoing period. During the learning period, a plurality of options of content within a certain web-page may be presented to various surfers. The response of the surfers to the various content options is monitored throughout the learning period in anticipation of ultimately employing the best performing alternative. During the subsequent ongoing period, all surfers requesting the certain web-page will be exposed to the previously selected alternative. Such an algorithm is often referred to as "The king of the Hill" algorithm. While a "King of the Hill" approach can fit the preference of a large group of surfers, it is prone to missing other groups of surfers that prefer other content delivery alternatives.

BRIEF SUMMARY

There is a need in the art for a method and system that can calculate predictive models for determining an object to be presented in association with a given link in a web-page used to attract an observer and entice a response. Exemplary responses may be the selection, or clicking of, a certain link (banner, for example), sending of an SMS, calling a number and using a password, the amount of revenue that was created by selecting this link, the number of visits of a surfer in a certain page, which were needed until the revenue was created, converting rate, etc. In an embodiment of the present disclosure, when calculating the predictive model the expected value to the content provider is taken into account. In order to save expenses and complexity, it is desired that the system be transparent to a surfer and will not require a database for storing information associated with a number of surfers. Converting is the state in which a surfer converts a link according to the desire of the website owner. Purchasing is an example for converting, filling a questionnaire can be another type of converting, registration, is another type of converting and so on.

Exemplary embodiments of the present disclosure seek to provide novel solutions for determining which content object taken from a group of content objects will be best suited for presentation in association with a link on a requested web-page. Exemplary types of content objects may comprise the text, topic, font, color, image, or other attribute of an advertisement. Still other content objects may comprise the specific design of the object, an image, the design of the page in which the object is presented, etc. Other embodiments may determine how to respond to a surfer request from the website. The decision process for selecting a content object can be based on information that is associated with the request, such as a common HTTP request. Exemplary associated information may include the day and time of receipt of the request for the web-page, the IP address and/or domain from which the request was sent, the type and the version of the browser application that is used for requesting the web-page, and the URL used by a surfer for requesting the web-page with the parameters that are attached to the URL.

Other types of information that is associated with the request can be statistical information indicative of the behavior of a surfer in relation to the website to which the request was sent. Behavioral information may include timers, frequency of visits by a surfer to the website, the last time that a surfer requested a web-page, etc. Other behavioral information may include one or more counters wherein each counter can count the number of events of a certain type. Exemplary counters can measure the number of visits by a specific surfer to the relevant website, the number of requests for a certain web-page within the website, the number of times a certain offer (content object) was selected or not selected, etc. Even further, some of the exemplary counters may be time dependent such that the value of the counter descends over time. In some exemplary embodiments of the present disclosure, the behavioral information may be embedded within a cookie that is related to the relevant website or a third party cookie.

Still other exemplary types of information comprise grouping or categorizing information. Grouping information can be delivered by a web server that contains a requested web-page. The grouping information can be associated with a group to which a current surfer belongs, surfer's grouping information (SGI). Exemplary surfer's grouping information can be used to define attributes of the group such as preferred sport clothing, preferred brand names, marital status, gender, age, etc. Surfer's grouping information can be managed by the web server and/or by a 3rd party server, and added to a field in a cookie associated with a certain surfer, for example.

Other grouping information can reflect attributes of the content, content grouping information (CGI). The CGI can be related to the requested web-page as well as attributes of the content objects presented in the requested web-page. Exemplary CGI can define attributes of the page or the content object such as the cost of a product, a product brand, vacation information, sport information, etc. CGI can be managed by the web server and added to a field in the URL of a certain web-page or URL of a certain content object, for example.

Each type of information, associated information, statistical information and grouping information can be retrieved and processed for defining one or more predictive factors which can be used in one or more predictive models. The predictive factors are used for calculating the predictive value gained by the website when presenting each content element. This value can also be the probability of a certain content object, from a group, to be selected, to be clicked, by a surfer currently observing the requested web-page. The predictive factors can be referred to as extracted features.

Some embodiments use a utility value or a key-performance indicator (KPI). A utility value, or the KPI value, can represent a website's benefit when the alternative is explored by a surfer. The benefit can be the rate of clicking (selecting) on a certain object in the presented web-page, the rate of converting a certain object, purchasing rate, the revenue rate which was created by presenting the web-page, etc. The probability can be multiplied by the associated utility to obtain the expected utility when presenting the alternative. In the present description, the terms "predictive factor," and "predictive variable" may be used interchangeably.

In some embodiments the predictive model of a certain web-page takes into consideration the visit of a surfer in the website and the number of times the same web-page has been requested until creating a utility value, a certain KPI, related to the web-page. A visit of a surfer started from the first request to the website and ended after a certain period of the surfer's inactivity with the website. The period can be few tens of minutes of inactivity, 30 minutes for example. For a predictive model of a web-page that reflects the visit of the surfer in the website, the weigh of the utility value or the KPI, which was created at the end of the visit, can be divided by the number of times the surfer observed the relevant web-page until determine to select, or purchase certain goods or services or create a certain revenue to the website owners.

An exemplary embodiment may build in parallel two or more predictive models for the same web-page. Each model can be related to a different KPI. Each model can be ready to be used in a different time. Building a predictive model per each KPI requires a certain level of variance within each KPI samples. In general the number of events in which the KPI is just clicking, fetching a certain object, is more frequent than the number of events in which a link is converted into a purchase or to deliver certain revenue. Therefore the required level of variance in the clicking samples can be reached in a shorter learning period than the learning period which is needed for preparing a predictive model for purchasing KPI. Consequently, the predictive model that is related to KPI which is just click on a link will be ready before a predictive model that is related to revenue KPI.

An exemplary embodiment that creates two or more predictive models per web-page, wherein each model is related to another KPI, can be able to determine when to switch from one predictive model to the other. The decision can be based on the readiness of the models and the utility of the relevant KPI to the web-page owners. For example, a predictive model that is related to revenue can be the last to be ready; however it can be the most important one to the website owner. Therefore, such an embodiment may start providing targeted content based on a predictive model that is related to "click" KPI and later on it may automatically switch to use a predictive model that is related to converting rate KPI and finally may use predictive model that maximize the revenue KPI, for example.

Revenue KPI can be measured as the amount of dollars, Euros, or other currency which was created from a certain web-page. In some embodiments the revenue KPI can be measured as the amount of dollars, Euros, or other currency which was created during a certain visit, etc.

An exemplary embodiment of the present disclosure can create a bank of predictive models. Each predictive model can be associated with a content object from the set of content objects that can be presented over the requested web-page. An exemplary predictive model may include one or more predictive factors with each predictive factor (predictive variable) being associated with a coefficient in a predictive formula. Exemplary predictive formulas can be based on known predictive algorithms such as, but not limited to, logistic regression, linear regression, decision tree analysis, etc. Some exemplary embodiments of the present disclosure can use linear or logistic regression, with or without stepwise methods, while calculating the predictive formula.

A predictive factor can also be a subset of values of certain variables such as, for example, the weekdays Monday and Saturday. The coefficient can thus outline the effect a predictive factor has on the predicted probability that a relevant content object will trigger a desired response from a surfer. The desire response, which is the KPI, can be the clicking, converting, creating revenue, etc. Exemplary predictive factors may include, for example, the day in the week (Monday and Saturday, for example), the hour, the browser type, the number of visits to the site, the content object that is presented in accordance with another link on the same web-page, the total elapsed time from the last visit, etc.

Exemplary predictive models can include some constants that are related to the content object associated with the model. Exemplary constants may be a utility constant which reflects the benefits the owner of the website receives when the relevant content object is selected or an arithmetic factor.

For each content object presented over a requested web-page, a predictive model with relevant predictive factors is processed such that the predicted objective, the probability of success for example, is calculated. A success is defined as a surfer responding positively to the presented content. For example, should a surfer select a relevant content object, the probability of the objects that can be presented is calculated. Subsequently, the combination of one or more objects with the highest predictive expected utility are selected to be associated with the links in the web-page requested by the surfer. The markup file that represents the web-page is modified such that its links point to the selected objects. The predictive objective value can be calculated to correspond to the predictive model. For example, in the logistic regression predictive model, the optimal linear predictive function is calculated and converted using a link function such as "Log Odds,"

An exemplary embodiment of the present disclosure may include a learning module. An exemplary learning module may be adapted to monitor the data exchange between a plurality of random surfers at one or more websites. Further, it can collect information on objects embedded and offered within the requested web-pages as well as track how each of the random surfers responds to those offers. From time to time, the exemplary learning module can process the sampled data in order to determine which predictive factors are relevant for each one of the objects and calculated an associated coefficient for success. Per each object, its associated statistical module can be updated or recalculated using the new or updated predictive factors.

An exemplary embodiment of the present disclosure can operate in either of two modes of operation, i.e. learning mode and ongoing mode. The learning mode can be executed after the initialization or when the content of the website is changed, for example. During the learning mode, new predictive models are calculated. The ongoing mode can be executed after the learning mode and may monitor and tune the existing predictive models.

During the learning mode, a large portion of communication sessions are sampled in order to define the new predictive models. During the ongoing mode, the size of the sample can be reduced and the predictive model can be tuned. When a significant change in the performance of a predictive model is observed, then a notification can be issued and/or a new predictive model can be created.

Some embodiments, during the learning mode, may collect information that is related to a visit. The information may include the number of times that the relevant webpage was retrieved by a certain surfer during a certain visit, etc. There are embodiments that during the learning mode collect information that related to different KPI. Such embodiments may deliver two or more predictive models per web-page. Each predictive model can be associated with different KPI and each predictive model can be ready in different time. Such embodiments are capable of switching between predictive models based on their readiness and their utility to the website owner.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting. Moreover, the language used in this disclosure has been principally selected for readability and instructional purposes, and may not have been selected to delineate or circumscribe the inventive subject matter, resort to the claims being necessary to determine such inventive subject matter. Reference in the specification to "one embodiment" or to "an embodiment" means that a particular feature, structure, or characteristic described in connection with the embodiments is included in at least one embodiment of the invention, and multiple references to "one embodiment" or "an embodiment" should not be understood as necessarily all referring to the same embodiment.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system. Software may be embodied on a computer readable medium such as a read/write hard disc, CDROM, Flash memory, ROM, etc. In order to execute a certain task, a software program may be loaded to an appropriate processor as needed.

The foregoing summary is not intended to summarize each potential embodiment or every aspect of the present disclosure. Other features and advantages of the present disclosure will become apparent upon reading the following detailed description of the embodiments with the accompanying drawings and appended claims.

BRIEF DESCRIPTION OF THE SEVERAL VIEWS OF THE DRAWING

Exemplary embodiments of the present disclosure will be understood and appreciated more fully from the following detailed description, taken in conjunction with the drawings in which.

DETAILED DESCRIPTION

Figure 1:
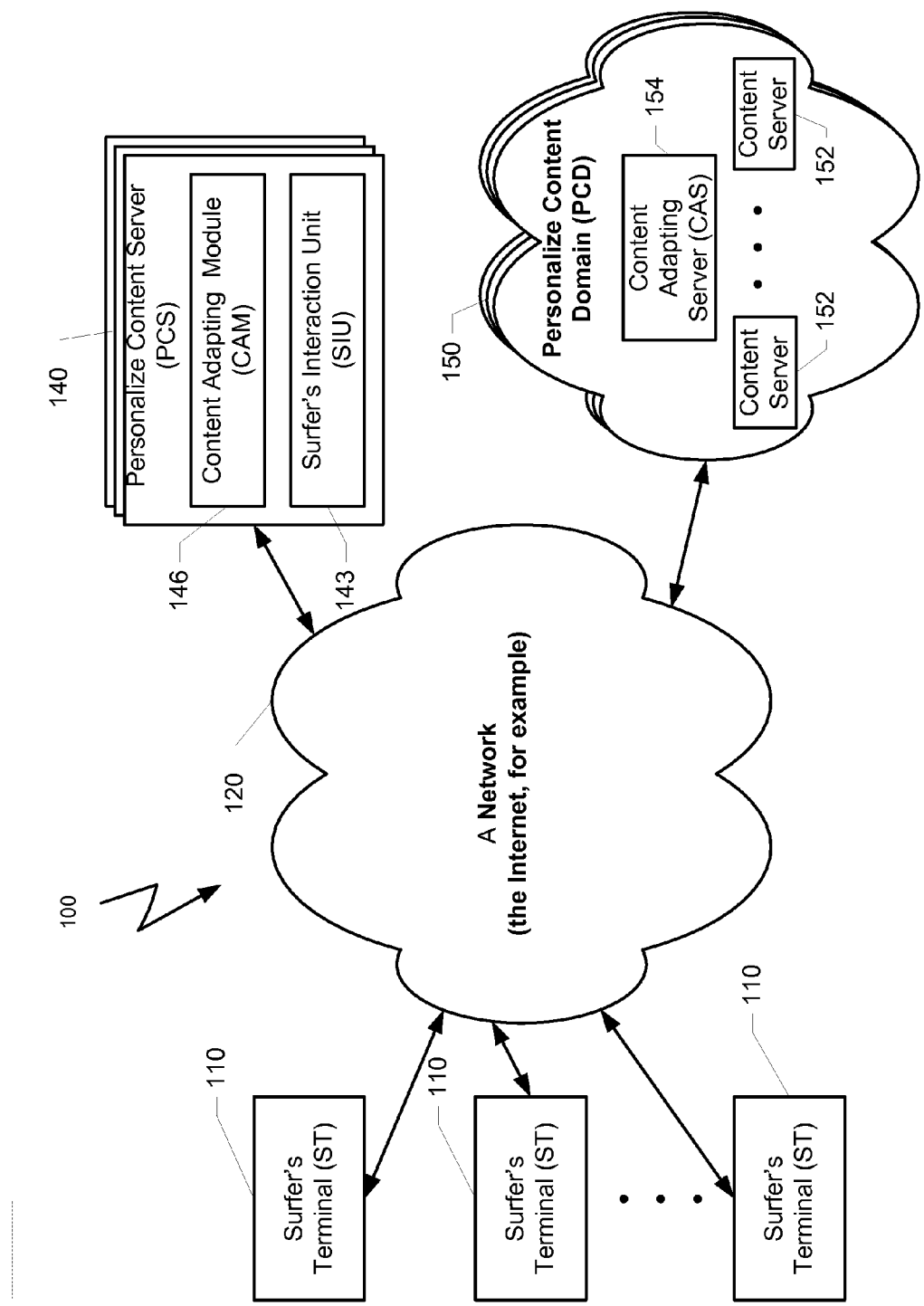
FIG. 1 is a simplified block diagram illustration of an exemplary portion of a communication network in which exemplary embodiments of the present disclosure can be used.

In the following description, for purposes of explanation, numerous specific details are set forth in order to provide a thorough understanding of the invention. It will be apparent, however, to one skilled in the art that the invention may be practiced without these specific details. In other instances, structure and devices are shown in block diagram form in order to avoid obscuring the invention. References to numbers without subscripts or suffixes are understood to reference all instance of subscripts and suffixes corresponding to the referenced number. Moreover, the language used in this disclosure has been principally selected for readability and instructional purposes, and may not have been selected to delineate or circumscribe the inventive subject matter, resort to the claims being necessary to determine such inventive subject matter. Reference in the specification to "one embodiment" or to "an embodiment" means that a particular feature, structure, or characteristic described in connection with the embodiments is included in at least one embodiment of the invention, and multiple references to "one embodiment" or "an embodiment" should not be understood as necessarily all referring to the same embodiment.

Although some of the following description is written in terms that relate to software or firmware, embodiments may implement the features and functionality described herein in software, firmware, or hardware as desired, including any combination of software, firmware, and hardware. In the following description, the words "unit," "element," "module" and "logical module" may be used interchangeably. Anything designated as a unit or module may be a stand-alone unit or a specialized or integrated module. A unit or a module may be modular or have modular aspects allowing it to be easily removed and replaced with another similar unit or module. Each unit or module may be any one of, or any combination of, software, hardware, and/or firmware, ultimately resulting in one or more processors programmed to execute the functionality ascribed to the unit or module. Additionally, multiple modules of the same or different types may be implemented by a single processor. Software of a logical module may be embodied on a computer readable medium such as a read/write hard disc, CDROM, Flash memory, ROM, or other memory or storage, etc. In order to execute a certain task a software program may be loaded to an appropriate processor as needed.

In the description and claims of the present disclosure, "comprise," "include," "have," and conjugates thereof are used to indicate that the object or objects of the verb are not necessarily a complete listing of members, components, elements, or parts of the subject or subjects of the verb.

The present disclosure relates to the presentation of data over communication networks, such as the Internet, and more particularly to selecting one or more objects (content of a web link) from a group of objects of content, to be presented over a requested web-page. An "object" may be used as representative terms for content. Exemplary types of content can be the text of an AD as well as an AD's font, color, design of the object, an image, the design of the page in which the object is presented, etc.

Turning now to the figures in which like numerals represent like elements throughout the several views, exemplary embodiments of the present disclosure are described. For convenience, only some elements of the same group may be labeled with numerals. The purpose of the drawings is to describe exemplary embodiments. Therefore, features shown in the figures are chosen for convenience and clarity of presentation only.

FIG. 1 depicts a block diagram with relevant elements of an exemplary communication system 100, which is a suitable environment for implementing exemplary embodiments of the present disclosure. Communication system 100 may comprise a plurality of surfer terminals (ST) 110; a network 120 such as, but not limited to the Internet, the world wide web (WWW); one or more personalize content servers PCS 140; and one or more personalize content domains (PCD) 150.

The communications system 100 may be based on the Internet Protocol (IP). Network 120 may represent one or more network segments including, but not limited to, one or more Internet segments, one or more Intranets, etc. Network 120 may run over one or more types of physical networks such as, but not limited to, Public Switched Telephone Network (PSTN), Integrated Services Digital Network (ISDN), cellular networks, satellite networks, etc. Further, network 120 may run over a combination of network types. Network 120 may also include intermediate nodes along the connection between a surfer and a content server. The intermediate nodes may include, but are not limited to, IP service provider servers, cellular service provider servers and other types of network equipment.

It will be appreciated by those skilled in the art that depending upon its configuration and the needs, communication system 100 may comprise more than three ST 110, three PCS 140 and three PCD 150. However, for purposes of simplicity of presentation, three units of each are depicted in the figures. Further, it should be noted that the terms: "surfer terminal", "terminals," "endpoint computer," "endpoint," "surfer," "user's device," "mobile phone" and "user" may be used interchangeably herein.

A plurality of ST 110 may be served by system 100 for surfing the Internet 120 and fetching web-pages from the one or more PCS 140 or PCD 150. Exemplary ST 110 can be a personal computer (PC), a laptop, a notebook computer, a cellular telephone, a handheld computer, a personal data assistant (PDA), or any other computing device with wired or wireless communication capabilities communicable over an IP network. A common ST 110 may run a browser application such as, but not limited to, Openwave Systems Inc. or Opera Mobile Browser (a trademark of Opera Software ASA), Microsoft Internet Explorer (a trademark of Microsoft), or Firefox Web Browser, etc. The browser application can be used for rendering web-pages. Exemplary web-pages may include information such as news, professional information, advertisements, e-commerce content, etc.

A common browser application can use HTTP while requesting a web-page from a website. The website can respond with a markup language file such as but not limited to HTML files. Herein the term HTML is used as a representative term for a markup language file. HTTP requests and HTML responses are well known in the art.

Exemplary PCS 140 and/or PCD 150 may receive HTTP requests from the plurality of ST 110 and deliver web-pages in the form of markup language files such as, but not limited to, HTML files. An exemplary PCS 140 may comprise a surfer's interface unit (SIU) 143 and a content adapting module (CAM) 146. Exemplary SIU 143 can execute common activities of a content server. Further, it may receive HTTP requests and respond with HTML files. In addition, exemplary SIU 143 may communicate with CAM 146 and/or deliver information about the activities of the different ST 110. The activity can be the web-pages requested by the surfers, for example.

In some exemplary embodiments of the present disclosure, SIU 143 may deliver, to CAM 146, information about surfer's attributes. Exemplary attributes may be a surfer's purchasing habits (expensive, not-expensive, brand name, etc.). A specific surfer's information can be managed by the web server and be added to a field in the cookie associated with the particular surfer.

In some embodiments, the information can also be related to the requested web-page as well as particular attributes of the content objects to be presented in the requested web-page. Exemplary information that may define attributes of the web-page or the content object include, but are not limited to, the cost of a product, the brand of a product, vacation information, etc. This type of information can be managed by the web server and added to a field in the URL of a certain web-page or URL of a certain content object, for example.

CAM 146 may process requests of different surfers in order to create a plurality of predictive modules, wherein each predictive module can be associated with an optional object that is presented over a requested web-page in one of the slots (redirection-button) from a set of optional slots. The predictive modules can be used to select a set of one or more objects that maximizes an expected benefit to the site owner. In the present description, the terms "expected benefit" and "expected utility" can be used interchangeably. The sets of slots, in which an optional object can be presented, and the selected optional object to be presented in each slot (Slot/Optional-object) can be defined within the configuration of the web-page. The configuration of the object/redirection-buttons with the optimal prediction to be selected for the requesting surfer is transferred to SIU 143. In response, SIU 143 may modify the HTML file to include those objects in the relevant links.

Some embodiments of CAM 146 may handle two or more predictive models per web page. Each predictive model can be associated with different KPI and each predictive model can be ready in different time. Such embodiments are capable of switching between predictive models based on their readiness and their utility to the website owner. In some embodiments, a predictive model can target a weighted mix of KPIs.

There are some embodiments of CAM 146 that may create predictive model per web-page taking into consideration the visit of a surfer. In such embodiment the weight of the KPI, which was achieved at the end of the visit and is related to the relevant web-page, can be divided by the number of times the relevant web-page had been requested and rendered to the surfer during the visit until a decision was made by the surfer.

Exemplary PCD 150 can include a plurality of common content servers 152 and one or more content adapting servers (CAS) 154. CAS 154 can be connected as an intermediate node between the plurality of ST 110 and the content servers 152. In one exemplary embodiment, CAS 154 may be configured as the default gateway of the PCD 150. In another exemplary embodiment, CAS 154 may physically reside between the PCD 150 and the network 120.

In yet another exemplary embodiment of the present disclosure, a redirector may be included and CAS 154 can be configured as a transparent proxy. In such an embodiment, CAS 154 may be transparent to both sides of the connection, to ST 110 and to the content servers 152. In an alternate exemplary embodiment of the present disclosure CAS 154 may be used as a non-transparent proxy. In such an embodiment, the ST 110 can be configured to access CAS 154 as their proxy, for example. In an alternate exemplary embodiment of CAS 154, not shown in the drawing, can communicate with a website by using a certain application program interface (API). Yet, in an alternate exemplary embodiment of CAS 154, not shown in the drawing, can be invoked by a link to a JavaScript (JS). More information on those embodiments is disclosed below.

CAS 154 can intercept the data traffic between the plurality of ST 110 and content servers 152. CAS 154 tracks the behavior of a plurality of surfers in order to create predictive models for content objects to be associated with requested web-pages. Subsequently, when operating in an ongoing mode, the predictive models can be used for determining which objects to assign to a web-page requested by a given surfer.

Toward PCD 150, CAS 154 can process requests of surfers for web-pages from one or more of the content servers 152, for retrieving a plurality of predictive factors to be used in a plurality of predictive modules, similar to the predictive modules that are used by exemplary CAM 146. In the other direction, CAS 154 can process the responses (the HTML files, for example) and determine, based on the predictive models, which object to present. The HTML file, which represents the web-page, is modified to include those objects in the links. More information on the operation of PCS 140 and CAS 154 is disclosed below in conjunction with FIGS. 2 to 9a and b.

Figure 2A:
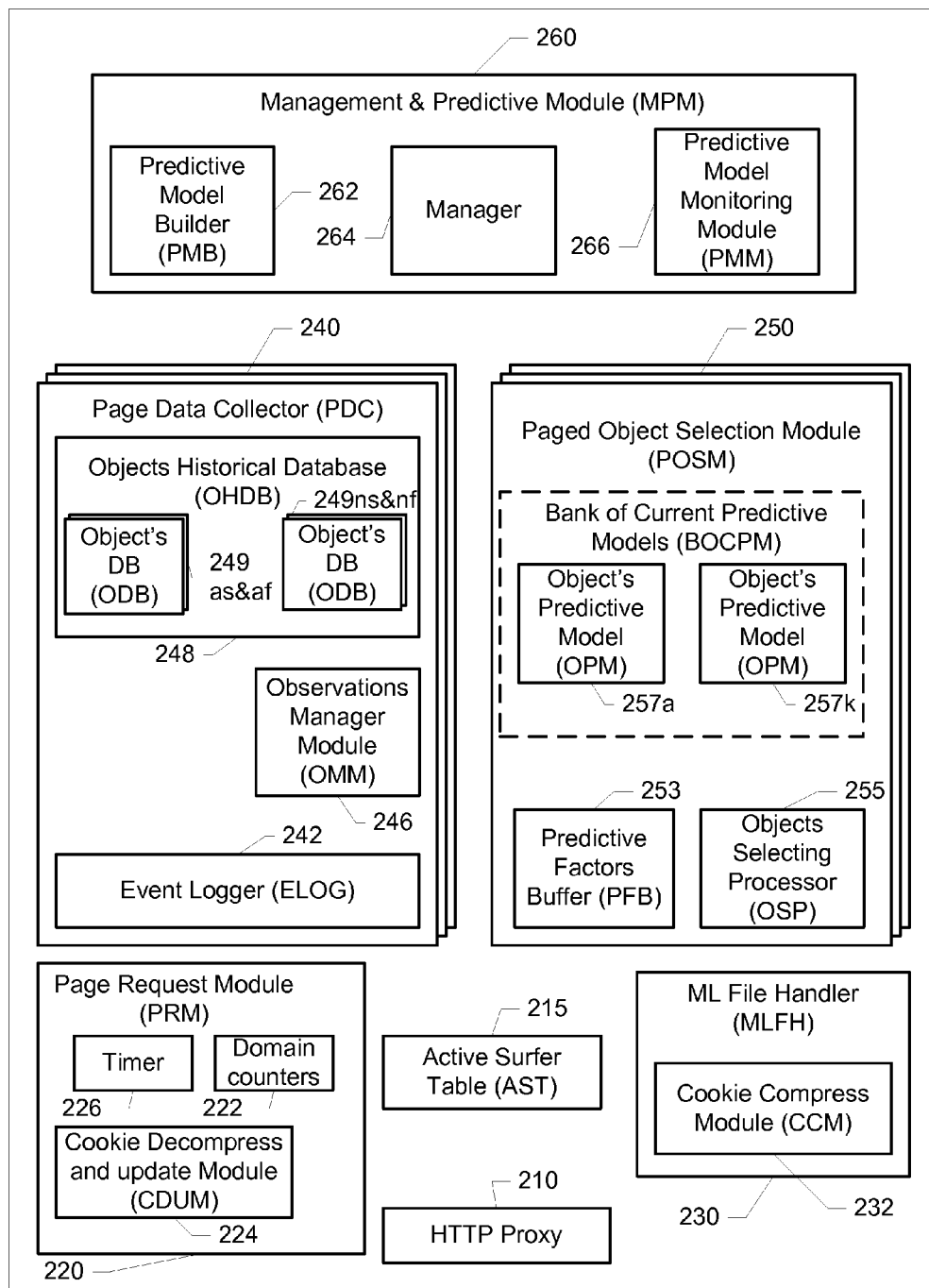
FIG. 2a schematically illustrates a simplified block diagram with relevant elements of an exemplary content adapting server (CAS) that operates according to an exemplary technique of the present disclosure.
Figure 2B:
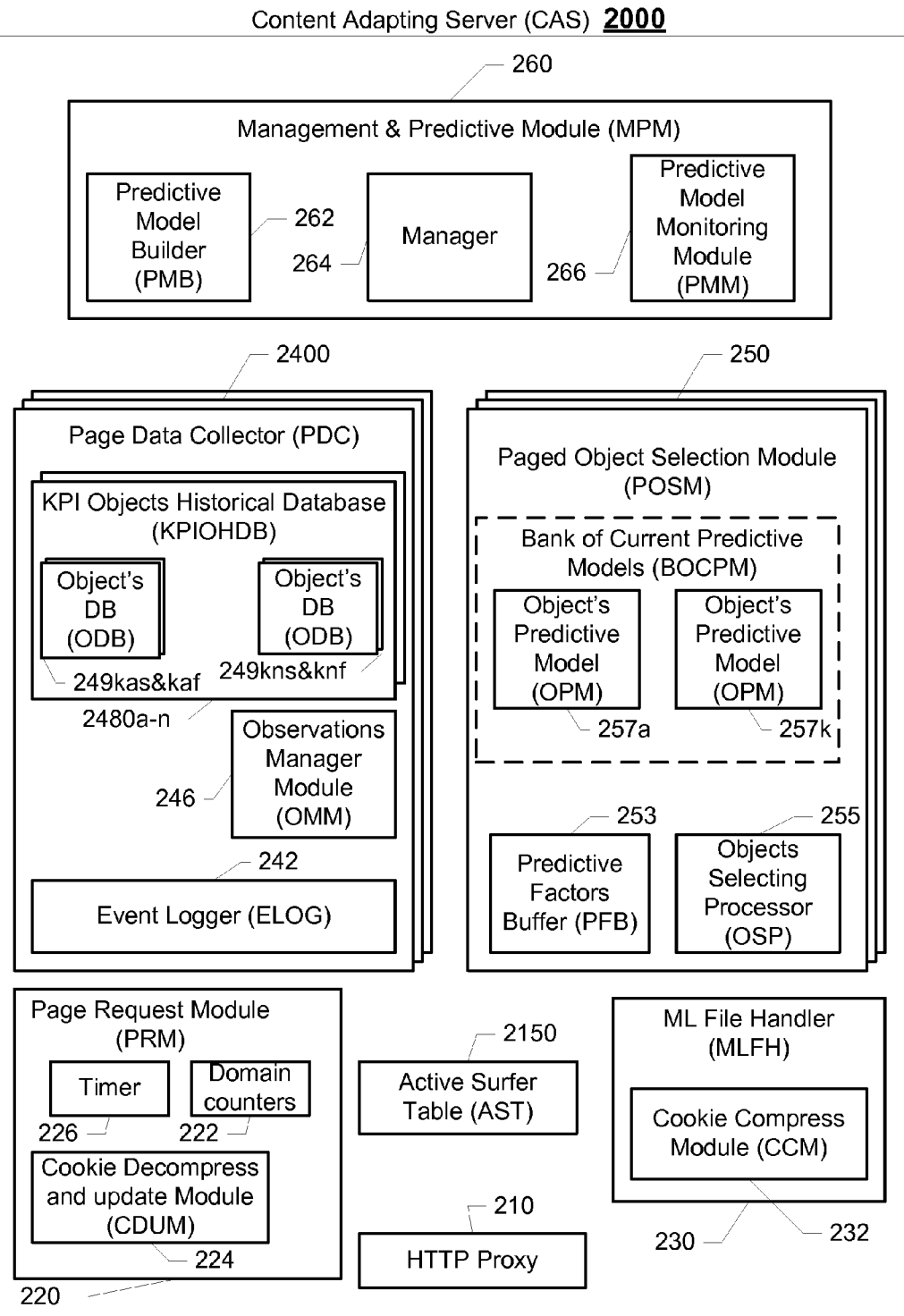
FIG. 2b schematically illustrates a simplified block diagram with relevant elements of another exemplary content adapting server (CAS) that operates according to another exemplary technique of the present disclosure.

The following paragraphs are related to FIG. 2a and FIG. 2b. FIG. 2a, each illustrates a block diagram with relevant elements of an exemplary embodiment of a content adapting server (CAS) 200 or 2000 that operates according to certain techniques of the present disclosure. Exemplary CAS 200 or 2000 can be installed in association with PCD 150, as unit 154 (FIG. 1) for example.

In one exemplary embodiment, CAS 200 may intercept the communication between the plurality of ST 110 and the plurality of content servers 152 (FIG. 1). CAS 200 can process surfer requests in order to track and learn about the behavior of each surfer. Based on learned information obtained from a plurality of surfers, CAS 200 can create a plurality of predictive models that correspond to given web-pages. Each predictive model can be assigned to an object that is associated with a redirecting button in a requested web-page. The exemplary CAS 200 creates the predictive models according to a single KPI.

FIG. 2b illustrates a block diagram with relevant elements of an exemplary embodiment of a content adapting server (CAS) 2000 that operates according to certain techniques of the present disclosure. The exemplary CAS 2000 creates two or more type of predictive models per each optionally objects in the relevant web-page. Each type of predictive model is associated with another type of KPI. One type of KPI can be clicking rate, other type of KPI can be conversion rate, etc. In order to eliminate redundancy of information, in the following paragraphs elements of both embodiments, CAS 200 and CAS 2000, which are similar, are marked with similar numeral and are disclosed once, in relation with FIG. 2a and CAS 200. Base on reading the description of CAS 200, an ordinary skilled person in the art is expected to understand how those similar elements operate in relation with CAS 2000.

After creating the predictive models, CAS 200 can use the models in order to determine which combination of optional objects can be associated with certain redirecting buttons in a requested web-page such that the profit of the owner of the PCD 150 is maximized. This combination of optional objects is referred to as a predictive configuration of the web-page. Markup language files, such as HTML files, are transferred from content servers 152 toward ST 110 and can be modified by CAS 200, for example, according to the predicted configuration. The profit of the owner can be measured by KPI parameter such as but not limited to: the clicking rate on an object of a delivered web-page according to the predictive configuration; the converting rate, the rate of converting a link to a deal from the total number of events of presenting the page based on the predictive configuration; the revenue rate, the average revenue that is created by presenting the predictive configuration of a certain webpage compare to other configuration of the same web-page, etc. CAS 2000 of FIG. 2b can process two or more type of predictive models simultaneously. Each type can be associated with another type of KPI or a combination of one or more KPIs.

The behavior of surfers can be monitored and learned during the ongoing operation of an exemplary CAS 200. The monitored data can be used in order to improve the predictive models.

An exemplary CAS 200 can be divided into two sections, a network interface section and a content adaptation section. The network interface section may comprise an HTTP proxy 210, a page request module (PRM) 220, an active surfer table (AST) 215, or 2150 for the example of CAS 2000, and a markup language file handler (MLFH) 230. The content adaptation section may include one or more page data collectors (PDC) 240, one or more page object selection modules (POSM) 250, and a management and prediction module (MPM) 260. CAS 2000 may include a PDC 2400 instead of PDC 240. PDC 2400 act in a similar way to PDC 240, however the collected data per web-page is organized according to the types of KPI. Further, CAS 2000 may include an AST 2150 instead of AST 215. Along the disclosure the term AST 215 may refer also to AST 2150 unless for certain cases it is written differently and the term PDC 240 may refer also to PDC 2400 unless for certain cases it is written differently. Data communication between the internal modules of CAS 200 may be implemented by using components such as, but not limited to, shared memory, buses, switches, and other components commonly known in the art that are not necessarily depicted in the drawings.

In an alternate exemplary embodiment of CAS 200 or 2000, not shown in the drawing, CAS 200 or 2000 can communicate with a website by using a certain application program interface (API). In such embodiment the surfer requests as well as the responded web pages are sent directly between the surfer and the website. The website, upon receiving a request parses the request, retrieved from the request information which is required by CAS 200 or 2000. Information such as the URL, the receiving time, the cookie, the browser type, etc. This information is sent from the website toward CAS 200 or 2000 by using the API. Then the website waits to get the instructions about the recommended configuration from CAS 200 or 2000. Upon receiving the information about the request, CAS 200 or 2000, process it, update the cookie, encode the cookie, determine which configuration is recommended and sent this data, by using the API to the website. The website in its turn, processes the received information from CAS 200 or 2000, defines the configuration of the webpage, and sends the webpage toward the requesting server.

Thus, such an exemplary embodiment of CAS 200 or 2000 may not need the HTTP proxy 210. Further, the PRM 220 and the MLFH 230 can be slightly modified to communicate with the website based on the API, processed the received information and responding to the website over the API.

Yet, in an alternate exemplary embodiment of CAS 200 or 2000, not shown in the drawing, CAS 200 or 2000 can be invoked by a link to a JavaScript (JS). In such embodiment the surfer requests as well as the responded web pages are sent directly between the surfer and the web-page. However the responded website includes one or more links. Each link requests a JS. The first link on the top of the webpage is a link to CAS 200 or 2000. In some embodiments the first link can point on a Cache Domain Network (CDN) server. The CDN server in its turn can transfer the request to the first JS to the CAS 200 or 2000. CAS 200 or 2000 can respond by sending a JS code that when it is activated by the browser at the surfer computer, is adapted to collect information that is required by the CAS 200 or 2000. Information such as the URL, the receiving time, the cookie, the browser type, etc. This information is sent by the browser running the JS from the surfer toward the CAS 200 or 2000. Upon receiving the information about the request, CAS 200 or 2000, processes it, determines a configuration of the requested web page, update the cookie, encode the cookie and send it to the JS. Updated the cookie can be done by adding information about the configuration that was sent to the user. In addition CAS 200 or 2000 determines which configuration to send to this surfer. In parallel the browser at the surfer continue parsing the web page and reaches the next link to a next JS, the browser send a request to the next JS, in response the CAS 200 or 2000 responds with the appropriate object to be presented.

Thus, the alternate exemplary embodiment of CAS 200 or 2000 the HTTP proxy 210, the PRM 220 and the MLFH 230 can be slightly modified to communicate with the surfer and process the requested JS.

An exemplary PCS 140 (FIG. 1), in addition to common elements of a typical web server, may comprise elements which are similar to the elements of CAS 200. For example, SIU 143 (FIG. 1) may comprise elements having functionality similar to an HTTP proxy 210, a PRM 220, an AST 215 and an MLFH 230. An exemplary CAM 146 (FIG. 1) may comprise elements that are similar to those of a PDC 240 or PDC 2400, a POSM 250, and an MPM 260. Therefore, the operation of an exemplary PCS 140 may be learned by one skilled in the art from the detailed description of a CAS 154 and, to avoid unnecessary redundancy, will not be specifically described herein.

In exemplary embodiments of the present disclosure, in which the communication over network 120 is based on IP, HTTP proxy 210 may be adapted to handle the first layers of the OSI (open system interconnection) seven layer communication stack. The layers may be the Physical Layer, Data Link Layer, transport Layer (the TCP stack), and the Network Layer. In exemplary embodiments of the present disclosure, in which the CAS 200 is transparent to the ST 110 (FIG. 1) as well as to the content servers 152 (FIG. 1), the HTTP proxy 210 may behave as a transparent proxy and may use a redirector. The transparent HTTP proxy 210 may be adapted to obtain packets traveling from/to the plurality of ST 110 (FIG. 1) and to/from the plurality of the content servers 152 of the domain 150. The header of the packets may be processed in order to determine how to route the received packets. HTTP requests for web-pages may be routed toward PRM 220 and responses that include web-pages in the form of a markup language file may be routed toward MLFH 230. Other packet types may be transferred toward their destination in an "as is" form.

Data coming from the internal module of CAS 200 is transferred via HTTP proxy 210 toward their destination. For example, HTTP requests for web-pages, after being processed by PRM 220, are transferred toward the appropriate content server 152 (FIG. 1). HTML files, after being handled by MLFH 230, are transferred toward the appropriate ST 110 via HTTP proxy 210 to network 120.

Exemplary PRM 220 may comprise a bank of domain counters 222, a cookie decompression and update module (CDUM) 224 and a timer 226. PRM 220 may receive, from HTTP proxy 210, requests for web-pages that are targeted toward content servers 152 (FIG. 1). The requests are processed in order to collect information that may be used for preparing predictive models, monitoring the predictive models, or retrieving predictive factors to be placed in a predictive model that is used for defining the configuration of the requested web-page. After processing the request, the processed request is transferred toward the content servers 152 via HTTP proxy 210. The collected information may be written in an entry of AST 215 that is associated with the requester of the web-page.

The collected information may include associated information such as, but not limited to, the day and the time the request for the web-page was received, the IP address or/and IP port from which the request was sent, the type and the version of the browser application used for requesting the web-page, and the URL used by a surfer for requesting the web-page with the parameters that are attached to the URL.

In addition, the retrieved information may include behavioral information. The behavioral information may be statistical information that is managed by CAS 200. It may be divided into a requester's related behavioral information and a domain's related information. The requester's related behavioral information may include timers indicating one or more previous visits by the requester to the domain PCD 150 (FIG. 1), the last time that the requester requested a certain web-page, the number of the requester's visits in the relevant PCD 150, etc. In some exemplary embodiments of the present disclosure, the requester's related behavioral information may include some attributes of the relevant surfer such as gender, age, income, etc. The requester's behavioral information may be retrieved from the cookie that is associated with the request after be decompressed by CDUM 224.

The domain related behavioral information may include the number of requests for a certain web-page from the domain and the time of the last request for this page, the number of times a certain offer (content object) was selected, the last time that it was selected, etc. Some of the exemplary counting values may be time dependent such that the value of the counter may decrease over time. The domain related behavioral information may be counted and recorded in a plurality of domain counters 222 by PRM 220. In some exemplary embodiments of the present disclosure, behavioral information may be updated and written by CDUM 224 within a cookie that is related to PCD 150 (FIG. 1).

The counters may be incremented by PRM 220 each time a request for an event that is related to the counter is identified by PRM 220. Incrementing the value of a counter may be time dependent such that the last value may decrease according to the time difference between the last event and the current event. Then the decreased value is incremented by one and the time of the current event is recorded. Fading the value of the counters may be done by using an exponential formula using a half-life-time constant, for example. The half-life-time constant may have a configurable value or an adaptive one. The half-life-time constant may be one property in a set of properties. It should be understood that the fading algorithm described above is offered herein for exemplary purposes only and should not be interpreted to limit the present scope. Those skilled in the art will appreciate that other exemplary embodiments of the present disclosure may use other fading algorithms for adjustment of a counter.

PRM 220 may retrieve an associated cookie from the request, if one exists. In one exemplary embodiment, in which the cookie is compressed, the cookie is transferred to CDUM 224. Those skilled in the art will appreciate that different methods may be used for compressing/decompressing information written in a cookie. An exemplary compression method may express the values of the counters using a subset of ASCII based characters in lieu of decimal based characters. Other embodiments may express the counters by using logarithmic numbers (integer and mantissa), for example. Still other embodiments may use the combination of the two.

The decompressed cookie is parsed by CDUM 224 to identify a requester's ID wherein a requester's ID is an ID number that has been allocated to the requester by PRM 220. The allocation of the ID can be done in the first request that was received from the relevant surfer in the current visit of the website. An exemplary ID may be defined randomly from a large number of alternatives. It may be a 32 bit, 64 or 128 bit number, for example. If a requester's ID exists in the cookie, then the AST 215 is searched for a section in AST 215 that is associated with the requester's ID. In some embodiments an ID can be allocated to a surfer at the start of the initial visit to the site. This ID can be kept in the cookie as long as the cookie exists. In such embodiment, a visit-ID can be added as a supplement to the surfer ID. If a section exists, then a new entry is allocated in the relevant section of AST 215 for recording the associated and behavioral information that is relevant to the current obtained requester's request. If a section in AST 215 was not found, or if an ID was not found in the cookie, a new ID may be allocated for the given requester. In some exemplary embodiments of the present disclosure, a field in the cookie may point to a file stored at the server that includes behavioral information associated with a surfer.

If a new requester's ID is allocated to the requester, then a new section in AST 215 may be allocated by PRM 210 to be associated with the new requester's ID and a new entry in the section is allocated for storage of the information that is related to the current request for a web-page.

Timer 226 may be used while managing behavioral information of a user. It may be used for timing indication on previous activities such as previous visiting, previous purchasing, etc., which were recorded in the cookie. Further, the value of timer 226 may be used in the process of time fading of the counters. These time records can be used as predictive factors. The clock of timer 226 may range from a few seconds to a few minutes, for example. Timer 226 may be a cyclic counter having a cycle of six months, for example.

Exemplary AST 215 may be a table, which is stored in a random access memory (RAM) that can be shared by the internal modules of CAS 200, for example. AST 215 may be divided into a plurality of sections such that each section is associated with a requester's ID and represents an active surfer. Further, each section may include a plurality of entries. Each entry may be associated with a request of a surfer from the website PCD 150 (FIG. 1). Each entry may have a plurality of fields for storing information that may be used in the prediction process.

Each entry may include fields such as, but not limited to, the receipt time of the relevant request, associated information retrieved from the relevant request, etc. Exemplary associated information may be such as, but not limited to, the type and the version of the browser application used for requesting the web-page or the URL used by a surfer for requesting the web-page along with the parameters that are attached to the URL.

In some embodiments of the present disclosure, some the URLs may include content grouping information such as, but not limited to, attributes of the content objects. Exemplary attributes may be the cost of a product, the brand of a product, vacation information, etc.

Other fields in an entry of AST 215 may store updated requester related behavioral information. Still other fields may store domain related behavioral information that was valid when the previous web-page was sent from the domain to the requester. Yet another group of fields may store management information that is related to the operation of CAS 200 and indicate whether the current section is associated with a random surfer or a personalized surfer, for example. A common surfer may be a surfer for whom the object was presented as a result of using the object's prediction module. A personalized surfer can be referred also as common surfer. A random surfer may be a surfer for whom the object was selected randomly to be presented. A random surfer can be referred also as a control surfer. In some embodiments a random surfer can be defined per a slot, or one or more slots, in a certain web-page or in one or more web-pages for a current visit.

Some embodiments of AST 215 the entries may comprise also fields for storing information related to a current visit. Such field can store the starting time of the visit, the number of times that the URL associated with the entry was requested during a certain visit, etc.

In some embodiments of CAS 2000 the AST 2150 may have additional fields. These additional fields can be used for storing data that is related to different KPI. In such embodiments a feedback from the content server or a managing server of the domain may be received. The feedback information may include information regarding a purchasing decision, which was made in association with the URL of the entry. In some cases also the created revenue as well as an identification of the order of the purchase is delivered with the feedback and is stored at the relevant field of the entry, etc.

New sections and new entries in AST 215 are allocated by PRM 210. Different modules of CAS 200 may read and write information from/to the AST 215, as disclosed below relative to the description of the other modules of CAS 200. Once every configurable period, AST 215 may be scanned by MPM 260 looking for one or more inactive sections of AST 215. Exemplary periods may be in a range from a few seconds to a few tens of minutes. An inactive section is a section that is associated with a visit of a surfer in the web site. The decision when the visit is terminated is when the time period between the last received request (the time associated with the last entry of the section) is longer than a certain configurable value. Entries of inactive sections of AST 215 may be released after the stored data in the entries of the visit (section) is copied to the appropriate PDC 240. The configurable value of the time period can be between tens of minutes to few hours, between 30 minutes to an hour for example. A common value is 30 minutes from the last activity in the site.

After allocating an entry for the current request in the appropriate section of AST 215, PRM 210 may write the retrieved associated information in the appropriate fields of the entry. A requester's related behavioral information may be retrieved from the decompressed cookie. The appropriate counters of the requester's retrieved related behavioral information may be updated. The received value of the appropriate counters may be manipulated to include the time affect of the period from the last visit (i.e., the fading affect). The time adapted value may be incremented by one, counting the current visit. The updated value may be stored in the relevant field of the entry. In some embodiment, in which the new entry includes a field for storing the number of times that this web-page has been requested during the new visit, the value one (reflecting the first request) is stored in that field.

PRM 210 may determine whether a requester that was assigned a new ID value can be designated as either a "control" or "common" requester. The decision may be based on configurable parameters, which may depend on the mode of operation of CAS 200, such as, for example, whether CAS 200 is operating in a "learning" mode or an "ongoing" mode. The decision on how to label the requester may be written in the appropriate field in the associated entry or section. This configurable parameter can be one of the parameters in a set of properties.

In the case that the requester has a valid ID, the URL associated with the request is parsed in order to determine which web-page was previously delivered to the requester. The determination of the previously delivered web-page may indicate the stimulus that prompted the user to make the current request. Once determined, the requester's section in AST 215 is searched for an entry that is associated with a previously delivered page (PDP). An entry in which the recommended combination includes a link to the current received request, for example. If such an entry is found, then an indication of "success" is written in association with the combination of the requested object and the link design (i.e., slot or redirection button). In other exemplary embodiment of a CAS, information on a PDP can be received from information stored in the cookie. Alternatively the information can be received from the web-site by using an API. The success indication may be marked in a response field that is associated with the combination object and slot of the entry that includes the PDP that prompted the current requested object. While processing the information that is stored in the AST, object and slot combinations that do not have a success indication may be marked as "failures."

After processing the request, PRM 210 may replace the cookie, or write a new cookie if the request does not already include a cookie, with updated behavioral information. Subsequently, the request with the new cookie may be transferred to one of the content servers 152 (FIG. 1) via HTTP proxy 210. More information on the operation of PRM 210 is disclosed below in conjunction with FIG. 4.

An exemplary MLFH 230 may comprise a cookie update and compression module (CCM) 232. MLFH 230 receives, via HTTP proxy 210, markup language (ML) files such as HTML files, for example, that represent the requested web-pages sent from content servers 152 toward ST 110 (FIG. 1). Each received ML file is parsed and the requester's ID retrieved from the cookie. In addition, the web-page ID may be defined. Based on the requester's ID, the relevant entry in the requester section of AST 215 is retrieved and parsed and the requester's assigned type ("control" or "common") is determined.

For a "control" requester, based on the web-page ID, MLFH 230 may randomly configure the received ML file. The configuration may include the set of links (i.e., slots or redirection buttons) in the web-page and an assigned object for each one of the links in the set. The assigned object may be selected randomly from a group of objects that may be presented on the requested web-page, as determined by ID of the web-page. In the case that the requester is not a "control" requester, the location of the entry in AST 215 that is relevant to the current page is transferred to one of the POSM 250 associated with the page ID of the current received ML file. In response, POSM 250 may initiate a selection process for determining the predicted configuration (object and slot) of the received ML file. As an example, the predicted configuration may be the configuration which maximizes the predicted expected value obtained by presenting the particular configuration.

In some embodiments the expected value can be a KPI, which reflects the KPI of the relevant requested web-page taking into consideration the visit of a surfer. Yet in some embodiments of CAS 2000, POSM 250 may use different types of predictive models per different requested web-pages. The type of the predictive models can be based on the type of the KPI according to which the predictive model was built to maximize that KPI. In some embodiments of CAS 2000, in different period of time the POSM 250 may automatically determine which type of predictive model to use for the same requested web-page.

When MLFH 230 has defined a configuration (randomly selected or predicted), it may manipulate the received ML file in order to reflect the configuration. Per each set (object and slot), the URL of the selected object may be assigned to the relevant link (slot) in the ML file. In addition, the entry in AST 215 may be updated to include the configuration of the page. Fields of the relevant entry in AST 215 that need to be included in an updated cookie, such as, but not limited to requester ID, updated page ID counters, and timers, are retrieved from AST 215 by MLFH 230. Some of the cookie fields are compressed by CCM 232, according to one of the compression methodologies previously described. The compressed cookie is added to the header of the modified ML file. The modified ML file with the new cookie may then be transferred toward the requesting ST 110 (FIG. 1) via HTTP proxy 210. More information on the operation of MLFH 230 is disclosed below in conjunction with FIG. 6.

Each PDC 240 is associated with a web-page that is stored in one of the content servers 152 (FIG. 1) and includes one or more links (slots) as well as a group or set of optional objects that may be assigned to those slots. Exemplary PDC 240 stores and manage the sampled data that is needed for calculating predictive models for objects that are associated with the given web-page. An exemplary PDC 240 may comprise an event logger (ELOG) 242, an observation manager module (OMM) 246, and/or an objects historical database (OHDB) 248 that may include a plurality of database couples 249$as$ & $af$ to 249$ns$ & $nf$. Each couple is associated with an object (objects $a$-$n$ that may be assigned to the page). Each couple of databases, one database, 249$af$ for example, stores records of events in which a link to the relevant object (object a in this example) appeared in a delivered web-page but the object was not selected. The second DB 249$as$ stores records of events in which the relevant object (object a in this example) was selected, for example.

In some embodiments of CAS 2000 the PDC 2450 may comprise two or more KPI-objects-historical DB (KPIOHDB) 2480$a$-$n$. Each of that two or more KPIOHDB 2480$a$-$n$ can be used for storing data that is related to a different KPI. In such embodiments each KPIOHDB 2480$a$-$n$ may include a plurality of database couples 249$kas$ & $kaf$ to 249$kns$ & $knf$ Each couple is associated with an object (objects a-n that may be assigned to the page) and a type of KPI. Each couple of databases, one database, 249$kaf$ for example, stores records of events in which a link to the relevant object appeared in a delivered web-page but the KPI related to the DB and the object was not achieved. The second DB 249$kas$ stores records of events in which the relevant object was selected and the KPI related to the object and the DB was achieved, for example.

In some exemplary embodiments the number of DB per object can be other than two DB (success; fail). For example, when a KPI has several values, zero dollars, one to ten dollars, 10 to hundreds dollars etc. In such a case three or more DBs can be used, one per each range of revenue.

From time to time, one or more entries of an inactive section may be retrieved from AST 215 by MPM 260. These entries may be sorted according to the web-pages that are associated with the entry and copied to ELOG 242 of the relevant PDC 240. Wherein each PDC 240 is associated with one web-page of the one or more web-pages, each one of these entries, in AST 215, may be transferred as a record into ELOG 242 and the inactive entries released from AST 215. In some embodiments copying the inactive session can be implemented when it is determined that the visit which is associated with the section was terminated.

OMM 246 manages the stored records that are related to its associated web-page. In order to reduce the cost and the complexity of the PDC 240 storage volume, the storage volume may be divided into two types, short term (ELOG 242) and long term (the bank of databases OHDB 248). Periodically, once in a configurable transfer period (TP), an hour for example, the records in the ELOG 248 may be copied into appropriate ODB 249 and then released. The TP can be a parameter in a set of properties, for example.

In one embodiment of PDC 240, OHDB 248 is managed in a cyclic mode. The volume of each ODB 249 is divided into a plurality of sub-ODB. Each sub-ODB is associated with a transfer period. A transfer period, for example, may be the time interval between transferring the data of ELOG 242 to OHDB 248 and the number of sub-ODB may be a configurable number that depends on the volume of each ODB 249 and the number of records for sub-ODB that are needed. The number of records in sub-OBD may vary according to the mode of operation, i.e. "learning" or "ongoing" mode, for example.

It is conceivable that the number of records copied from ELOG to a sub-ODB may be larger than the size of the sub-ODB. In such a scenario, dropping of records may be required. It is anticipated that in order to keep the integrity of the sampled data when record dropping is required, the sample ratio of success-records copied to ODB 249s and the sample ratio of the fail-records (not having a success indication) copied into ODB 249f must be taken into consideration while preparing the predictive model. More information on the operation of PDC 240 is disclosed below in conjunction with FIG. 5.

Each POSM 250 is associated with a web-page that is stored in one of the content servers 152 (FIG. 1) and includes one or more links (slots) and a group of optional objects that may be assigned to those slots. In an exemplary embodiment of the present disclosure, POSM 250 may receive, from MLFH 230, a pointer to an entry in AST 215 that is associated with a markup language file (HTML, for example) currently processed by MLFH 230. After processing the information that is retrieved from the relevant entry in AST 215, POSM 250 may deliver a predictive configuration, which is a set of pairs, each pair comprised of a slot and an object, to be embedded in the markup language file that is currently handled. An exemplary POSM 250 may comprise a predictive factors buffer (PFB) 253, an object selecting processor (OSP) 255 and a bank of current predictive models that includes a plurality of object's predictive model (OPM) 257a to 257k. Each OPM 257 is associated with an object that may be presented on the currently processed HTML file.

In some embodiments of CAS 2000 the bank of current predictive models includes a plurality of object's predictive model (OPM) 257a to 257k. Each object current predictive OPM 257 is associated with an object from the 'a' to 'k' objects of the page and the KPI according which the model was created. This model can be replaced automatically when a model which is based on other type of KPI is ready.

A plurality of predictive factors may be retrieved by OSP 255 from the relevant entry in AST 215 and stored in PFB 253. Different methods may be used for determining which configuration of a delivered web-page maximizes the expected predicted value obtained by presenting the configuration. In one exemplary method for defining the predictive configuration, each one of the OPM 257a-k may be processed either singularly or in parallel. Per each OPM 257a-k, one or more relevant predictive factors are copied from PFB 253 into the relevant location in OPM 257 and the predictive value of the object, as well as the predictive value of the configuration (set of objects and slots), is calculated and written in a table of prediction values. After calculating the predictive value of a first object and the recommended configuration of the page in view of the first object, OSP 255 may repeat the process for the remaining one or more objects.

After calculating the predictive values and the configuration per each object, OSP 255 may scan the table of prediction values in order to determine which web-page configuration (set of slots and objects) without conflicts has the highest probability of being selected by a surfer. The identified configuration may be stored in the relevant entry of AST 215 and indication that a selection was made may be sent to MLFH 230.

An alternative embodiment of OSP may use another exemplary method, such as exhausting search, for defining the predictive configuration for the requested web-page. In such an embodiment, the table of prediction values may include an entry per each possible configuration (permutation) of the web-page. Each entry in the table conceivable may have a plurality of fields wherein each field may be associated with an optional slot. Per each cell (a junction between a row and a column in the table), the OPM 257 of the object that is associated with the slot may be fetched and calculated in view of the other configuration pairs of the web-page. The predictive value of the configuration of the web-page may be calculated as the average of the predictive value of each cell in the row such that the configuration with the highest value may be selected as the predictive configuration. More information on the operation of POSM 250 is disclosed below in conjunction with FIG. 7.

MPM 260 manages the operation of CAS 200. It may comprise a prediction model builder (PMB) 262, a manager module 264 and a predictive model monitoring module (PMM) 266. Exemplary manager 264 may communicate with the administrator of PCD 150 (FIG. 1) in order to collect information on the various web-pages such as, but not limited to, which optional objects may be associated with a web-page, which slots the optional objects may be assigned, the value of each object to the owner of the content server, the time of the day in which an object may be presented, etc.

Among other tasks, manager module 264 may define the operation mode of CAS 200. It may determine whether to work in a learning (training) mode or in ongoing mode, for example. In some embodiments the operation mode can be defined per a certain web-page. Yet in alternate embodiments, the operation mode can be defined per web-page and per KPI. Further, manager module 264 may get monitoring reports from PMM 266 and generate a decision as to whether the current predictive models are valid, need tuning or need replacing. Manager module 264 may further communicate with the administrator of PCD 150 (FIG. 1) in order to deliver reports or gather information on new pages, expired pages, etc.

On a configurable schedule, manager module 264 may scan the AST 215 and identify any inactive sections. An exemplary scanning period may be in the range of few minutes to a few hours. An inactive section is a section that the time period between the last received request (the time associated with the last entry of the section) and the scanning time is longer than a certain configurable value. Manger module 264 may sort the entries of each inactive section according to their associated web-page. Each identified entry in the inactive section may be copied into the ELOG 242 that is associated with the PDC 240 assigned to the specific web-page. After the data of the inactive entries of AST 215 has been copied, the inactive entries may be released. More information on the operation of Manager module 264 is disclosed below in conjunction with FIGS. 3A & 3B.

An exemplary PMB 262 may be operable to create a plurality of predictive models wherein each predictive model may be associated with an object that may be presented in a certain web-page. In embodiments of CAS 2000 each of the predictive models may be associated with an object that may be presented in a certain web-page and a KPI that is associated to that model and that object. In some embodiments of CAS 200 or 2000, when the visit is considered while preparing a predictive model, the predictive model depends also on the number of times the relevant web-pages was requested during a certain visit.

A predictive model may include one or more predictive formulas. In order to calculate a predictive formula, an exemplary PMB 262 may use a known predictive algorithm such as, but not limited to, logistic regression, linear regression, decision tree analysis, etc. Those and others predictive algorithm are well known to a skilled person in the art and will not be further described. Further, some exemplary embodiments of PMB 262 may use stepwise methods while calculating the predictive formula. An exemplary predictive model may include one or more predictive factors wherein each set of values of the predictive factor may be associated with a coefficient in a predictive formula. Exemplary value sets may be a list of values or a range values. The coefficient may represent the effect of a predictive factor on the prediction that the relevant content object will be selected by a surfer. Exemplary predictive factors may be such as, but not limited to, the day in the week, the hour, the browser type, the number of visits to the site, the content object that is presented in another selecting button in the same web-page, the time from the last visit, a surfer's attribute, a content object attribute, etc. The different predictive factors can be processed by protocols such as IP protocol, text protocols, and time protocols. Some of the predictive factors can include set of words, such as search words, etc.

PMB 262 may use one or more sets of properties which can be used during the preparation of the predictive model. Each set of properties may be composed of a set of parameters that can be used while preparing a prediction model. An exemplary parameter may be an "aging" parameter that assigns a weight to an entry based on its age. Other parameters may define the minimum number of appearances required for a predictive factor to be considered relevant. Another parameter may define the minimum predictive score value required for a predictive model to be processed further, and so on.

The process of preparing an object's prediction model may include organizing the raw data from success and fail ODB 249 into an object's table. Each entry from the ODBs 249Ns & 249Nf is copied into a row (record) in the object's table. The rows are sorted by time, regardless of success indication. Each column in the object's table may be associated with a parameter of the record, which is stored in the row. Exemplary columns may be the representative weight of the record (the weight may reflect the relative dropping value of the ODB from which the record was copied), the result, success or failure designation, or various predictive factors that are stored in the relevant record. Exemplary predictive factors may include relevant URL keys that were embedded within the associated information that was stored in the record wherein some of the URL keys may include attributes of the requested web-page such as behavioral information values In some embodiments, the cookie may include one or more attributes of a surfer and those attributes may be associated with certain columns in the object's table. The object's table may be divided into a validation table and a training table. The training table may be referred as an analyzing table.

After organizing the object's table, a bin creating process may be initiated. A bin may be a set of values of a certain predictive factor that differs from the other sets of values, of the predictive factor, by a certain variance in prediction efficiency. The variance can be an explained variance and can represent a significant value. When the predictive factor is nominally scaled, then a bin may be a list of names. When the predictive factor is ordinarily scaled, then the set of values may be an interval of values. The explained variance threshold and the significance desired may be parameters in the set of properties. The significance can be based on difference from an average value, for example. The overall prediction efficiency of a bin may be calculated as the percentage of success compare to the total number of records in the training table that belong to the same set (the same bin), while taking into account the representative weight of the records when the bin is true and when the bin is false.

An exemplary bin may be the time interval between 8:00 am to 2:00 pm, for example. A bin table is created based on the training table by dividing each column of the training table into one or more bins (each bin represented by a column in the bin table). Each cell in the bin's table may represent a true or false value. The value may be "true" if the value in the relevant cell in the training table is in the bin's interval and false if the value in the relevant cell in the training table is not in the bin's interval.

In addition, a legend may be associated with the bin's table. The legend may define the predictive factor from which the bin was processed, the interval that the bin includes and the predictive efficiency of the bin. The process of creating a bin's table is repeated per each set of properties.

The bin's table and its legend may be loaded into a predictive model processor. The predictive model processor crunches the numbers according to a well known predictive algorithm. Exemplary predictive algorithm can be such as, but not limited to, logistic regression, linear regression, decision tree analysis, etc. Some exemplary embodiments of the present disclosure can use linear or logistic regression, with or without stepwise methods, while calculating the predictive formula. The calculated predictive model that was created based on the first set of properties is stored. PMB 262 may repeat the actions of creating a second bin's table and a second predictive model based on the second set of properties. The second predictive model may be stored as well and PMB 262 may continue the process for the remaining property sets. An exemplary PMB 262 that is installed in an exemplary CAS 2000 may repeat the actions of creating a second bin's table and a second predictive model based on the second KPI. The second predictive model may be stored as well and PMB 262 may continue the process for the remaining KPIs.

When a set of predictive models is calculated, one per each set of properties, each one of the predictive models is applied on the records of the validation table. The results of the predictions are compared with the actual recorded responses of surfers and a prediction score is granted to the predictive model. An exemplary prediction score may be the percentage of the successful predictions, when compared to the actual recorded responses, out of the total records in the validation table. The group of calculated predictive models, one per each set of properties, and or KPIs may be sorted according to the respective prediction scores. The models having a score below a predetermined minimum (one of the parameters in a set of properties) may be ignored. Then an object prediction model is calculated as a weighted average of the predictive models having prediction scores above the predetermined minimum.

In order to reduce the number of ignored prediction models, another exemplary PMB 262 may further process the comparison between the prediction results of the different models in order to adjust the associated property sets. For example, if one or more predictive models have a prediction score below the limit and use property sets in which the half-life time constant has a large value, the value may be adjusted to a smaller one, for example.

PMB 262 may repeat the above described process for each one of the possible objects in a certain web-page and then it may repeat this process for each web-page. In an alternate embodiment of the present disclosure, MPM 260 may comprise a plurality of PMB 262. Each PMB 262 may be associated with a web-page, for example. Embodiments of PMB 262 that are embedded within exemplary CAS 2000 can repeat those actions for creating predictive models per each KPI. More information on the operation of PMB 262 is disclosed below in conjunction with FIGS. 9A & 9B.

An exemplary PMM 266 monitors the plurality of predictive models wherein each predictive model may be associated with an object that can be presented in a certain web-page. PMM 266 may be adapted to monitor the performance of each one of the object's prediction models that are currently used by CAS 200. Per each web-page, an exemplary PMM 266 may periodically monitor the ELOG 242 of the PDC 240 that is assigned to the current monitored web-page. The period between consecutive monitoring may be a configurable period that depends on the mode of operation of CAS 200. In "learning" mode (training mode), the configurable time period, Tmt, may range from a few minutes to tens of minutes. During "ongoing" mode, the configurable period, Tmo, may be tens of minutes to a few hours, for example.

An exemplary PMM 266 that is installed in an exemplary CAS 2000 may monitors the plurality of predictive models wherein each predictive model may be associated with an object that can be presented in a certain web-page and one type of KPIs.

Per each object that may be associated with the web-page, PMM 266 may scan the records in ELOG 242 looking for records in which a delivered web-page presents the relevant object to be selected by a surfer. Each found record may be subsequently parsed in order to determine whether the record was executed by a "common" surfer (a surfer for whom the object was presented as a result of using the object's prediction module) or a "control" surfer (a surfer for whom the object was selected randomly to be presented). The record may be further parsed in order to determine the response of a surfer, whether the object was selected by a surfer (success) or not (failure). At the end of the process, PMM 266 may calculate two probability values per each object's prediction model, i.e. the probability of success of a "common" surfer and/or the probability of success of a "control" surfer. The two probability values per each object's prediction model in the web-page may be written in a web-page comparison table. The web-page comparison table may be transferred to the manager module 264 and/or PMB 262. After processing the records stored in ELOG 242, an indication may be sent to OMM 246 of the same PDC 240 informing the OMM 246 that it may initiate the process of transferring the information from ELOG 242 to OHDB 248.

An exemplary PMM 266 that is installed in an exemplary CAS 2000 may repeat the actions of monitoring a predictive model per each KPI. In such embodiment the web-page comparison table may be associated with a web page and one of the KPIs.

At this point, PMM 266 may repeat the process for the next web-page and continue in a loop. In an alternate embodiment of the present disclosure, MPM 260 may comprise a plurality of PMM 266 wherein each PMM 266 may be assigned to a web-page. More information on the operation of PMM 266 is disclosed below in conjunction with FIG. 8.

In addition to the above mentioned elements, exemplary embodiments of CAS 200 or CAS 2000 may comprise a non-transitory storage medium readable by a processor and storing instructions for execution by the processor for performing the capabilities of the exemplary CAS 200 or CAS 2000. The storage medium can be included as a part of a computer system of CAS 200 or CAS 2000 or sold separately.

The non-transitory storage medium can be an electronic, magnetic, optical, electromagnetic, infrared, or semiconductor system (or apparatus or device) or a propagation medium. Examples of a computer readable medium include a semiconductor or solid state memory, magnetic tape, a removable computer diskette, a random access memory (RAM), a read-only memory (ROM), a rigid magnetic disk and an optical disk. Examples of optical disks include compact disk-read only memory (CD-ROM), compact disk-read/write (CD-R/W) and DVD, etc.

Figure 3A:
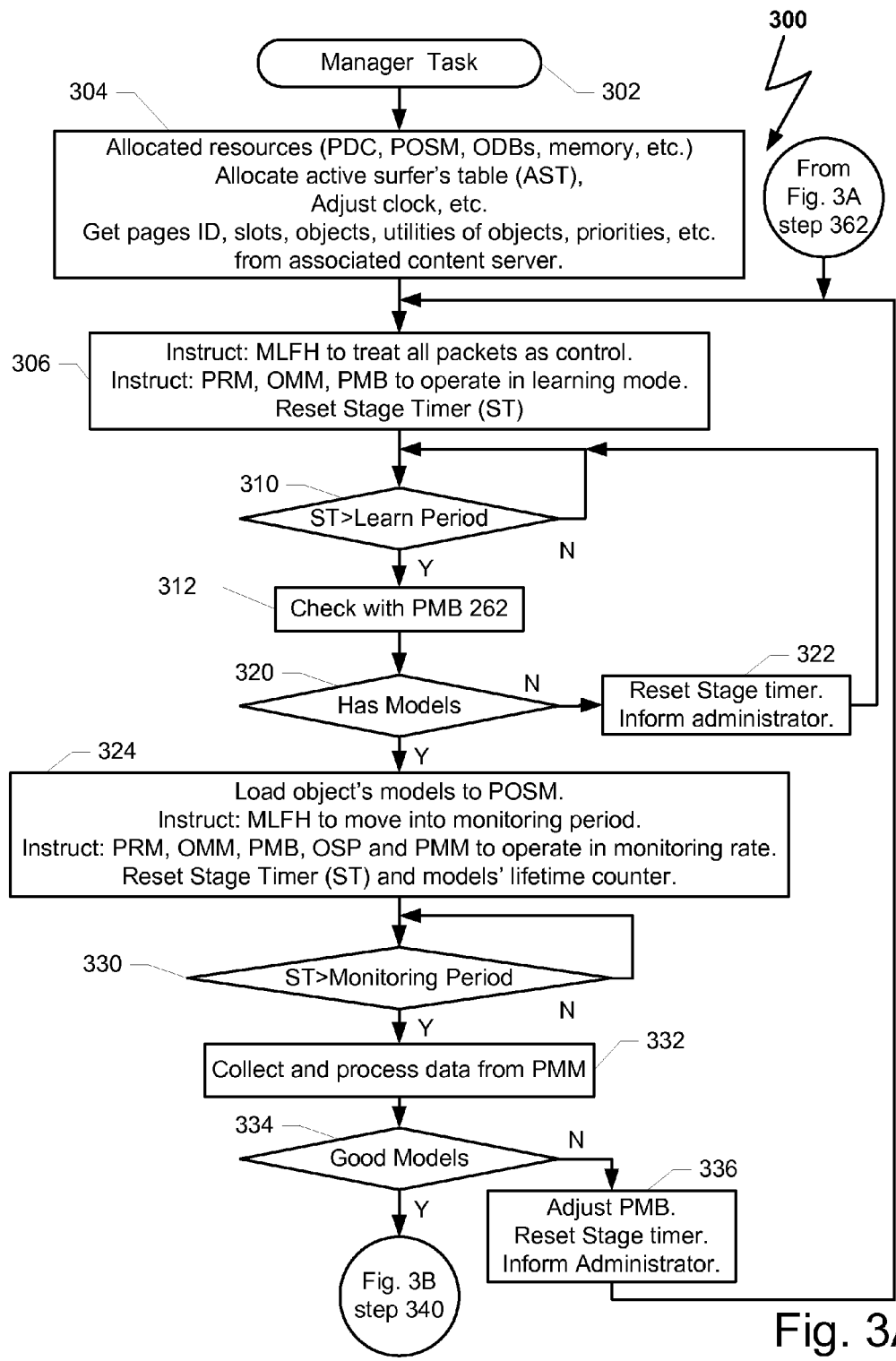
FIGS. 3A & 3B schematically illustrate a flowchart showing relevant processes of an exemplary embodiment of a management method.
Figure 3B:
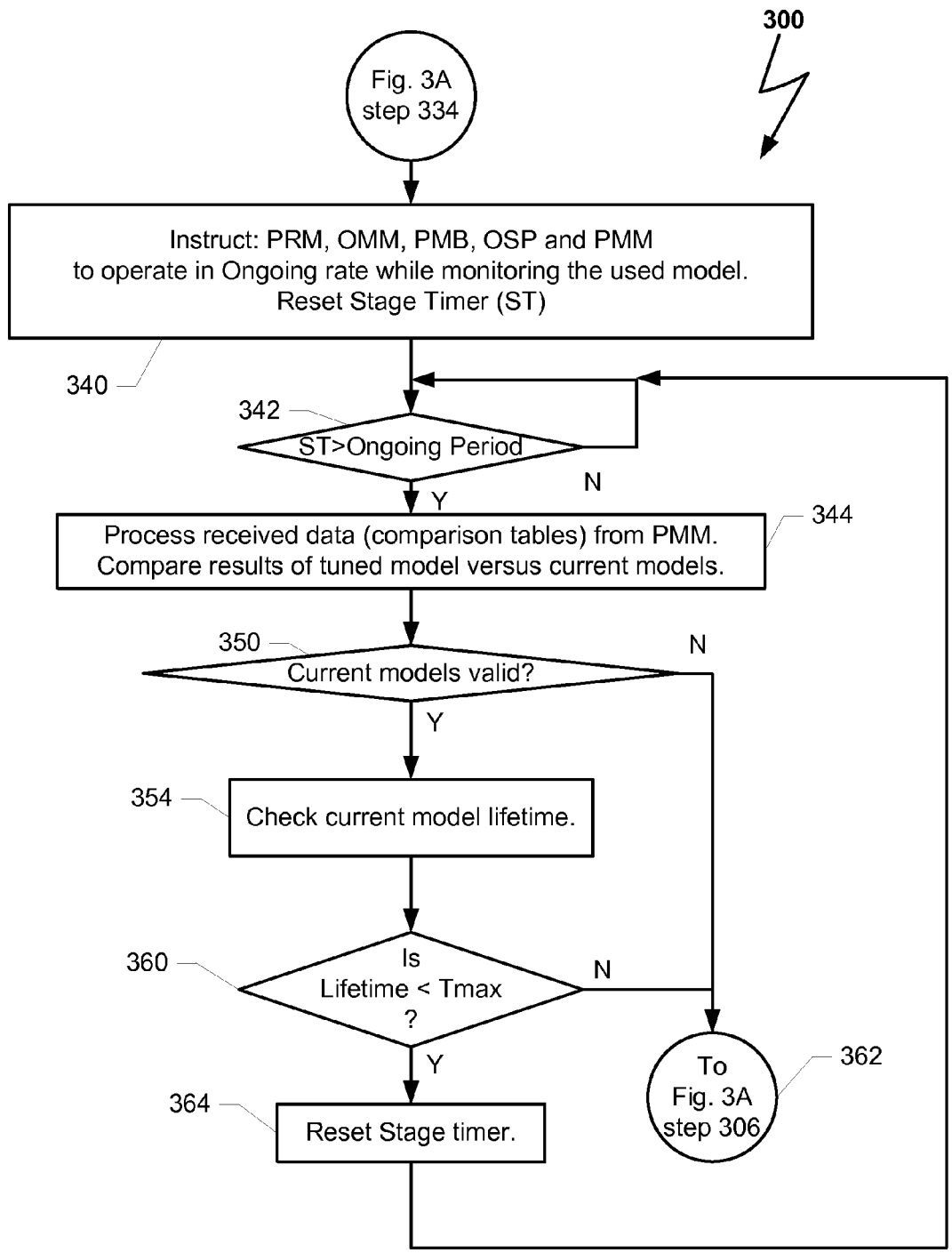

FIGS. 3A & 3B depict a flowchart illustrating relevant processes of an exemplary method 300 used by some embodiments of the present disclosure for managing the operation of CAS 200 (FIG. 2a) or CAS 2000 (FIG. 2b). Method 300 may be implemented within the manager module 264 (FIG. 2), for example. In order to eliminate redundancy of information, in the following paragraphs actions of method 300 that implemented in CAS 200 or CAS 2000, which are similar, are disclosed once, in relation with CAS 200. Base on reading the description of method 300 for CAS 200, an ordinary skilled person in the art is expected to understand how those similar actions are operating in relation with CAS 2000. In some actions of CAS 2000 that may operate in a different way or may need additional information, this information is disclosed in addition to the information related to CAS 200.

Method 300 may be initialized 302 upon "power on" status or after resetting the CAS 200 and may run in a loop as long as the CAS 200 is active. During the initialization process 302 & 304, the manager 264 may be loaded with information such as information on relevant resources that stand for the internal modules of CAS 200. Accordingly, the manager 264 may allocate resources to the other modules such as PRM 220, PDC 240, POSM 250, etc. The AST 215 (FIG. 2) may be created and introduced to the appropriate modules. The clock of CAS 200 may be adjusted. Further, the clock may use a proprietary format. For example, the clock may count minutes in continuous mode from 00:00 on the first day of January until 23:59 of December 31. In alternate embodiments, the clock may be reset every six months, etc.

When an embodiment of method 300 is implemented in CAS 2000, the loaded information may comprise information regarding two or more KPI. This information can include one or more set of parameters per each KPI. Parameters such as value of each KPI for each object, "aging" for each KPI, per each KPI the minimum number of appearances required for a predictive factor to be considered relevant. Another parameter may define per each KPI the minimum predictive score value required for a predictive model to be processed further, information when to switch from a predictive model based on one type of KPI to a predictive model based on another KPI which is more important to the website owner, etc. Accordingly, the manager 264 may allocate resources to the other modules such as PRM 220, PDC 2400, POSM 250, etc. The AST 2150 (FIG. 2b) may be created and introduced to the appropriate modules.

After setting the internal models, the manager 264 may get 304 updated information from the content servers 152 and/or the administrator of PCD 150 (FIG. 1). Information such as, but not limited to, information related to a web-page, optional objects that may be presented, optional slots (redirection buttons or links), priorities and the value (KPI) of each object, etc. When method 300 is implemented by CAS 2000, the information may include the value of each type of KPI of a certain object.

At the end of the initiation process, MLFH 230 (FIG. 2) may be instructed 306 to treat all responses (ML files) as if each was associated with a "control" surfer. In response, MLFH 230 may randomly select objects to be placed and presented in a requested web-page. Other modules such as PRM 220, OMM 246 and PMM 266 (FIG. 2) may be instructed to work in a "learning" or "training" mode. During the learning mode, PRM 220 may mark all surfers as "control" surfers. Further, OMM 246 and PMM 266 may operate at higher rates than when the embodiment is in "ongoing" mode. Stage Timer (ST) is reset and used to define the time limit of the current mode of operation.

At such point, method 300 may wait 310 until the value of ST reaches a configurable value predefined to correspond to the "Learning Period". The "Learning Period" may be in the range of few tens of minutes to a few days, depending on the volume of requests sent toward PCD 150 (FIG. 1), for example. If 310 the ST reached the value of the "Learning Period," then PMB 262 (FIG. 2) may be checked 312 in order to determine if 320 it was successful in preparing a set of predictive models for objects. If the set is not ready, method 300 may inform 322 an administrator of PCD 150 (FIG. 1) about the number of cycles of the "Learning Period" that were completed without success. In such a case, ST may be reset and method 300 looped to action 310.

In some embodiments of CAS 2000, in which method 300 is implemented for two or more KPIs, a sub-process that includes actions 306 (FIG. 3*a*) to 364 (FIG. 3*b*) can be executed in parallel in several instances, each such a sub-process can be associated with a type of KPI. Each sub-process may have a separate ST and a separate time limiter per each KPI and each operating mode (learn period, monitor period and ongoing period.

If 320 a set of object's predictive models is ready, then the set is loaded 324 into POSM 250. Other internal modules such as PRM 220, MLFH 230, OMM 246, PMB 262, OSP 255 and PMM 266 (FIG. 2) may be instructed to change mode into a "monitoring" mode (period). The monitoring mode is used for tracking the individual predictive models. During the monitoring mode, PRM 220 designates a certain percentage (a configurable number in the range of 5% to 50%, for example) of surfers as "random" surfers. PMM 266 may compare the probability of success of random surfers to the probability of success of the personalized surfers and create a set of comparison tables, one per each object's predictive model. The comparison tables may be used by manager 264 (FIG. 2) in order to determine the performance of each set of object's predictive models.

In some embodiments of CAS 2000, in which method 300 is implemented for two or more KPIs, each sub-process can be associated with a type of KPI. Each sub-process, which includes actions 306 (FIG. 3*a*) to 364 (FIG. 3*b*), may have a separate comparison tables one per each KPI.

In an alternate embodiment of the present disclosure, the monitoring mode may be implemented on a page level and not on an object level. In such an embodiment, the two counters, ST and a model's lifetime counter, are reset. The model's lifetime counter may be used for defining the overall time limit or maximum age of the predictive models. A typical, and exemplary, maximum age may be 24 hours, for example.

Then method 300 waits 330 until the value of ST reaches a configurable value predetermined to define the "Monitor Period." The "Monitor Period" may be in the range of few tens of minutes to a few hours, depending on the volume of requests which were sent toward PCD 150 (FIG. 1), for example. If 330 the ST reached the value of the "Monitor Period," then PMM 266 (FIG. 2) may be requested to deliver a set of web-page comparison tables, one per each web-page 332. A web-page comparison table may comprise the two probability values per each object's prediction model that may be assigned to a given web-page. The two probability values may represent the probability of success of a personalized surfer and the probability of success of a random surfer.

In some embodiments of the present disclosure, in which the monitoring mode is implemented at a page level, the probability values may be calculated at such level. In such an embodiment, a success of a page may be defined as responding to one of the presented objects. In some cases, each observation may be weighed by the percentage of the utility value of the selected object from the utility value of the page itself. In some embodiments of CAS 2000, in which method 300 is implemented for two or more KPIs, per each sub-process the selected utility value can reflects the relevant KPI associated with that sub-process.

The manager module 264 (FIG. 2) may process 332 the results from the table and compare them to a predefined set of values that are stipulated by the administrator of PCD 150 (FIG. 1). If 334 the results of the predictive models are better than the required values, then method 300 proceeds to action 340 in FIG. 3B. If 334, in the alternative, the results are below the stipulated performance threshold, then PMB 262 (FIG. 2) may be adjusted 336 accordingly. The set of properties which were used for calculating the predictive model may be adjusted, for example. In addition, an indication may be sent to the administrator and method 300 may return to action 306.

For CAS 2000, which handles two or more KPIs, action 332 and 334 can be executed per each KPI. Thus, when a predictive model is ready for one of the KPI, an exemplary CAS 2000 can start the ongoing period using the ready predictive model based on that KPI, while continuing the learning mode for the other KPIs. For example, due to the difference in the appearance of "clicking" versus purchasing, a predictive model based on a "click" KPI can be ready before a predictive model based on "revenue" KPI. In such a case CAS 2000 may start using the predictive model based on "click" KPI and later, when a predictive model based on "revenue" KPI is ready, CAS 2000 can switch and use the "purchasing" KPI model.

FIG. 3B depicts the ongoing operation mode of method 300. At action 340, PRM 220, MLFH 230, OMM 246, PMB 262, OSP 255 and PMM 266 (FIG. 2) may be instructed to change mode into an ongoing mode while the performance of the loaded sets of object's predictive models, one set per each web-page, is monitored and ST is reset. During the ongoing mode, PRM 220 designates a small percentage of surfers as random surfers. PMM 266 may compare the probability of success of random surfers to the probability of success of personalized surfers and create a set of comparison tables, one per each object's predictive model. The comparison tables may be used by manager 264 (FIG. 2) for determining the performance of the sets of the object's predictive models. In some embodiments of CAS 2000, in which method 300 is implemented for two or more KPIs, per each sub-process the compression tables can reflect the relevant KPI associated with that sub-process.

Method 300 may wait 342 until the value of ST reaches a configurable value predefined to correlate with the "Ongoing Period." The "Ongoing Period" may be in the range of a few tens of minutes to a few days, depending on the volume of requests which were sent toward PCD 150 (FIG. 1), for example. In a similar way the Ongoing Period may varied from one KPI to the other. An ongoing period of a KPI that reflects the clicking rate can be shorter than the time period of the ongoing period of a KPI that reflects purchasing, because clicking is more frequent than purchasing. Consequently a longer period is needed to collect the required number of events.

When 342 the ST reaches the value of the "Ongoing Period," then PMM 266 (FIG. 2) may be requested to deliver a set of web-page comparison tables, one per each web-page; and for CAS 2000 also a set of web-page comparison tables per each KPI. The manager module 264 (FIG. 2) may subsequently process the results in the table and compare them to a predefined set of values that are stipulated by the administrator of PCD 150 (FIG. 1) 344. If 350 the results of the predictive models exceed the required values, then the predictive models may be considered as valid and method 300 proceeds to action 354. If 350 the results are below the required performance, then the predictive models may be considered as not valid and method 300 may return 362 to action 306 (FIG. 3a) for calculating new sets of object's predictive models.

At action 354, the value of the model's lifetime counter is checked and a determination is made 360 as to whether the value is below a configurable value Tmax. Exemplary Tmax may be a few hours to a few days, for example. If 360 the value is below Tmax, which would indicate that the sets of object's predictive models are still valid, then the ST counter may be reset 364 and method 300 returned to action 342. If the value of the lifetime counter is above Tmax, then method 300 may proceed to action 362 and returned to action 306 (FIG. 3a) to initiate calculation of a new set of predictive models.

Figure 4:
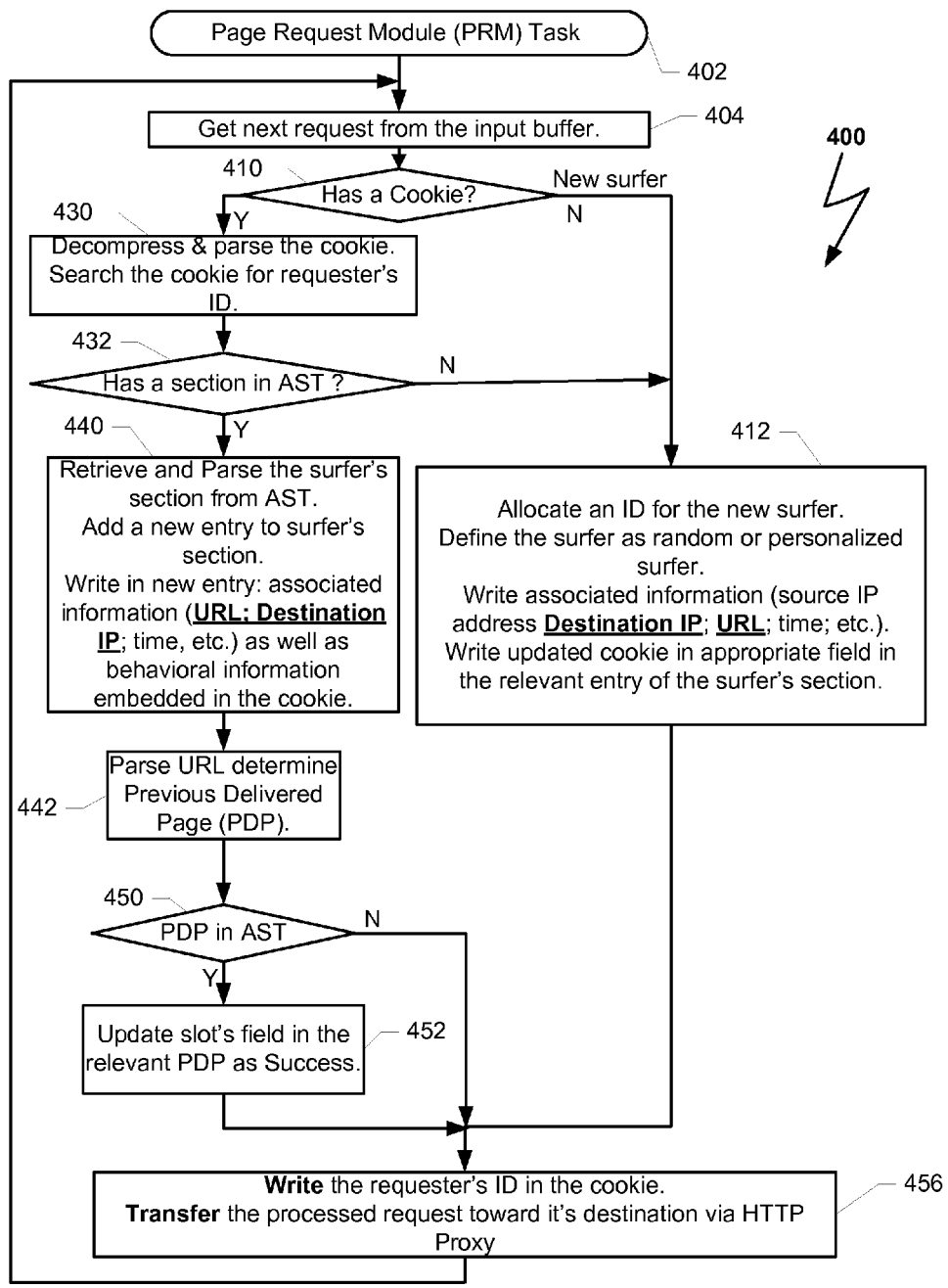
FIG. 4 schematically illustrates a flowchart showing relevant processes of an exemplary embodiment of a method for handling a request for a web-page.

FIG. 4 illustrates a flowchart with relevant processes of an exemplary method 400 that may be used for handling surfer's requests that are sent toward content servers 152 (FIG. 1). Method 400 may be implemented within the PRM 220 (FIG. 2a or 2b), for example. Method 400 may be initialized 402 by the manager module 264 during the "power on" process and each time the manager determines to change the mode of operation of CAS 200 (learning, monitoring and ongoing). After initiation, method 400 may run in a loop as long as the mode is not changed. In order to eliminate redundancy of information in the following paragraphs, actions of method 400 that implemented in CAS 200 or CAS 2000, which are similar, are marked with similar numeral and are disclosed once, in relation with CAS 200. Base on reading the description of method 400 for CAS 200, an ordinary skilled person in the art is expected to understand how those similar actions are operating in relation with CAS 2000. In some actions of CAS 2000 that may operate in a different way or may need additional information, this information will be added.

During the initialization process 402, PRM 220 may be loaded with information that is relevant for communicating with other internal modules of CAS 200, modules such as the manager 264 and AST 215 (FIG. 2). In addition, AST 215 may be initialized.

After the initiation stage, method 400 may start processing surfer's requests that are transferred via HTTP proxy 210 (FIG. 2) to a queue of PRM 220. The next request in the queue is fetched 404 and parsed in order to identify any attached cookie. If 410 the request does not include a cookie (a new surfer), method 400 proceeds to action 412 for handing the request of the new surfer. If 410 a cookie is found, exemplary embodiments of the present disclosure may decompress 430 and parse the cookie (assuming the cookie is compressed). In other exemplary embodiments, in which compression is not used, any identified cookie is just parsed without prior decompression. Once parsed, a cookie is searched for a requester ID and, according to the ID, the AST 215 (FIG. 2) is searched 432 for a section that is associated with the ID. If 432 a section in the active session table AST 215 (FIG. 2) was not found, then method 400 proceeds to action 412. If 432 a session in the active session table AST 215 (FIG. 2) was found, indicating that the request is associated with a current active surfer having at least one recent request served by CAS 200, then method 400 proceeds to action 440 and continues serving the active surfer.

At action 412 the first request of a new active surfer is handled. An ID is allocated to the new surfer. The ID can be allocated randomly from a large number of alternatives. The ID may be a 32 bit, 64 or 128 bit number, for example. In case that the current mode is a learning mode, then the surfer is defined as a random surfer. In case that the current mode of operation is monitoring mode or ongoing mode. The type of the new surfer as a personalized surfer or as a random surfer can be defined based on the allocated ID and a percentage of surfers per each type. In the monitoring period, the percentage of the random surfers is larger than the percentage of the random surfer that is associated with the ongoing mode. Thus, the portion of the random surfers in a monitoring period is larger than the control portion during the ongoing mode. The value of percentages is a configurable value depending on the traffic via CAS 200.

A new section in AST 215 (FIG. 2) is allocated to the new active surfer. Subsequently, the new section in AST 215 is associated with the allocated requester's ID. The allocated ID and the type of the surfer (random or personalized) can be associated to that section. In the new section, an entry is allocated for the current request. At this point, method 400 starts writing the information associated with the request to the appropriate fields of the allocated entry. The associated information may include, for example, the receipt time according to the clock of CAS 200, the URL which is associated with the request, the source IP and the destination IP of the request, etc. In some embodiments the ID may comprise a surfer ID and a supplement ID. The surfer ID remains in the cookie as long as the cookie exist The supplement ID reflects the current visit and it can exist as long as the surfer is active and has an entry in the AST 215.

In some embodiments that calculate predictive model per visit, the receiving time of the first request can indicate the beginning of the visit. In some embodiments this time can be stored in a dedicated filed of the new section that is associated with the new requester's ID. In some exemplary embodiments of the present disclosure, the URL may include one or more fields that reflect attributes of the requested web-page. Exemplary attributes may be the topic of the page (vacation, news, sports, etc.), classification of the advertised goods, (expensive, low cost, etc.).

The decompressed cookie, if it exists, is updated 412 or a new cookie may be written. The cookie may include behavioral information associated with the surfer such as the date and time of the surfer's last visit to the web-page, the frequency of visits by the surfer to the web-page, etc.

Other behavioral information may include one or more counters wherein each counter may count the number of events of a certain type. Exemplary counters may count the number of the active surfer's visits to the relevant website, the number of requests for a certain web-page from the website, the number of times a certain offer (content object) was selected, etc. Updating the counters may be time dependent Such that the value of the counter may decrease over time, as previously described. In some embodiments, the cookie may include labels for a surfer's attributes. Exemplary attributes may be a surfer's age, gender, hobbies, etc. The updated information of the cookie is stored in the appropriate fields of the entry in AST 215.

In exemplary embodiments that create predictive model based on the entire visit of surfer an additional counter can be added for counting the number of requesting the relevant webpage in the relevant visit. This counter can be reset each time a new visit is initiated by the relevant surfer to that website.

After setting the fields in the section of AST 215, the method 400 proceeds to action 456 in which the requester ID is written in the cookie of the request and the request is transferred toward its destination (one of the servers 152 in FIG. 1) via the http proxy 210 (FIG. 2). Method 400 returns to action 404 for processing the next request.

In an alternate exemplary embodiment of the present disclosure, defining a surfer as a random surfer may be executed after receiving a surfer's response. In such an embodiment, a surfer that responded positively may be defined as a random surfer. One of the reasons for using this sorting method is to increase the size of the positive samples, since the positive samples are less populated than non-responding surfers.

In embodiments of CAS 2000 (FIG. 2) in which two or more predictive models, per object, are handled simultaneously, each module is associated with a type of KPI, process 400 can comprise two or more sub-processes, each sub-process can be associated with a type of KPI. Each sub-process can have different percentages of random surfers or personalized surfers for adapting sampling rate to the activity rate of each KPI. A sub-process that is associated with a purchasing rate, which is less frequent than any other KPI, defining a surfer as a random surfer may be executed after receiving a surfer's response.

Returning now to action 432, if a section that is associated with the requester's ID exists, then a surfer's section in AST 215 (FIG. 2) is retrieved 440 and parsed. While processing the information that is stored in the AST, object and slot combinations that do not have a success indication may be referred to as failures. Next, a new entry in the section is allocated for storing information that is relevant to the current received request. The information associated with the request is written into the appropriate fields of the new entry. The decompressed cookie is updated written to the appropriate fields of the new entry, as disclosed above in conjunction with action 412. Notably, in some embodiments the cookie may include an indication of a surfer's attribute, while the URL may include an indication on attributes of the requested web-page.

After writing the information in the new entry, the URL that is associated with the request is parsed 442 and the requester's section in AST 215 is searched 442 for an entry that is associated with a previously delivered page (PDP) that points to the current requested object in order to determine whether the current request originated from a web page that was recently sent via CAS 200. Presumably, such a web-page included an object and slot combination which reflects the URL that is associated with the current received request.

If 450 such an entry is found, then a success indication is written 452 in the result field that is associated with the object and slot combination of the URL associated with the current request. At such point, method 400 proceeds to action 456. If 450 a PDP is not found, method 400 proceeds to action 456.

There are some exemplary embodiments in which two or more KPI are used or in which the entire visit is taking into consideration. Such exemplary embodiment may record the entire visit of a user, based on the user ID and supplement ID that reflects the visit. The record can include information on the surfer's requests during the visit, the responses sent per each requests, the result of the visit (one or more purchases done by the surfer during the visit, the revenue per each purchases and the total revenue, for example). At the end of the visit the recorded information is parsed and added to the relevant entries and KPIs in the surfer's section in the AST 215.

Figure 5:
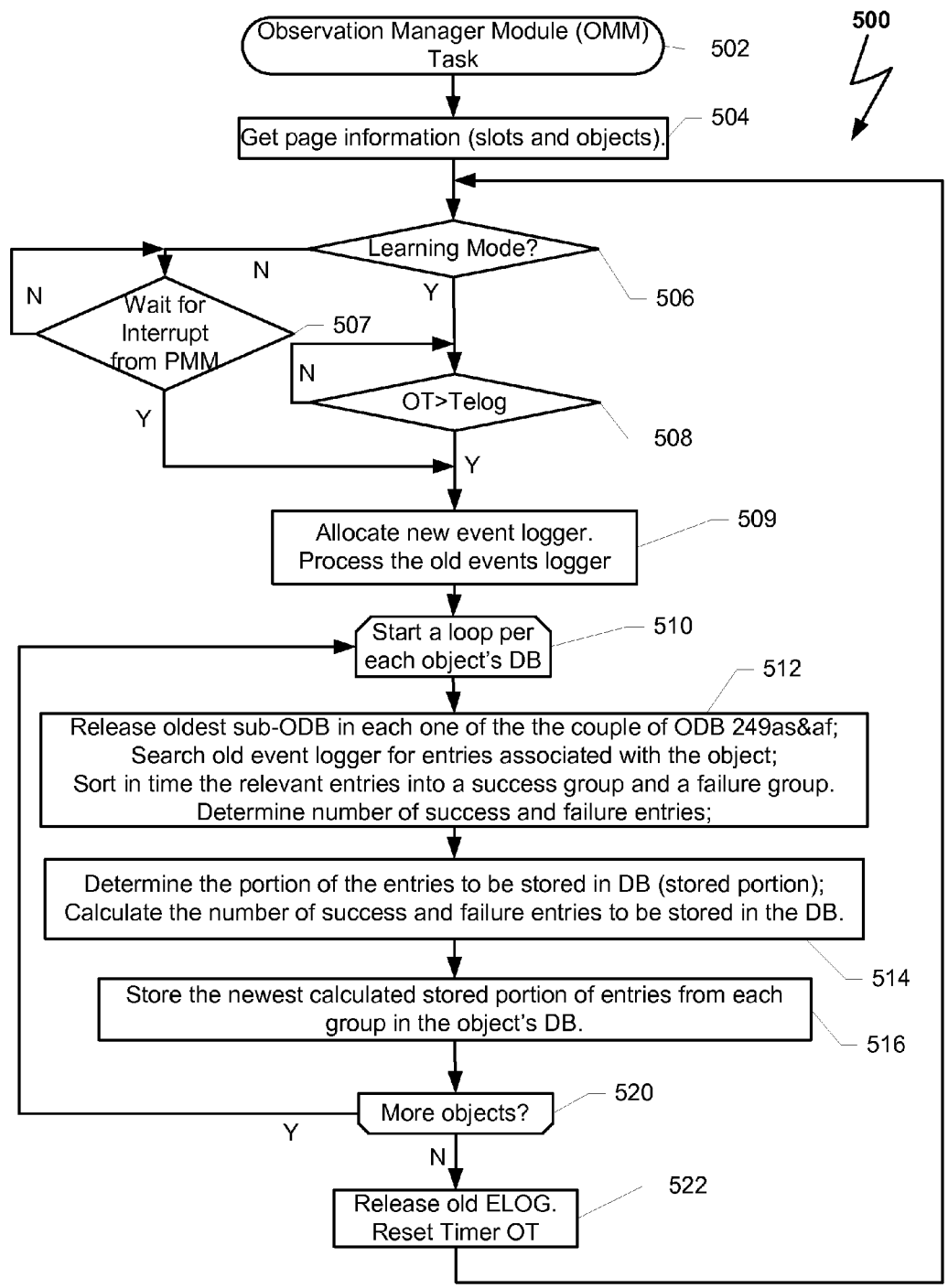
FIG. 5 schematically illustrates a flowchart showing relevant processes of an exemplary embodiment of an observation manager module.

FIG. 5 illustrates a flowchart with relevant processes of an exemplary method 500 that may be used for managing a page data collector module (PDC) 240 (FIG. 2a) or 2400 (FIG. 2b). Method 500 may be implemented within the OMM 246 (FIG. 2a&b), for example. Method 500 may be initialized 502 by the manager module 264 (FIG. 2a&b) during the "power on" process. After initialization, method 500 may run in a loop as long as CAS 200 is active. Method 500 may be used for transferring the stored data from ELOG 242 (FIG. 2a&b) to OHDBs 248 (FIG. 2a) or KPIOHDB 2480s (FIG. 2b) while keeping the integrity of the sampled data as a representative sample of a surfers' behavior. In order to eliminate redundancy of information in the following paragraphs, actions of method 500 that implemented in CAS 200 or CAS 2000, which are similar, are disclosed once, in relation with CAS 200. Base on reading the description of method 500 for CAS 200, an ordinary skilled person in the art is expected to understand how those similar actions are operating in relation with CAS 2000. Some actions of method 500 which in CAS 2000 may operate in a different way or may need additional information compare to a similar action implemented by CAS 200, this information will be described separately.

During the initialization process 502 & 504, OMM 246 may be loaded with information that is relevant for communicating with other internal modules of CAS 200 such as the manager 264, PMM 266, ELOG 242, (FIG. 2) etc. In addition, information is retrieved from manger module 264 (FIG. 2). The retrieved information may be relevant to the web-page, which is associated with the PDC 240 that includes the relevant OMM 246. The information may include the objects that may be associated with the web-page and the slots by which the objects may be presented. Timers, such as the OMM timer (OT), may be reset.

After the initiation process, a determination is made 506 as to whether the current operating mode is a learning mode (training mode). If not a learning mode, method 500 may wait 507 for an indication from PMM 266, in which PMM 266 may inform OMM 246 that the data, which is stored in the current ELOG 242, was inspected and that OMM 246 may start transferring the data from the ELOG 242 toward OHDB 248 (FIG. 2). When 507 an indication is received, method 500 may proceed to action 509. If 506 the operating mode is a learning mode, then method 500 may wait until OT is greater than Telog 508. Telog may be a configurable parameter in the range of a few tens of seconds to a few tens of minutes, for example. When OT is greater than Telog, method 500 proceeds to action 509.

At action 509 a new ELOG 242 is allocated 509 for storing the future events that are related to the relevant web-page and method 500 begins processing and transferring the stored data from the old ELOG 242 into OHDB 248. A loop from action 510 to action 520 may be initiated and each cycle in the loop may be associated with an optional object that may be presented over the relevant web-page.

At action 512, the oldest sub-ODB in each one of the ODB couples associated with the current object, object "a" for example which comprises the success ODB 249as and the failure ODB 249af, are released and a new sub-ODB is allocated for storing data that is transferred from the old ELOG 242 that is related to the current object. The old ELOG 242 (FIG. 2) is searched for entries of random surfers that include the current object. The result field in each entry is parsed and the entries are divided into two groups, a success group (having a success indication) and a failure group (do not have a success indication). The entries in each group may be sorted by time such that the newest entry appears at the top of the group, for example, and the total number of each group calculated. In an exemplary embodiment in which the entire visit is used for preparing the predictive model, the information that is copied into the success or fail ODB 249as&af, for example, reflects the number of times the webpage was requested, during the relevant visit, until the success was reached.

The portion of the entries from each group that may be stored in the appropriate new sub-ODB is calculated 514 by dividing the number of entries in each one of the appropriate new sub-ODB (success or failure) by the total number of entries in each group (success or failure, respectively). If at least one of the groups has a portion value smaller than one, meaning that some of the entries of the group will be dropped in lieu of being stored in the new sub-ODB, then the smallest portion value may be selected for determining the number of entries from each group (success or failure) that will be stored in the appropriate sub-ODB (success or failure, respectively).

The total number of entries in each group is multiplied by the smallest portion value for determining the numbers of entries (NE) from each group that will be stored in the appropriate new sub-ODB. NE entries from the top (the newest entries) of each group are copied 516 to the appropriate sub-ODB. If for both groups the portion values are greater than "one," then all the entries of each group (success or failure) may be copied to the appropriate new sub-ODB (success or failure, respectively). The portion value of the deletion per each group (success and failure) may be recorded in association with the success ODB 249as-ns and the failure ODB249af-nf (respectively). In some exemplary embodiments of the present disclosure, old entries in the success ODB 249as-ns and the failure ODB249af-nf may be released only when there is no free space available for storage of new observations.

After copying 516 the entries to the new sub-ODB, a determination is made 520 as to whether additional objects may be presented in the relevant web-page. If yes, method 500 may start a new cycle in the loop for the next object and return to action 510. If 520 there are no more objects, then the old ELOG 242 is released 522, timer OT is reset, and method 500 returns to action 506.

In some embodiments of CAS 2000, in which method 500 is implemented for two or more KPIs, each sub-process can be associated with a type of KPI. Each sub-process can include actions 506 to 522. Such an embodiment of CAS 2000 may have a separate ELOG 242 (FIG. 2b) per each KPI. Yet other embodiments may use a single ELOG 242 (FIG. 2b), in such embodiment, each sub-process can includes actions 506 to 520 and action 522, in which the old ELOG 242 is released, can be implemented once after coping the information of the events that are associated with the last KPI, for example. In some exemplary embodiments of the present disclosure, old entries in the success ODB 249kas-kns and the failure ODB249kaf-knf may be released only when there is no free space available for storage of new observations related to a certain key.

Figure 6:
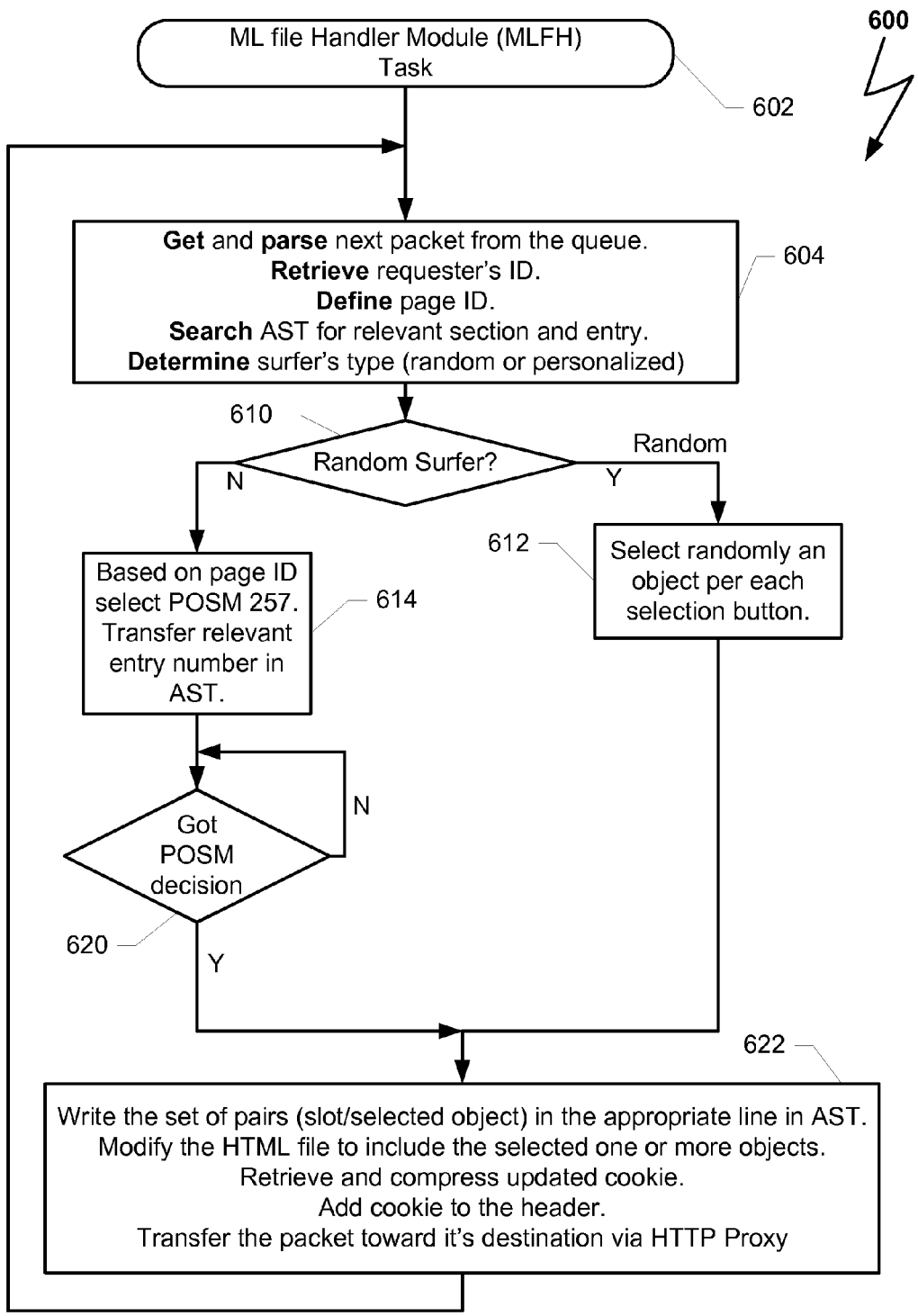
FIG. 6 schematically illustrates a flowchart showing relevant processes of an exemplary embodiment of a method for handling a ML file of a requested web-page.

FIG. 6 illustrates a flowchart with relevant processes of an exemplary method 600 that may be used for handling web-pages, in the form of markup language files (an HTML, for example), which is sent from one of the content servers 152 (FIG. 1) in response to a surfer's requests. Method 600 may be implemented within the MLFH 230 (FIG. 2), for example. Method 600 may be initialized 602 by the manager module 264 (FIG. 2) during the "power on" process. After initialization, method 600 may run in a loop as long as CAS 200 (FIG. 2) is active. During the initialization process 602, MLFH 230 may be loaded with information that is relevant for communicating with other internal modules of CAS 200, modules such as the manager 264, the plurality of POSM 250 and AST 215 (FIG. 2), etc.

In order to eliminate redundancy of information in the following paragraphs, actions of method 600 that implemented in CAS 200 or CAS 2000, which are similar, are disclosed once, in relation with CAS 200. Base on reading the description of method 600 for CAS 200, an ordinary skilled person in the art is expected to understand how those similar actions are operating in relation with CAS 2000. In some actions method 600 in which CAS 2000 may operate in a different way or may need additional information, this information will be added.

After the initiation stage, method 600 may start processing received web-pages from the content servers 152 (FIG. 1) and are transferred via HTTP proxy 210 (FIG. 2) to a queue of MLFH 230. The next packet in the queue is fetched 604 and parsed in order to determine whether a cookie is attached. If a cookie is found, the cookie is furthered processed and the requester ID, which is written in the cookie, is retrieved. AST 215 is searched for a section that is associated with the requester ID. Starting from the last entry in the requester's section, the entry is retrieved and parsed to identify the fields that define the web-page ID of that entry. If the web-page ID dose not match the web-page ID written in the header of the received web-page, the earlier entry is fetched and be handled in a similar way. If the web-page ID of that entry matches the web-page ID written in the header, then a surfer's type, i.e. personalized, or random is retrieved.

If 610 a surfer is designated as a random surfer, then at action 612, based on the information written in the entry in the AST associated with the web-page ID, a list of optional objects and a list of slots in the web-page are fetched. Per each slot, an optional object is selected randomly and method 600 proceeds to action 622. In an alternate embodiment, in which a surfer type (random surfer) is defined per slot, then the random selection is done only for that slot.

If 610 the requester of the web-page is not designated as a random surfer, then a POSM 257 is selected 614 based on the page ID. The entry number in AST 215 that is associated with the request for the given web-page is transferred to a queue of the selected POSM 250. Method 600 may wait 620 until a decision from the relevant POSM 250 is received that identifies the web-page configuration that has the highest probability of prompting an active surfer to respond through the selection of one of the optional objects. The identified configuration may include a list of slot and object combinations that have the highest associated probabilities to highest utility to the web-site owner. Then method 600 proceeds to action 622.

At action 622, either the identified configuration of the web-page or the randomly selected configuration of the web-page, having a set of object and slot combinations, is written 622 to the appropriate fields in the relevant entry of AST 215. The HTML file is modified to include the selected one or more objects, each object being associated with an appropriate slot. The updated cookie, which was prepared by PRM 220, manipulated by the relevant content server 152 (FIG. 1) and stored in the entry, is compressed and added as a cookie to the modified ML file. The requester's ID is also added and associated with the cookie. The modified ML file with the cookie is transferred to HTTP proxy 210 and sent toward the destination of the ML file of the requester surfer. Method 600 returns to action 604 and starts processing a new received ML file.

Yet in an alternate embodiment of CAS 200 or 2000, the selected configuration is sent by the API to the content server 152 (FIG. 1). The content surfer modifies the requested ML file according to the selected configuration and sends the modified ML file to the requesting surer.

In an alternate embodiment, the set of pairs in the configuration may influence the design of a web-page. In such an embodiment, a pair may include a design feature in lieu of a slot and the value of the design feature in lieu of the object. Exemplary design features may be background color, font size, font type, etc. Exemplary corresponding values may be red, 12 points, Times New Roman, etc.

Figure 7:
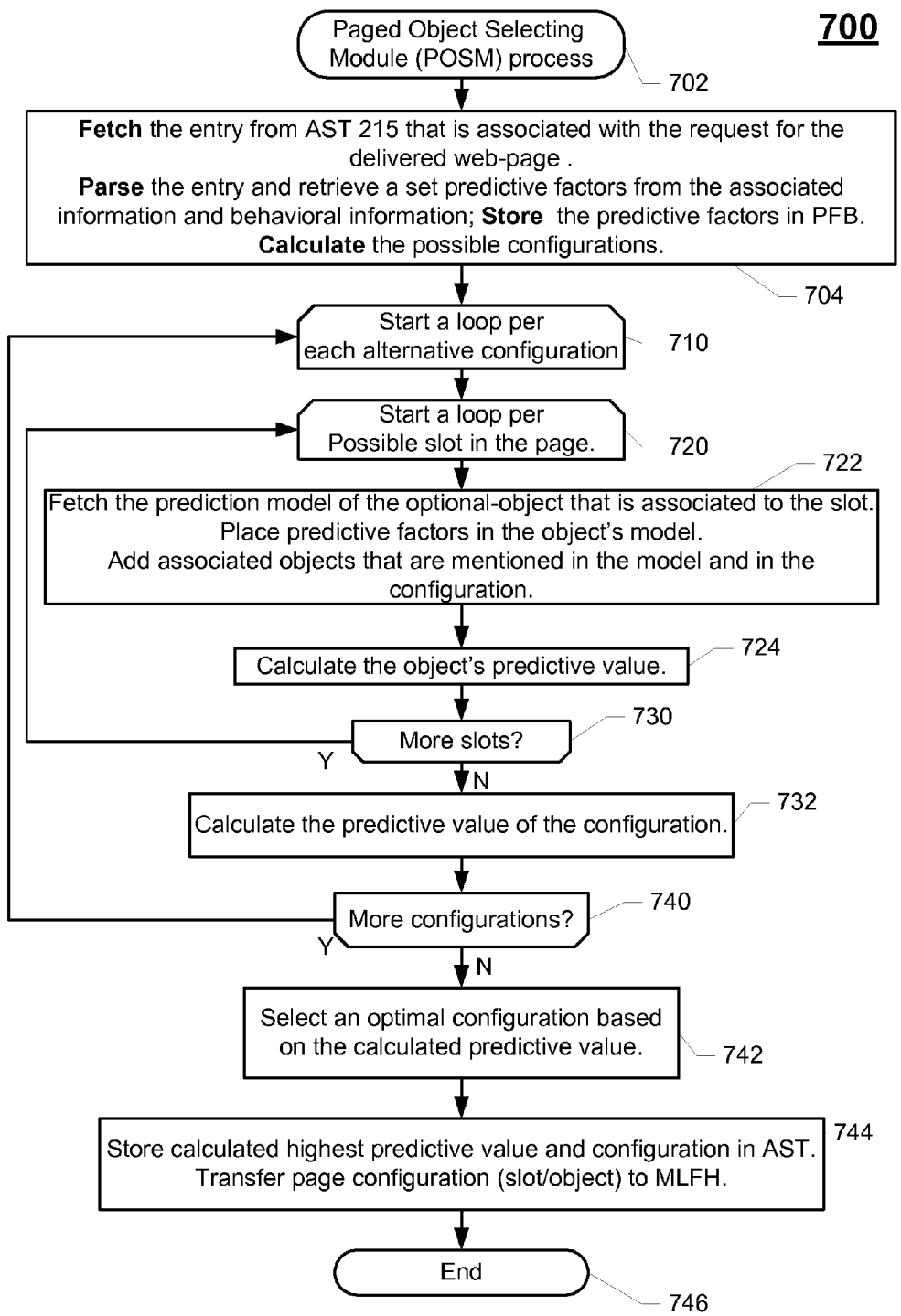
FIG. 7 schematically illustrates a flowchart showing relevant processes of an exemplary embodiment of a method for selecting an optional object to be presented on a requested web-page.

FIG. 7 illustrates a flowchart with relevant processes of an exemplary method 700 that may be used for calculating the prediction value for each optional configuration (set of optional-object and slot combinations) from a plurality of optional configurations of a delivered web-page. The prediction value may represent the predicted value of the relevant KPI that the requester of the delivered web-page will select one of the presented objects while observing the delivered web-page. The configuration of the web-page that reflects the highest possible utility can be defined as the predictive configuration. Method 700 may be implemented within the OSP 255 (FIG. 2), for example. Method 700, at a selected POSM 250 that is associated with a delivered web-page, may be initialized 702 upon receiving from MLFH 230 (FIGS. 2a&b) an entry number in AST 215 (FIG. 2). The entry is associated with the delivered web-page that is currently processed (action 614, FIG. 6) by MLFH 230 (FIG. 2).

In order to eliminate redundancy of information in the following paragraphs, actions of method 700 that implemented in CAS 200 or CAS 2000, which are similar, are disclosed once, in relation with CAS 200. Base on reading the description of method 700 for CAS 200, an ordinary skilled person in the art is expected to understand how those similar actions are operating in relation with CAS 2000. In some actions method 700 in which CAS 2000 may operate in a different way or may need additional information, this information will be added.

After initiation, method 700 may fetch 704 the entry from AST 215 that is associated with the request for this delivered web-page. The entry may be parsed and a plurality of predictive factors can be retrieved from the associated information, behavioral information, and grouping information (if such exists). Exemplary predictive factors that may be retrieved from the associated information stored at the entry may include the receipt time of the request, the URL keys associated with the request, etc. Exemplary predictive factors that may be retrieved from the behavioral information may include the elapsed time from the last visit of the requester in PCD 150 (FIG. 1), the number of positive responses from the requester, etc. Exemplary grouping information may include indications on a surfer's attribute such as, but not limited to, gender, age, purchasing habits, etc. Further, the indication may be coded in a code which is unknown to CAS 200 (FIG. 2). The retrieved predictive factors may be stored in PFB 253 (FIG. 2) of the POSM 250 that is associated with the delivered web-page.

The optional configurations of the requested web-page are calculated 704. A configuration may define a set of the slots, in which an optional object may be presented, and a selected optional object that is presented in each slot (Slot/Optional-object). Usually, an exemplary web-page has a certain amount of slots and a certain amount of optional-objects such that the number of possible configurations may be defined. The optional configurations may include all possible combinations of slots and objects, for example. A table of prediction values may be allocated 704 for storing the calculated prediction value for each optional configuration.

An exemplary table of prediction values may include a plurality of entries. Each entry may be associated with an optional configuration of the delivered web-page. Further, each entry may include a plurality of fields and each field may be associated with a specific slot number with an additional field defining the predicted value of each configuration. Each cell (a junction of a configuration and a slot number) in the table may include the calculated prediction value of the object that is assigned to the slot in that configuration, wherein the calculation of the predictive value is done in view of the rest of the slots and optional-objects in the configuration. The prediction value of the configuration may be the sum of the predictive values of each one of the slot fields in this entry.

In some exemplary embodiments of the present disclosure, the number of optional configurations may be calculated once, during the initialization of POSM 250 or upon receiving information on changes in the associated web-page. In such case, an exemplary table of prediction values may be defined once and allocated again and again each time the relevant web-page is delivered.

After allocating the table of prediction values, a loop between actions 710 to 740 may be initiated to process all the possible configurations of the web-page written in the allocated table. For each configuration, an internal loop is initiated between actions 720 to 730. The internal loop may be executed per each slot of the configuration. An OPM 257a-n (FIG. 2) that is associated with an object that was assigned to a first slot of a first configuration in the table is fetched 722. Relevant predictive factors included in the model are retrieved 722 from PFB 253 and placed in the appropriate location in the model. The model is adapted to reflect the configuration. Therefore, if the model has one or more variables that reflect the configuration (objects in the other slots, etc.), then those variables are defined as true or false depending on the configuration.

Then the predictive value of the object that is associated with the first slot of the first configuration is calculated 724 by executing the model. Next, the calculated predictive value is written in the table's cell at the junction of the first configuration and the first slot and a decision is made 730 as to whether there are additional slots in the configuration. If so, method 700 returns to action 720 and starts the loop for the next slot (a second slot, etc.) in the first configuration. The loop may continue to the third slot and so on until there 730 are no more slots in the configuration. Then, the predictive value of the configuration is calculated 732 by summing the predictive value of each slot, for example. In other embodiments the predictive value of the configuration is calculated 732 by averaging the predictive value of each slot. etc.

At action 740, a determination is made as to whether there are additional optional configurations in the table. If yes, method 700 returns to action 710 and starts the loop for the next configuration (a second configuration, etc) in the table. The loop may continue for the third configuration and so on until there 740 are no more configurations to be processed.

After calculating 740 the predictive value of all the possible configurations of the web-page, an optimal configuration is selected 742. Notably, as previously disclosed, the prediction value also reflects the benefit that the owner of CAS 200 will get when a surfer responds to the presented web-page via the selection of one of the optional objects. The configuration with the highest predictive value may be defined as the preferred configuration. This preferred configuration, and its predictive value, may be stored 744 in the entry of AST 215 (FIG. 2) and delivered to MLFH 230 (FIG. 2) as the predictive configuration. At this point, method 700 may be terminated 746. Method 700 may be initiated again upon receiving a next delivered web-page that is associated with POSM 250.

In an exemplary embodiment of CAS 2000 in which two or more KPIs are used. Method 700 can be implemented by using a ready predictive model that is associated to a KPI with the highest utility to the owner of the web-site. Such embodiment may start using the predictive model in which the KPI reflects clicking on a certain object. Later it may switch to a predictive model that is associated with purchasing KPI, for example.

Figure 8:
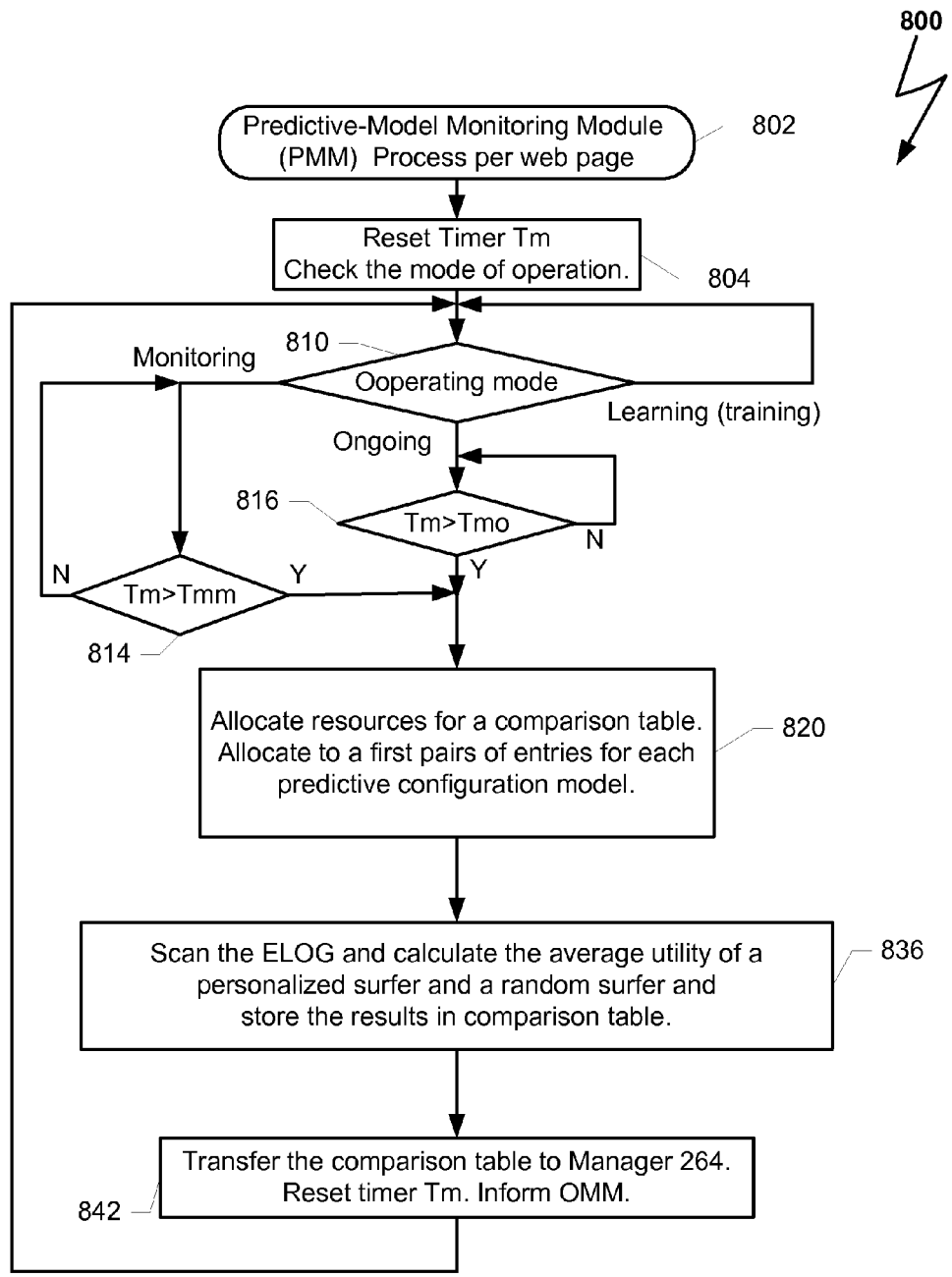
FIG. 8 schematically illustrates a flowchart showing relevant processes of an exemplary embodiment of a method for monitoring the predictive models.

FIG. 8 illustrates a flowchart depicting relevant processes of an exemplary method 800 that may be used for monitoring the performance of the current predictive models of a certain web-page. Method 800 may be implemented within the PMM 266 (FIG. 2), for example. In order to eliminate redundancy of information in the following paragraphs, actions of method 800 that implemented in CAS 200 or CAS 2000, which are similar, are disclosed once, in relation with CAS 200. Base on reading the description of method 800 for CAS 200, an ordinary skilled person in the art is expected to understand how those similar actions are operating in relation with CAS 2000. In some actions method 800 in which CAS 2000 may operate in a different way or may need additional information, this information will be added.

Method 800 may be initialized 802 by the manager module 264 (FIG. 2) during the "power on" process. After initiation, method 800 may run in a loop as long as CAS 200 is active. Method 800 may be used for monitoring the results of the stored data at ELOG 242 (FIG. 2), which is assigned to the certain web-page being currently monitored, before transferring it to OHDB 248 (FIG. 2). After processing the records stored in ELOG 242, an indication may be sent to OMM 246 of the PDC 240, which is assigned to the web-page that is currently monitored. The indication may inform the OMM 246 that it may start the process of transferring the information from ELOG 242 to OHDB 248. In addition, the results of the evaluation may be transferred to the manager module 264 and/or PMB 262. After monitoring the results of one web-page, PMM 266 (FIG. 2) may proceed to the next web-page and so on. In an alternate embodiment of the present disclosure, PMM 266 may execute a plurality of processes 800 in parallel, one per each web-page. Method 800 can be implemented per a web-page, per a portion of a web page or per set of web-pages. The decision is depending on the scope of the wish of the web-site owner.

After initiation, a timer Tm is reset 804 and the current mode of operation, which is defined by the manager module 264 (FIG. 2), is determined. If 810 the operating mode is a "learning" (training) mode, then method 800 may wait until the end of the learning period. If 810 the operating mode is a "monitoring" mode, then method 800 may wait 814 until the value of timer Tm is greater than a configurable value Tmm. Tmm may be in the range of a few minutes to a few tens of minutes, for example. If 810 the operating mode is an "ongoing" mode, then method 800 may wait 816 until the value of timer Tm is greater than a configurable value Tmo. Tmo may be in the range of a few tens of minutes to a few hours, for example.

When timer Tm reaches the value of Tmm or Tmo, depending on the operating mode, a web-page comparison table is allocated 820. The web-page comparison table may have two entries wherein one may be assigned to the average utility of the random surfer while the other may be assigned to the average utility of the personalized surfer. An exemplary method 800 which is implemented in a CAS 2000, for example, can have two or more web-page comparison tables. Each web-page comparison table can be associated with a KPI.

At action 836, the ELOG is scanned and the average utilities of the random surfer and the personalized surfer are calculated. The results may be written in the web-page comparison table at the appropriate entry that is assigned to the relevant surfer.

The web-page comparison table is transferred 842 to the manager module 264 (FIG. 2). Timer Tm is reset and indication is sent to OMM 246 (FIG. 2) of the PDC 240, which is assigned to the relevant web-page. In response, OMM 246 may start transferring the information from ELOG 242 to OHDB 248 as previously disclosed. At such point, method 800 may return to action 810 and, based on the current mode of operation, may proceed per the methodologies previously disclosed. An exemplary method 800 which is implemented in a CAS 2000, for example, can transfer the two or more web-page comparison tables. Each web-page comparison table can be associated with a KPI.

Figure 9A:
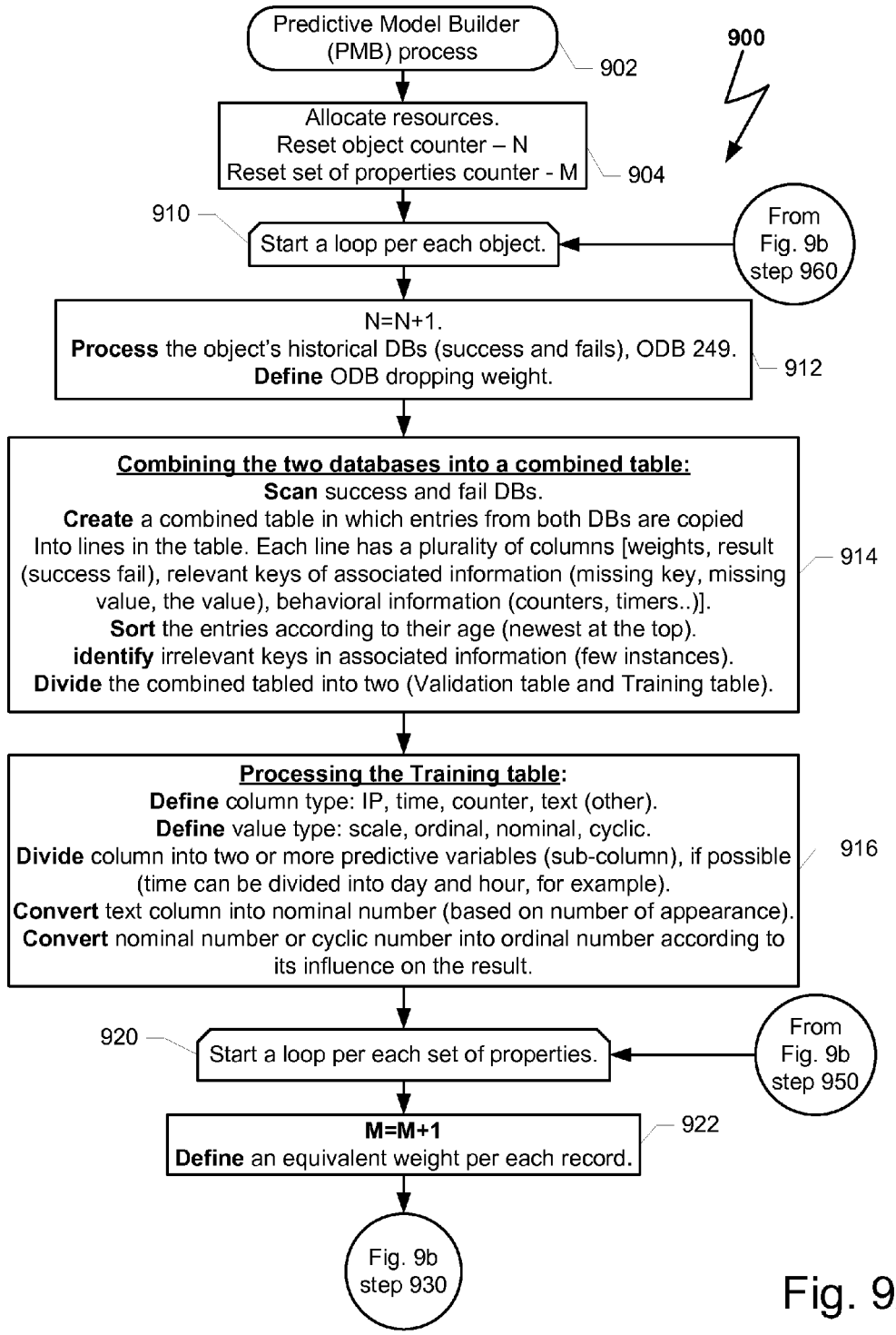
FIGS. 9A & 9B schematically illustrate a flowchart showing relevant processes of an exemplary embodiment of a method for building a predictive model.
Figure 9B:
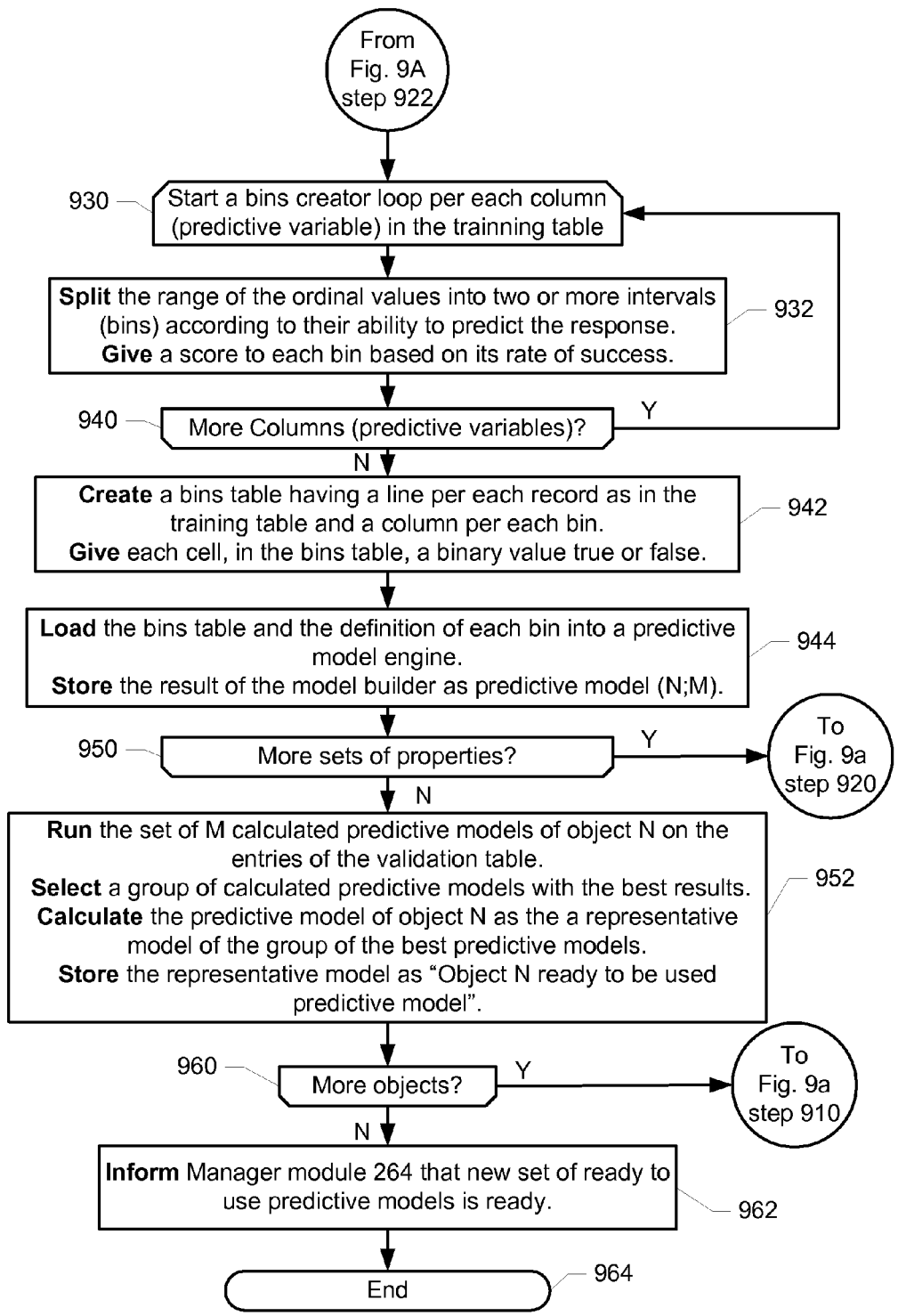

FIGS. 9A & 9B illustrate a flowchart depicting relevant processes of an exemplary method 900 that may be used for creating a new set of object's predictive models, one per each optional-object that may be associated with a web-page that is served by CAS 200 (FIG. 2a) or CAS 2000 (FIG. 2b). Method 900 may be implemented within the predictive model builder (PMB) 262 (FIG. 2), for example. In order to eliminate redundancy of information in the following paragraphs, actions of method 900 that implemented in CAS 200 or CAS 2000, which are similar, are disclosed once, in relation with CAS 200. Base on reading the description of method 900 for CAS 200, an ordinary skilled person in the art is expected to understand how those similar actions are operating in relation with CAS 2000. In some actions method 900 in which CAS 2000 may operate in a different way or may need additional information, this information will be added. In some embodiments method 900 can be implemented on parallel processor simultaneously. Each processor can be associated with a web page, and/or KPI, etc.

Method 900 may be initiated 902 by the manager module 264 (FIG. 2) each time a new set of predictive models is needed. During the initialization process 904, PMB 262 may allocate resources that may be needed for calculation of the predictive models. Information, or memory pointers to information, needed while processing the predictive models may be retrieved. Required counters may be reset. Furthermore, a counter may be used as an index.

When the initial action 904 is completed, an external loop between actions 910 and 960 (FIG. 9b) is initiated. Each cycle in the external loop is associated with an optional-object (an alternative object) that may be associated with a web-page. At action 912, counter N is incremented by one, indicating the object's number that is currently handled in the current cycle of the loop. The two historical DBs of the object N, 249Ns (success) and 249Nf (failure) (FIG. 2a), are processed and a representative weight per each ODB is calculated based on the deleted portion that was associated to the ODB by OMM 246 (FIG. 2) during the transfer of records from ELOG 242 (FIG. 2) to the ODBs, as previously disclosed above in conjunction with action 516 (FIG. 5). In some exemplary embodiments each ODB can be associated with two or more representative weights. Each representative weight can be associated with one of the sub ODBs that compose the ODB. Yet in other embodiment a representative weight can be used. The representative weight can be the inverse sampling rate of each sub ODBs. In other embodiments three or more criteria, can be used. Exemplary criteria can be few ranges of revenue in dollars: zero dollars, 1 to 10 dollars, 10 to 30 dollars, 30 to hundreds dollars, etc.

In exemplary embodiments of process 900 that are implemented by CAS 2000 the external loop between actions 910 and 960 (FIG. 9*b*) may be repeated also for each KPI. Consequently a loop that is associated with KPI number K and object number N handles ODB 249KNs ODB 249KNf (FIG. 2*b*). In other exemplary embodiments of process 900, in which the predictive model per each KPI is implemented by another processor of PMB 262 in CAS 2000, the external loop may be executed on the ODB 249KNs ODB 249KNf that are associated with the same KPI as the processor.

The raw data from the success and failure ODB 249Ns & 249Nf are organized 914 into an object's table. Each entry from the ODBs 249Ns & 249Nf is copied into a line in the table. The lines are sorted by time, independent of any success indication. The newest record may be stored at the top of the object's table while the oldest record may be stored at the bottom of the object's table, but it should be understood that choice of storage organization should not limit the scope of the disclosure.

Each record in the table, i.e. line, has a plurality of columns (fields). Each column may be associated with a factor of the record, which is stored in the record. Exemplary columns may be designated to represent the weight of the record (the weight may reflect the representative weight of the ODB from which the record was copied), the result, success or failure (not success), relevant URL keys that were embedded within the associated information that was stored in the record, attributes indication on the web-page and/or the object, etc. Additional columns may reflect the values of behavioral information, which is stored in the record. Other columns may represent information such as counters and timers that were stored in the cookie associated with the request, indications of attributes associated with a surfer that were stored in the cookie, etc. A column can reflect the utility of the success to the website owner. The utility can be one of the KPIs. In some embodiments in which the entire visit of a surfer is taken into consideration, then a column can be associated to the number of times the surfer, that is associated with the record, requested the relevant web page during the same visit.

The associated information may be the receiving time of the request that is written in the record, the URL that was associated with the request, information regarding the configuration of the web-page from which the request was selected, etc. Each cell at the junction of a column and a row may store the URL key's value if it exists, missing key indication if the record does not include the key, or a missing value indication if the record includes the key but no value, for example. Each cell in the junction of a behavioral information factor and a line (record) may store the value of a relevant counter, timer, etc. which are associated with the column.

The object's table may be searched 914 for irrelevant keys (few instances), for example. Irrelevant keys may be defined as keys that have a small number of records (lines) in which the key has a value. The minimum number of records may be a configurable value in the range of a few tens to a few thousands, depending on the volume of data stored in the ODB 249, for example. The minimum number of records may be one of the properties that are stored in a set of properties, for example. A column of irrelevant keys may be removed from the object's table. The object's table may be divided into two tables: a validation table including the newer records and a training table with the older records. Usually, the training table includes more records than the validation table. The validation table may be used later for determining the quality of the predictive models or the score of the model.

The training table is further processed 916 in order to calculate the predictive model of the object. The type of the columns in the training table may be defined. Defining the type may be executed by observing the key in view of a plurality of syntax protocols and determining whether the value of the key complies with one or more of those protocols.

Next, the type is defined 916 based on the protocol. Exemplary protocols may be Internet protocols (IP), text protocols, time protocols, etc. If the value of the key does not comply with any of the protocols, it may be defined as "other." Exemplary types may include IP, time, a list of searching words, text, numbers, currency, other, etc. Types of columns that are associated with behavioral information are known and may include counters and timers, for example. After defining the type of the keys, the type of the value of each key may be defined. Exemplary types of values may be scale, ordinal, nominal, cyclic, etc.

In some exemplary embodiments, method 900 may further process 916 the training table in order to identify columns that may be divided into two or more columns. For example, a time column may be divided into multiple columns representing days, hours, and minutes. An IP address may be divided into four columns, etc. In other embodiments, an IP address can be stored in a single column using 12 digits, padding with leading zeros and removing the points. Each sub-column (a portion of a predictive factor) may be referred to as a predictive variable or a predictive key.

When the raw data is organized in the training table, method 900 starts converting 916 key values that are not ordinal into ordinal values. A value of a text column (a certain string of text) may be converted into an ordinal number that reflects its frequency (number of appearances along the column). A nominal number or a cyclic number may be converted into an ordinal number that reflects the influence of the nominal value on the result of a record (success or failure). In other embodiment a text or nominal values can be represented in an ordinal way by sorting the predictive power of each value. The predictive power can be defined as the ability to generate testable predictions.

At this point, the training table is ready to be further processed such that each column (a predictive variable/factor/key) is converted into one or more bins and the training table converted overall into a bins table. In addition, a legend may be associated with the bin's table. The legend may define the predictive factor from which the bin was processed, the interval that the bin includes and the predictive efficiency of the bin. The bins table is further processed for determining a predictive model per each set of properties. A middle loop from action 920 to 950 (FIG. 9*b*) may be initiated. Each cycle in the loop is associated with a set of properties. Each set of properties may define and comprise a set of parameters that may be used while preparing a predictive model.

An exemplary parameter may be relative aging weight. Other parameters may define the minimum number of appearances of a certain key, a number below which a key may be considered as irrelevant. Another parameter may define the minimal value of a predictive score that a predictive model may get in order to be used. Yet another parameter may define the half-life-time constant of a record, etc. In an exemplary embodiment of method 900, which is implemented in CAS 2000, each KPI may have its own set of properties. A KPI that reflects clicking rate may have different parameters than KPI that reflects purchasing. For example the minimum number of appearances for clicking rate can be higher than the minimum number of appearance per purchasing, etc.

The value of M counter is incremented 922 by one indicating the ID number of the set of properties that is associated with the current cycle of the loop. The appropriate set of properties is fetched and parsed and, according to its properties, an equivalent weight per each line may be defined. The equivalent weight may reflect the representative weight which is due to the result of the record's (line) success or failure, age, the benefit that is created to the owner of CAS 200 (FIG. 2) if the object is selected, etc. After defining the equivalent weight, method 900 proceeds to action 930 (FIG. 9B) and initiates the internal loop between actions 930 to 940.

In some embodiments, the binning process is carried out with respect to a target KPI. The target KPI can be Boolean (0 or 1), discrete, continues or mixed as well. The binning process calculates the average KPI within the bin and compares it to the average KPI outside the bin, while calculating the significance of the difference. This approach may also be used to split a column into two bins, generating the highest explained variance, and further splitting of each bin. Each split of a bin may have some constraints like certain allowed percentiles split and minimal size, etc.

Each cycle in the internal loop is associated with a column, i.e. a predictive variable. The range of the ordinal values written in the column is divided 932 into one or more sub-intervals (bins) according to the ability to predict the success. Dividing the range of the values of the column into bins may be executed in several methods. One exemplary method may divide the interval into a configurable number of equal intervals (units). The number of units (the resolution) may be a few units to a few tens of units, for example. The resolution may be one of the properties that are included in a set of properties, for example. A predictive score per each interval unit, along the interval of the values of the current column, may be calculated by dividing the weighted number of success records by the total weighted number of records, which have an ordinal value of the predictive variable (column), in the current interval unit.

The one or more bins may be created 932 by grouping one or more adjacent interval units into one bin, wherein the variance between the rates of success of the adjacent interval units is below a certain value, i.e. a variance threshold. The variance threshold may have a configurable value and may be one of the properties that are stored in a set of properties, for example. After creating one or more bins for each predictive variable (column), a rate of success is calculated for the bin. The rate of success is calculated as the weighted number of success records divided by the weighted total number of records. Information on the bins (information on its predictive variable, the bin's interval, etc.) along with associated prediction scores is stored in a bins legend. Then, a determination is made 940 as to whether the training table includes more columns (predictive variables). If 940 yes, method 900 returns to action 930 and starts a new cycle in the internal loop for dividing the next predictive variable (a next column, in the training table) into one or more bins. In embodiments that target a non Boolean KPI, the average KPI can replace the rate of success.

If 940 there are no more columns, then a bins table is created 942. The bins table may have a column per each bin and the same number of lines as in the training table. In each cell, at the junction of a line (record) and a column (bin), a binary value, true or false, may be written depending on the value of the relevant predictive variable. The value of the relevant predictive variable is in the range of values that is associated with bin.

In another exemplary embodiment of method 900, action 942 may include a validation process. An exemplary validation process may repeat the loop from action 930 to 940 on the records that are stored in the validation table. If the bins that were created by processing the validation table are similar to the bins that were created by processing the training table, then the bins may be considered as valid and method 900 may proceed to action 944. If not, one or more properties in the current set of properties may be slightly modified. For example, the resolution of the range of a certain column may be reduced. Then, the loop from action 930 to 940 may be repeated twice with the modified set of parameters. During the first repetition a second set of bins is calculated using the records stored in the training table. During the second repetition, the second set is validated by using the validation table. The validation process may have one or more cycles. In some exemplary embodiments the bins validation table may have other records than the validation table that is used for validating the predictive models.

Yet another exemplary embodiment of method 900 may respond to non valid sets of bins by marking the set of properties as a problematic one and may jump to action 950, skipping the stage of calculating a predictive model according to the problematic set of parameters. In yet another embodiment, a set of bins may be ignored entirely.

The bins table and the bins legend is transferred 944 toward a predictive model engine. The predictive model engine may implement a statistical algorithm over the bins table in order to calculate the predictive model. The statistical algorithm can be such as, but not limited to, logistic regression, linear regression, decision tree analysis, etc. The calculated predictive model that was created is stored as a prediction model (N;M). The N stands for the optional-object for which the model was calculated and the M stands for the set of properties that was used for calculating the model.

At action 950, a determination is made as to whether there are more sets of properties. If yes, method 900 returns to action 920 (FIG. 9a) and starts a new cycle for creating an additional predictive model, for the object N, based on the next set of properties (M+1). If 950 there are no more sets of properties, then an object's predictive model N is calculated 952 as an equivalent model of the M models that were calculated and stored in action 944 as it is disclosed below.

An exemplary predictive model (N:M) may include one or more constants, one or more predictive variables that are derived from associated information, each having an associated coefficient, one or more predictive variables that are derived from behavioral information, each having an associated coefficient, one or more web-page configuration variables that reflect objects in the other slots, each having an associated coefficient.

In some embodiments, additional predictive variables may be used. For example, one or more predictive variables that are derived from web-page attributes, surfer's attributes, or object attributes may be included. Exemplary constants may be a result of the regression process (an arithmetic constant), for example. Another constant may reflect the benefit of selecting the object M. Exemplary predictive variables that are derived from associated information may be the day, the browser type, etc. An exemplary predictive variable that is derived from the behavioral information stored in the cookie may be the number of visits to a certain page, etc. An exemplary web-page configuration variable may be object X in slot Y, for example.

An exemplary calculation of a Boolean KPI (true, fails) predictive value of an object may be executed based on the following formula:

$$P = \frac{1}{1 + e^{-(\text{Sum of relevant coefficients})}}$$

The relevant coefficients are the coefficients that are associated with variables that are true for a received request.

An exemplary method 900 may execute 952 the M models of the optional-object N on the records that are stored in the validation table. The M models may be executed on each record in the validation table that includes the object N in a web-page configuration that was sent as a response to the request that initiated the record. After performing the M models on the validation table, a predictive fitness score is calculated per each model. In an alternate embodiment of the present disclosure, the records that are stored in the validation table plus the records that are stored in the training table may be used in action 952.

PMB 262 may select 952 a group of calculated predictive models out of the M models that have the best scores. Then, the object N predictive model may be calculated as a representative model of the group of the best models. Calculating the representative model may be executed by calculating an average value per each coefficient. The average may be weighted by the predictive score of the selected best models, for example. The representative model may be stored as "object N ready to be used predictive model". A bin that does not exist in a model is considered to have a coefficient of zero. In an embodiment, the equivalent model can be generated by merging the M models using all the data, the training and the validation. The equivalent model will be created based on the previously calculated fitness scores. In this discloser the terms: "equivalent model" and "representative model" can be used interchangeably.

At action 960, a decision is made whether there are additional optional-objects that may be associated with the relevant web-page. If yes, method 900 returns to action 910 and start the external loop for calculating a prediction model for a next object (M+1). If there are no more objects, Manager module 264 (FIG. 2) may be informed that a set of object's predictive models for that web-page are ready 962 and method 900 may be terminated 964. Method 900 may be initiated again for handling a second web-page. In an alternate embodiment of the present disclosure, several processes 900 may be executed in parallel, one per each web-page. In an exemplary embodiment of method 900, which is implemented in CAS 2000, method 900 may be repeated from step 904 per each KPI in order to generate a predictive model per each KPI. Yet in other embodiments several processes 900 may be executed in parallel, one per each KPI.

Usually each KPI has a different distribution, therefore predictive models of the same page that are based on different KPI may be ready at a different time. It is expected that the predictive model, which is based on clicking as a KPI, will be valid first because the clicking occurs more frequently than purchasing, for example. Consequently the manager model 264 (FIG. 2a&b) will load to the relevant POSM 250 the first ready to use predictive model, which is base on clicking rate. When a predictive model, which is based on the purchasing rate will be valid than the manager 264 may replace the current active predictive model, which is based on clicking rate, with the new predictive model that is based on purchasing rate. Switching from one predictive model to another predictive model improves the benefit of the web-site owner. The web-site owner is more interesting in increasing the purchasing rate that the clicking rate.

It is to be understood that the above description is intended to be illustrative, and not restrictive. The above-described apparatus, systems, and methods may be varied in many ways, including, changing the order of steps, and the exact implementation used. The described embodiments include different features, not all of which are required in all embodiments of the present disclosure. Moreover, some embodiments of the present disclosure use only some of the features or possible combinations of the features. Different combinations of features noted in the described embodiments will occur to a person skilled in the art. Furthermore, some embodiments of the present disclosure may be implemented by combination of features and elements that have been described in association to different exemplary embodiments along the discloser. The scope of the invention is limited only by the following claims and equivalents thereof.

What is claimed is:

1. A computer-implemented method, comprising:
  generating, by a computing device, a plurality of predictive models for a web page of a website, wherein the web page includes a configuration defining one or more objects presented with the web page, wherein each object is associated with a predictive model, and wherein each predictive model is associated with one or more predictive model types;
  determining the one more predictive model types that are associated with each predictive model in the plurality of predictive models;
  determining a performance indicator that corresponds to each determined predictive model type, wherein performance indicators represent one or more benefits to a website;
  selecting a predictive model out of the plurality of predictive models based on a performance indicator corresponding to a predictive model type of the selected predictive model; and
  determining a configuration of the web page using the selected predictive model.

2. The method of claim 1, wherein selecting the predictive model out of the plurality of predictive models is further based on a readiness of the selected predictive model.

3. The method of claim 1, wherein performance indicators include a rate of clicking on an object, a rate of converting the object to a purchase, or a revenue rate generated by presenting a configuration of the web page.

4. The method of claim 1, further comprising:
  gradually migrating over time from using a first type of predictive model associated with a first performance indicator to using a second type of predictive model associated with a second performance indicator.

5. The method of claim 1, further comprising:
  receiving a request for the web page;
  retrieving predictive information related to the request;
  converting the predictive information into one or more predictive factors for an object presented with the web page;
  defining a value for each of the one or more predictive factors; and
  generating a predictive model for the object using the one or more predictive factors.

6. The method of claim 5, wherein the predictive information includes behavioral information and information associated with the request for the web page.

7. The method of claim 6, wherein the behavioral information includes a time of one or more previous visits in a domain that includes the requested web page, a time that the web page was last requested, a number of visits in the domain, a number of times that the object has been presented, and a number of times that the object has been selected.

8. The method of claim 7, wherein the behavioral information is from a single resource.

9. The method of claim 7, wherein the behavioral information is stored in a cookie.

10. The method of claim 6, wherein the information associated with the request for the web page includes a receipt time of the request, a uniform resource locator key associated with the request, an internet protocol address, or a type of browser application.

11. A system, comprising:
a processor; and
a non-transitory computer-readable storage medium containing instructions configured to cause the processor to perform operations including:
generating a plurality of predictive models for a web page of a website, wherein the web page includes a configuration defining one or more objects presented with the web page, wherein each object is associated with a predictive model, and wherein each predictive model is associated with one or more predictive model types;
determining the one more predictive model types that are associated with each predictive model in the plurality of predictive models;
determining a performance indicator that corresponds to each determined predictive model type, wherein performance indicators represent one or more benefits to a website;
selecting a predictive model out of the plurality of predictive models based on a performance indicator corresponding to a predictive model type of the selected predictive model; and
determining a configuration of the web page using the selected predictive model.

12. The system of claim 11, wherein selecting the predictive model out of the plurality of predictive models is further based on a readiness of the selected predictive model.

13. The system of claim 11, wherein performance indicators include a rate of clicking on an object, a rate of converting the object to a purchase, or a revenue rate generated by presenting a configuration of the web page.

14. The system of claim 11, further comprising instructions configured to cause the processor to perform operations including:
gradually migrating over time from using a first type of predictive model associated with a first performance indicator to using a second type of predictive model associated with a second performance indicator.

15. The system of claim 11, further comprising instructions configured to cause the processor to perform operations including:
receiving a request for the web page;
retrieving predictive information related to the request;
converting the predictive information into one or more predictive factors for an object presented with the web page;
defining a value for each of the one or more predictive factors; and
generating a predictive model for the object using the one or more predictive factors.

16. The system of claim 15, wherein the predictive information includes behavioral information and information associated with the request for the web page.

17. The system of claim 16, wherein the behavioral information includes a time of one or more previous visits in a domain that includes the requested web page, a time that the web page was last requested, a number of visits in the domain, a number of times that the object has been presented, and a number of times that the object has been selected.

18. The system of claim 17, wherein the behavioral information is from a single resource.

19. The system of claim 17, wherein the behavioral information is stored in a cookie.

20. The system of claim 16, wherein the information associated with the request for the web page includes a receipt time of the request, a uniform resource locator key associated with the request, an internet protocol address, or a type of browser application.

21. A computer-program product, tangibly embodied in a non-transitory machine-readable medium, including instructions configured to cause a data processing apparatus to:
generate a plurality of predictive models for a web page of a website, wherein the web page includes a configuration defining one or more objects presented with the web page, wherein each object is associated with a predictive model, and wherein each predictive model is associated with one or more predictive model types;
determine the one more predictive model types that are associated with each predictive model in the plurality of predictive models;
determine a performance indicator that corresponds to each determined predictive model type, wherein performance indicators represent one or more benefits to a website;
select a predictive model out of the plurality of predictive models based on a performance indicator corresponding to a predictive model type of the selected predictive model; and
determine a configuration of the web page using the selected predictive model.

22. The computer-program product of claim 21, wherein selecting the predictive model out of the plurality of predictive models is further based on a readiness of the selected predictive model.

23. The computer-program product of claim 21, wherein performance indicators include a rate of clicking on an object, a rate of converting the object to a purchase, or a revenue rate generated by presenting a configuration of the web page.

24. The computer-program product of claim 21, further comprising instructions configured to cause the data processing apparatus to:
gradually migrate over time from using a first type of predictive model associated with a first performance indicator to using a second type of predictive model associated with a second performance indicator.

25. The computer-program product of claim 21, further comprising instructions configured to cause the data processing apparatus to:
receive a request for the web page;
retrieve predictive information related to the request;
convert the predictive information into one or more predictive factors for an object presented with the web page;
define a value for each of the one or more predictive factors; and
generate a predictive model for the object using the one or more predictive factors.

26. The computer-program product of claim 25, wherein the predictive information includes behavioral information and information associated with the request for the web page.

27. The method of claim 26, wherein the behavioral information includes a time of one or more previous visits in a domain that includes the requested web page, a time that the web page was last requested, a number of visits in the domain, a number of times that the object has been presented, and a number of times that the object has been selected.

28. The computer-program product of claim 27, wherein the behavioral information is from a single resource.

29. The computer-program product of claim 27, wherein the behavioral information is stored in a cookie.

30. The computer-program product of claim 26, wherein the information associated with the request for the web page includes a receipt time of the request, a uniform resource locator key associated with the request, an internet protocol address, or a type of browser application.

\* \* \* \* \*